US012087698B2

(12) United States Patent
Liu et al.

(10) Patent No.: US 12,087,698 B2
(45) Date of Patent: Sep. 10, 2024

(54) WIRING SUBSTRATE, ARRAY SUBSTRATE AND LIGHT EMITTING MODULE HAVING CONTROL REGIONS ARRANGED INTO CONTROL REGION ROWS AND CONTROL REGION COLUMNS

(71) Applicants: Hefei Xinsheng Optoelectronics Technology Co., Ltd., Anhui (CN); BOE Technology Group Co., Ltd., Beijing (CN)

(72) Inventors: Chunjian Liu, Beijing (CN); Zouming Xu, Beijing (CN); Feifei Wang, Beijing (CN); Qin Zeng, Beijing (CN); Xintao Wu, Beijing (CN); Jian Tian, Beijing (CN); Jie Lei, Beijing (CN); Jie Wang, Beijing (CN); Yufei Zhan, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 530 days.

(21) Appl. No.: 17/426,815

(22) PCT Filed: Jan. 28, 2021

(86) PCT No.: PCT/CN2021/074260
§ 371 (c)(1),
(2) Date: Jul. 29, 2021

(87) PCT Pub. No.: WO2022/160220
PCT Pub. Date: Aug. 4, 2022

(65) Prior Publication Data
US 2023/0369233 A1 Nov. 16, 2023

(51) Int. Cl.
*H01L 23/538* (2006.01)
*H01L 25/16* (2023.01)

(52) U.S. Cl.
CPC ........ *H01L 23/5386* (2013.01); *H01L 25/167* (2013.01)

(58) Field of Classification Search
CPC .............. H01L 23/5386; H01L 25/167; H05K 2201/10106; G02F 1/133603;
(Continued)

(56) References Cited

U.S. PATENT DOCUMENTS 7,567,317 B2 * 7/2009 Tanaka .............. G02F 1/133603
349/61
7,824,049 B2 * 11/2010 Kaneko .............. G02B 19/0066
362/97.3
(Continued)

FOREIGN PATENT DOCUMENTS

CN 104427775 A 3/2015
CN 112219458 A 1/2021
(Continued)

OTHER PUBLICATIONS

International Search Report and Written Opinion issued in PCT/CN2021/074260, dated Mar. 25, 2021, (9p).

*Primary Examiner* — Khiem D Nguyen
(74) *Attorney, Agent, or Firm* — Arch & Lake LLP

(57) ABSTRACT

The present disclosure relates to the field of display technology, and provides a wiring substrate, an array substrate, and a light emitting module. The wiring substrate includes a base substrate, a first metal wiring layer, and an insulating material layer stacked in sequence. The first metal wiring layer is provided with a plurality of drive leads extending along a first direction, and the insulating material layer is provided with a plurality of via holes exposing the drive leads. Through adjusting positions of the drive leads and
(Continued)

positions of the via holes, the wiring substrate can be applied to different microchips, and used further to prepare different array substrates.

20 Claims, 24 Drawing Sheets

(58) Field of Classification Search
CPC ............. G02F 1/1336; G02F 1/133612; G02F 1/133611; G02F 1/1362
See application file for complete search history.

(56) References Cited

U.S. PATENT DOCUMENTS

| | | | |
|---|---|---|---|
| 10,431,546 B2* | 10/2019 | Kumano | H01L 27/1464 |
| 11,031,454 B2* | 6/2021 | Lee | H10K 59/124 |
| 2015/0059170 A1* | 3/2015 | Narumi | H05K 1/185 |
| | | | 29/832 |
| 2020/0295119 A1* | 9/2020 | Yueh | H01L 25/167 |
| 2020/0312883 A1* | 10/2020 | Qu | H01L 23/49805 |

FOREIGN PATENT DOCUMENTS

| | | |
|---|---|---|
| CN | 212136426 U | 12/2021 |
| JP | 2006165196 A | 6/2006 |
| JP | 2007250882 A | 9/2007 |

* cited by examiner

WIRING SUBSTRATE, ARRAY SUBSTRATE AND LIGHT EMITTING MODULE HAVING CONTROL REGIONS ARRANGED INTO CONTROL REGION ROWS AND CONTROL REGION COLUMNS

CROSS-REFERENCE TO RELATED APPLICATION

The present application is a 35 U.S.C. 371 national phase application of PCT International Application No. PCT/CN2021/074260 filed on Jan. 28, 2021, the entire disclosure of which is incorporated herein as a part of the present application for all purposes.

TECHNICAL FIELD

The present disclosure relates to the field of display technology, and in particular, to a wiring substrate, an array substrate and a light emitting module.

BACKGROUND

Mini Light Emitting Diode (Mini LED) backlight substrate adopts a direct-type design. A large number of Mini LEDs are arranged to achieve dimming in a smaller region. Compared with the traditional backlight design, its optical performance is better, helping to achieve better brightness uniformity and higher color contrast within a smaller mixing distance.

Currently, there are many different microchips suitable for Mini LED backlight substrates, but different microchips have different requirements for the wiring distribution of Mini LED backlight substrates, which leads to the need to develop backlight substrates corresponding to different microchips. The masks and intermediate substrates of different backlight substrates cannot be shared. This not only increases the development cycle and cost of different backlight substrates, but also is not conducive to simplifying the process.

It should be noted that the information disclosed in the background art section above is only used to enhance the understanding of the background of the present disclosure, and therefore may include information that does not constitute the prior art known to those of ordinary skill in the art.

SUMMARY

According to an aspect of the present disclosure, there is provided a wiring substrate including a plurality of control regions distributed in an array. The plurality of control regions are arranged into a plurality of control region rows and a plurality of control region columns. Each of the control region columns includes at least two of the control regions arranged along a first direction. Each of the control region rows includes at least two of the control regions arranged along a second direction. The second direction is parallel to the plane where the wiring substrate is located and intersects with the first direction.

Each of the control regions includes four device regions distributed in an array, and the device regions are used to set up functional devices that are electrically connected to one another. The four device regions in each of the control regions are respectively a first device region, a second device region, a third device region and a fourth device region. The first device region is the device region located in the first row along the first direction and in the first column along the second direction in the control region. The second device region is the device region located in the first row along the first direction and in the second column along the second direction in the control region. The third device region is the device region located in the second row along the first direction and in the first column along the second direction in the control region. The fourth device region is the device region located in the second row along the first direction and in the second column along the second direction in the control region.

The wiring substrate includes a base substrate, a first metal wiring layer, and an insulating material layer that are stacked in sequence. The first metal wiring layer is provided with drive leads extending along the first direction. In each of the control region columns, the drive leads include at least a first power voltage lead, a first input lead, a reference voltage lead, a second input lead, and a second power voltage lead that are sequentially arranged along the second direction. The wiring substrate further has at least one signal channel extending along the first direction, and each of the signal channels includes at least one of the control region columns. In each of the signal channels, the drive leads further include at least one address lead.

The control regions include first control regions. In one of the first control regions, the insulating material layer is provided with a first, second, third, fourth, fifth and sixth power via hole, a first, second, third and fourth input via hole, and a first and second reference via hole.

The first, second and third power via hole are arranged in sequence along the first direction and respectively expose a partial region of the first power voltage lead. The first power via hole is located at a side of the device region A (1,1) away from the device region A (2,1) or located between the device region A (1,1) and the device region A (2,1). The second power via hole is located between the device region A (1, 1) and the device region A (2, 1). The third power via hole is located at a side of the device region A (2, 1) away from the device region A (1,1).

The fourth, fifth and sixth power via hole are arranged in sequence along the first direction and respectively expose a partial region of the second power voltage lead. The fourth power via hole is located at a side of the second device region away from the fourth device region or located between the second device region and the fourth device region. The fifth power via hole is located between the second device region and the fourth device region. The sixth power via hole is located at a side of the fourth device region away from the second device region.

The first input via hole and the second input via hole respectively expose a partial region of the first input lead. The first input via hole is located between the edge of the first device region away from the third device region and the edge of the third device region close to the first device region. The second input via hole is located at a side of the third device region away from the first device region.

The third input via hole and the fourth input via hole respectively expose a partial region of the second input lead. The third input via hole is located between the edge of the second device region away from the fourth device region and the edge of the fourth device region close to the second device region. The fourth input via hole is located at a side of the fourth device region away from the second device region.

The first reference via hole and the second reference via hole respectively expose a partial region of the reference voltage lead. Along the first direction, the first reference via hole is located between the first device region and the third device regions. The second reference via hole is located at a side of the third device region away from the first device region.

In each of the signal channels, the insulating material layer is further provided with at least one address via hole that exposes a partial region of the at least one address lead.

In an exemplary embodiment of the present disclosure, in one of the control region columns, the first power via hole and the fourth power via hole are symmetrical about a first symmetry axis. The second power via hole is symmetrical with the fifth power via hole about a second symmetry axis. The third power via hole and the sixth power via hole are symmetrical about a third symmetry axis. The first symmetry axis, the second symmetry axis and the third symmetry axis extend along the first direction and coincide with one another.

In an exemplary embodiment of the present disclosure, in one of the control region columns, the first input via hole and the third input via hole are symmetrical about a fourth symmetry axis. The second input via hole is symmetrical with the fifth input via hole about a sixth symmetry axis. The fourth symmetry axis and the fifth symmetry axis extend along the first direction and coincide with each other.

In an exemplary embodiment of the present disclosure, in one of the first control regions, along the first direction, the first power via hole and the fourth power via hole are located between the first device region and the first reference via hole. The second power via hole and the fifth power via hole are located between the third device region and the first reference via hole. The third power via hole and the sixth power via hole are located between the third device region and the second reference via hole.

In an exemplary embodiment of the present disclosure, in one of the first control regions, the insulating material layer is further provided with a third reference via hole and a fourth reference via hole exposing a partial region of the reference voltage lead respectively. The third reference via hole and the first reference via hole are symmetric about a sixth symmetry axis. The fourth reference via hole and the second reference via hole are symmetric about a seventh symmetry axis. The sixth symmetry axis and the seventh symmetry axis extend along the first direction and coincide with each other.

In an exemplary embodiment of the present disclosure, in one of the first control regions, along the second direction, the third reference via hole and the fourth reference via hole are located at a side of the first reference via hole and the second reference via hole away from the first power voltage lead.

In one of the first control regions, the first power via hole, the first input via hole, the first reference via hole, the fourth power via hole, the third input via hole, and the third reference via hole constitute a first group of via holes. The third power via hole, the second input via hole, the second reference via hole, the sixth power via hole, the fourth input via hole and the fourth reference via hole form a second group of via holes.

The relative position between the via holes in the first group of via holes is the same as the relative position between the via holes in the second group of via holes.

In an exemplary embodiment of the present disclosure, in one of the first control regions, the insulating material layer is further provided with a fifth reference via hole that exposes a partial region of the reference voltage lead, and the fifth reference via hole is located between the four device regions.

In an exemplary embodiment of the present disclosure, in one of the first control regions, the insulating material layer is further provided with a fifth input via hole exposing a partial region of the first input lead. Along the first direction, the fifth input via hole is located between the first reference via hole and the third device region. The insulating material layer may also be provided with a first input via hole exposing a partial region of the second input lead. The sixth input via hole and the fifth input via hole are symmetrical about an eighth symmetry axis, and the eighth symmetry axis extends along the first direction.

In an exemplary embodiment of the present disclosure, the control regions further include second control regions. In each of the control region columns, the second control regions are located at a side of each of the first control regions along the first direction.

In one of the second control regions, the insulating material layer is provided with a seventh, eighth, ninth and tenth power via hole, a seventh, eighth, ninth and tenth input via hole, and a sixth, seventh, eighth, ninth and tenth reference via hole.

The seventh power via hole and the eighth power via hole respectively expose at least a partial region of the first power voltage lead. The ninth power via hole and the tenth power via hole respectively expose at least a partial region of the second power voltage lead. The eighth power via hole is located at a side along the first direction of the seventh power via hole and between the first device region and the third device region. The tenth power via hole is located at a side along the first direction of the ninth power via hole and between the second device region and the fourth device region.

The seventh input via hole and the eighth input via hole respectively expose a partial region of the first input lead. The seventh input via hole is located at a side of the first device region away from the third device region. The eighth input via hole is located between the first device region and the third device region. The ninth input via hole and the tenth input via hole respectively expose a partial region of the second input lead. The ninth input via hole is located at a side of the second device region away from the fourth device region. The tenth input via hole is located between the second device region and the fourth device region.

The sixth, seventh, eighth, ninth and tenth reference via hole respectively exposes a partial region of the reference voltage lead. The sixth reference via hole and the seventh reference via hole are arranged along the second direction and located between the first device region and the third device region. The eighth reference via hole is located between the first device region and the third device region, and the ninth reference via hole is located between the second device region and the fourth device region. The tenth reference via hole is located between the four device regions of the second control region.

In an exemplary embodiment of the present disclosure, the wiring substrate includes a fan-out region, and the first metal wiring layer is provided in the fan-out region with fan-out leads each connected to a respective one of the drive leads. Each of the drive lead is connected to the corresponding fan-out lead in the second control region.

In an exemplary embodiment of the present disclosure, the number of the address leads is not less than the number of the control region rows.

The address via holes include first address via holes and second address via holes. The first address via holes are arranged close to an end of the address lead, and at least one of the first address vias is arranged in each of the signal channels. The second address via hole corresponding to the control region row is provided in each of the control region rows. The second address via hole corresponding to each of the control region rows respectively exposes a partial region of a different address lead.

In an exemplary embodiment of the present disclosure, the address via hole further includes a third address via hole. Along the first direction, the first address via hole and the third address via hole are respectively distributed at two ends of the wiring substrate. In one of the signal channels, the number of the address leads is at least two, the number of the third address via holes is at least one, and at least one of the first address via holes and at least one of the third address via holes respectively exposes different address leads.

In an exemplary embodiment of the present disclosure, in one control region column, two address leads, and one first address via hole and one third address via hole are provided. The first address via hole exposes one of the address leads, and the third address via hole exposes the other of the address leads.

In an exemplary embodiment of the present disclosure, two ends of each of the address leads are respectively exposed by the first address via hole and the third address via hole.

In an exemplary embodiment of the present disclosure, the number of the second address via holes is the same as the number of the control region rows, and each of the second address via holes is arranged in a one-to-one correspondence with a respective one of the control region rows. Each of the second address via holes respectively exposes a different address lead, and each one of the second address via holes is located in the corresponding control region row.

In an exemplary embodiment of the present disclosure, in each of the control region rows, the number of the second address via holes is the same as the number of the address leads, and each of the second address via holes is arranged in one-to-one correspondence with a respective one of the address leads. Each of the second address via holes exposes the corresponding address lead.

In an exemplary embodiment of the present disclosure, the first metal wiring layer further has a first voltage distribution line extending along the second direction, and each of the drive leads is located at a side along the first direction of the first voltage distribution line. The first power voltage lead and the second power voltage lead extend along the opposite direction of the first direction, so as to be connected with the first voltage distribution line. Alternatively, the reference voltage lead extends along the opposite direction of the first direction, so as to be connected with the first voltage distribution line.

In an exemplary embodiment of the present disclosure, the first metal wiring layer further includes a second voltage distribution line extending along the second direction. The first voltage distribution line is located between the second voltage distribution line and each of the drive leads.

According to another aspect of the present disclosure, there is provided an array substrate including the above-mentioned wiring substrate.

In an exemplary embodiment of the present disclosure, the array substrate further includes a second metal wiring layer and an insulating protection layer that are sequentially laminated on a side of the insulating material layer of the wiring substrate away from the base substrate, and the array substrate further includes multiple functional devices and multiple microchips.

The second metal wiring layer includes a plurality of connection leads, a plurality of device pad groups and a plurality of chip pad groups. The functional devices are bound and connected to the device pad groups, and the microchips are bound and connected to the chip pad groups. The device pad groups and the chip pad groups are bound and connected to the connection leads. At least part of the connection leads is connected to the first metal wiring layer through at least part of the via holes provided on the insulating material layer.

In an exemplary embodiment of the present disclosure, a device control circuit is provided in each of the device regions, and the device control circuit includes one of the functional devices or a plurality of electrically connected functional devices.

In the first control region, the first end of the device control circuit in the first device region is connected with the first power voltage lead through the connection lead overlapping with the first power via hole. The first end of the device control circuit in the third device region is connected with the first power voltage lead through the connection lead overlapping with the second power via hole or the third power via hole. The first end of the device control circuit in the second device region is connected with the second power voltage lead through the connection lead overlapping with the fourth power via hole. The first end of the device control circuit in the fourth device region is connected with the second power voltage lead through the connection lead overlapping with the fifth power via hole or the sixth power via hole.

In an exemplary embodiment of the present disclosure, in one of the control regions, the array substrate is provided with four chip pad groups each corresponding to a respective one of the four device regions. Each of the chip pad groups includes a reference voltage sub-pad, an output sub-pad, a first input sub-pad and a second input sub-pad. The second end of the device control circuit in each of the device regions is connected with the output sub-pad of the chip pad group corresponding to the device region through the connection lead.

In one of the signal channels, each of the device regions is sequentially numbered, and the device region with a serial number of 1 is located at an end along the first direction of the signal channel. The chip pad groups corresponding to each of the device regions are sequentially cascaded according to the serial number of the device region. The second input sub-pad of the chip pad group corresponding to the device region with a serial number of 1 is connected with one of the address leads through the connection lead overlapping with the address via hole. The output sub-pad of the chip pad group corresponding to the device region with a serial number of (n−1) is connected with the second input sub-pad of the chip pad group corresponding to the device region with a serial number of n through the connection lead, where n is a positive integer greater than 1 and not greater than the number of the device regions in one signal channel.

In each of the first control regions, the reference voltage sub-pad of the chip pad group corresponding to the first device region and the reference voltage sub-pad of the chip pad group corresponding to the second device region are connected with the reference voltage lead through the connection lead overlapping with the first reference via hole. The reference voltage sub-pad of the chip pad group corresponding to the third device region and the reference voltage sub-pad of the chip pad group corresponding to the fourth device region are connected with the reference voltage lead through the connection lead that overlaps with the second reference via hole. The first input sub-pad of the chip pad group corresponding to the first device region is connected with the first input lead through the connection lead that overlaps with the first input via holes. The first input sub-pad of the chip pad group corresponding to the third device region is connected with the first input lead through the connection lead overlapping with the second input via hole. The first input sub-pad of the chip pad group corresponding to the second device region is connected with the second input lead through the connection lead overlapping with the third input via hole. The first input sub-pad of the chip pad group corresponding to the fourth device region is connected with the second input lead through the connection lead overlapping with the fourth input via hole.

In an exemplary embodiment of the present disclosure, in one of the control regions, the array substrate is provided with four chip pad groups each corresponding to a respective one of the four device regions. Each of the chip pad groups includes a reference voltage sub-pad, an output sub-pad, a first input sub-pad and a second input sub-pad. The second end of the device control circuit in each of the device regions is connected with the output sub-pad of the chip pad group corresponding to the device region through the connection lead.

In one of the signal channels, each of the device regions is sequentially numbered, and the device region with a serial number of 1 is located at an end along the first direction of the signal channel. The chip pad groups corresponding to each of the device regions are sequentially cascaded according to the serial number of the device region. The second input sub-pad of the chip pad group corresponding to the device region with a serial number of 1 is connected with one of the address leads through the connection lead overlapping with the address via hole. The output sub-pad of the chip pad group corresponding to the device region with a serial number of (n−1) is connected with the second input sub-pad of the chip pad group corresponding to the device region with a serial number of n through the connection lead, wherein n is a positive integer greater than 1 and not greater than the number of the device regions in one signal channel.

In each of the first control regions, the first input sub-pad of the chip pad group corresponding to the first device region is connected with the first input lead through the connection lead overlapping with the first input via hole. The first input sub-pad of the chip pad group corresponding to the third device region is connected with the first input lead through the connection lead overlapping with the second input via hole. The first input sub-pad of the chip pad group corresponding to the second device region is connected with the second input lead through the connection lead overlapping the third input via hole. The first input sub-pad of the chip pad group corresponding to the fourth device region is connected with the second input lead through the connection lead overlapping with the fourth input via hole.

When the wiring substrate is provided with the third reference via hole and the fourth reference via hole, in each of the first control regions, the reference voltage sub-pad of the chip pad group corresponding to the first device region is connected with the reference voltage lead through the connection lead overlapping with the first reference via hole. The reference voltage sub-pad of the chip pad group corresponding to the third device region is connected with the reference voltage lead through the connection lead overlapping with the second reference via hole. The reference voltage sub-pad of the chip pad group corresponding to the second device region is connected with the reference voltage lead through the connection lead overlapping with the third reference via hole. The reference voltage sub-pad of the chip pad group corresponding to the fourth device region is connected with the reference voltage lead through the connection lead overlapping with the fourth reference via hole.

In an exemplary embodiment of the present disclosure, when the wiring substrate includes the second control regions, in each of the second control regions, the chip pad group corresponding to the first device region and the chip pad group corresponding to the second device region are located between the first device region and the second device region. The chip pad group corresponding to the first device region is disposed close to the first device region. The chip pad group corresponding to the second device region is disposed close to the second device region. Along the first direction, the chip pad group corresponding to the third device region is located between the first device region and the third device region, and the chip pad group corresponding to the fourth device region is located between the second device region and the fourth device region.

In the chip pad group corresponding to the first device region in each of the second control regions, the reference voltage sub-pad and the reference voltage lead are connected through the connection lead overlapping with the sixth reference via hole, and the first input sub-pad and the first input lead are connected through the connection lead overlapping with the seventh input via hole.

In the chip pad group corresponding to the second device region in each of the second control regions, the reference voltage sub-pad and the reference voltage lead are connected through the connection lead overlapping with the seventh reference via hole, and the first input sub-pad and the second input lead are connected through the connection lead overlapping with the ninth input via hole.

In the chip pad group corresponding to the third device region in each of the second control regions, the reference voltage sub-pad and the reference voltage lead are connected through the connection lead overlapping with the eighth reference via hole, and the first input sub-pad and the first input lead are connected through the connection lead overlapping with the eighth input via hole.

In the chip pad group corresponding to the fourth device region in each of the second control regions, the reference voltage sub-pad and the reference voltage lead are connected through the connection lead overlapping with the ninth reference via hole, and the first input sub-pad and the second input lead are connected through the connection lead overlapping with the tenth input via hole.

In each of the second control regions, the first end of the device control circuit in the first device region is connected with the first power voltage lead through the connection lead that overlaps with the seventh power via hole. The first end of the device control circuit in the third device region is connected with the first power voltage lead through the connection lead that overlaps with the eighth power via hole. The first end of the device control circuit in the second device region is connected with the second power voltage lead through the connection lead that overlaps the ninth power via hole. The first end of the device control circuit in the fourth device region is connected with the second power voltage lead through the connection lead that overlaps the tenth power via hole.

In an exemplary embodiment of the present disclosure, in each of the control regions, the array substrate is provided with one chip pad group, and the chip pad group is located between the four device regions of the control region. The chip pad group includes a reference voltage sub-pad, a chip power sub-pad, a drive data sub-pad, an address sub-pad, and four output sub-pads. The second end of the device control circuit in each of the four device regions is electrically connected with a respective one of the four output sub-pads through the connection lead. The reference voltage sub-pad is located at a side along the first direction of the address sub-pad.

In each of the first control regions, the reference voltage sub-pad is located at a side along the first direction of the address sub-pad. The reference voltage sub-pad and the reference voltage lead are connected through the connection lead that overlaps with the second reference via hole. One of the chip power sub-pad and the drive data sub-pad is connected with the first input lead through the connection lead that overlaps with the first input via hole, and the other of the chip power sub-pad and the drive data sub-pad is connected with the second input lead through the connection lead that overlaps with the third input via hole. The address sub-pad is connected with the address lead through the connection lead overlapping with the address via hole.

In an exemplary embodiment of the present disclosure, in each of the control regions, the array substrate is provided with one chip pad group, and the chip pad group is located between the four device regions of the control regions. The chip pad group includes a reference voltage sub-pad, a chip power sub-pad, a drive data sub-pad, an address sub-pad, and four output sub-pads. The second end of the device control circuit in each of the four device regions is electrically connected with a respective one of the four output sub-pads through the connection lead.

When the wiring substrate is provided with the fifth reference via hole, in each of the first control regions, the reference voltage sub-pad and the reference voltage lead are connected through the connection lead that overlaps with the fifth reference via hole. One of the chip power sub-pad and the drive data sub-pad is connected with the first input lead through the connection lead overlapping with the first input via hole, and the other of the chip power sub-pad and the drive data sub-pad is connected with the second input lead through the connection lead overlapping with the third input via hole. The address sub-pad and the address lead are connected with each other through the connection lead overlapping the address via hole.

In an exemplary embodiment of the present disclosure, in each of the control regions, the array substrate is provided with one chip pad group, and the chip pad group is located between the four device regions of the control region. The chip pad group includes a reference voltage sub-pad, a chip power sub-pad, a drive data sub-pad, an address sub-pad, and four output sub-pads. The second end of the device control circuit in each of the four device regions is electrically connected with a respective one of the four output sub-pads through the connection lead.

When the wiring substrate is provided with the fifth input via hole and the sixth input via hole, in each of the first control regions, the reference voltage sub-pad and the reference voltage lead are connected through the connection lead. One of the chip power sub-pad and the drive data sub-pad is connected with the first input lead through the connection lead overlapping with the fifth input via hole, and the other of the chip power sub-pad and the drive data sub-pad is connected with the second input lead through the connection lead that overlaps with the sixth input via hole. The address sub-pad and the address lead are connected through the connection lead overlapping with the address via hole.

In an exemplary embodiment of the present disclosure, when the wiring substrate includes the second control regions, in each of the second control regions, the first end of the device control circuit in the first device region is connected with the first power voltage lead through the connection lead overlapping with the seventh power via hole. The first end of the device control circuit in the third device region is connected with the first power voltage lead through the connection lead overlapping with the eighth power via hole. The first end of the device control circuit in the second device region is connected with the second power voltage lead through the connection lead overlapping with the ninth power via hole. The first end of the device control circuit in the fourth device region is connected with the second power voltage lead through the connection lead overlapping with the tenth power via hole. The second end of the device control circuit in each of the four device regions is connected with a respective one of the four output sub-pads through the connection lead.

The reference voltage sub-pad and the reference voltage lead are connected through the connection lead overlapping with the tenth reference via hole. One of the chip power sub-pad and the drive data sub-pad is connected with the first input lead through the connection lead that overlaps with the eighth input via hole, and the other of the chip power sub-pad and the drive data sub-pad is connected with the second input lead through the connection lead overlapping with the tenth input via hole. The address sub-pad and the address lead are connected by the connection lead overlapping with the address via hole.

In an exemplary embodiment of the present disclosure, in each of the control regions, the array substrate is provided with one chip pad group, and the chip pad group is located between the four device regions of the control region. The chip pad group includes a reference voltage sub-pad, a chip power sub-pad, a drive data sub-pad, a strobe signal sub-pad, a relay signal sub-pad and four output sub-pads. The second end of the device control circuit in each of the four device regions is electrically connected to a respective one of the four output sub-pads through the connection lead.

In one of the signal channel regions, each of the control regions is numbered sequentially, wherein the control region with a serial number of 1 is located at an end of the signal channel region along its extension direction. The chip pad groups in each of the control regions are sequentially cascaded according to the serial number of the control region. The strobe signal sub-pad of the chip pad group in the control region with a serial number of 1 is connected with the address lead through the connection lead overlapping with the address via hole. The relay signal sub-pad of the chip pad group in the control region with a serial number of (n−1) is connected with the strobe signal sub-pad of the chip pad group in the control region with a serial number of n through the connection lead, wherein n is a positive integer greater than 1 and not greater than the number of the control regions in one signal channel.

In each of the first control regions, the reference voltage sub-pad and the reference voltage lead are connected by the connection lead overlapping with the second reference via hole. One of the chip power sub-pad and the drive data sub-pad is connected to the first input lead through the connection lead that overlaps with the first input via hole, and the other of the chip power sub-pad and the drive data sub-pad is connected to the second input lead through the connection lead overlapping with the third input via hole.

In an exemplary embodiment of the present disclosure, in each of the control regions, the array substrate is provided with one chip pad group, and the chip pad group is located between the four device regions of the control region. The chip pad group includes a reference voltage sub-pad, a chip power sub-pad, a drive data sub-pad, a strobe signal sub-pad, a relay signal sub-pad and four output sub-pads. The second end of the device control circuit in each of the four device regions is electrically connected to a respective one of the four output sub-pads through the connection lead.

In one of the signal channel regions, each of the control regions is numbered sequentially, wherein the control region with a serial number of 1 is located at an end of the signal channel region along its extension direction. The chip pad groups in each of the control regions are sequentially cascaded according to the serial number of the control region. The strobe signal sub-pad of the chip pad group in the control region with a serial number of 1 is connected with the address lead through the connection lead overlapping with the address via hole. The relay signal sub-pad of the chip pad group in the control region with a serial number of (n−1) is connected with the strobe signal sub-pad of the chip pad group in the control region with a serial number of n through the connection lead.

When the wiring substrate includes the fifth reference via hole, in each of the first control regions, the reference voltage sub-pad and the reference voltage lead are connected through the connection lead overlapping with the fifth reference via hole. One of the chip power sub-pad and the drive data sub-pad is connected with the first input lead through the connection lead overlapping with the first input via hole, and the other of the chip power sub-pad and the drive data sub-pad is connected with the second input lead through the connection lead overlapping with the third input via hole.

In an exemplary embodiment of the present disclosure, in each of the control regions, the array substrate is provided with one chip pad group, and the chip pad group is located between the four device regions of the control region. The chip pad group includes a reference voltage sub-pad, a chip power sub-pad, a drive data sub-pad, a strobe signal sub-pad, a relay signal sub-pad and four output sub-pads. The second end of the device control circuit in each of the four device regions is electrically connected to a respective one of the four output sub-pads through the connection lead.

In one of the signal channel regions, each of the control regions is numbered sequentially, wherein the control region with a serial number of 1 is located at an end of the signal channel region along its extension direction. The chip pad groups in each of the control regions are sequentially cascaded according to the serial number of the control region. The strobe signal sub-pad of the chip pad group in the control region with a serial number 1 is connected with the address lead through the connection lead overlapping with the address via hole. The relay signal sub-pad of the chip pad group in the control region with a serial number of (n−1) is connected to the strobe signal sub-pad of the chip pad group in the control region with a serial number of n through the connection lead, wherein n is a positive integer greater than 1 and not greater than the number of the control regions in one signal channel.

When the wiring substrate includes the fifth reference via hole and the sixth reference via hole, in each of the first control regions, the reference voltage sub-pad and the reference voltage lead are connected through the connection lead. One of the chip power sub-pad and the drive data sub-pad is connected to the first input lead through the connection lead that overlaps the fifth input via hole, and the other of the chip power sub-pad and the drive data sub-pad is connected to the second input lead through the connection lead overlapping with the sixth input via hole.

In an exemplary embodiment of the present disclosure, when the wiring substrate includes the second control regions, in each of the second control regions, the first end of the device control circuit in the first device region is connected with the first power voltage lead through the connection lead overlapping with the seventh power via hole. The first end of the device control circuit in the third device region is connected to the first power voltage lead through the connection lead overlapping with the eighth power via hole. The first end of the device control circuit in the second device region is connected to the second power voltage lead through the connection lead overlapping with the ninth power via hole. The first end of the device control circuit in the fourth device region is connected with the second power voltage lead through the connection leads overlapping with the tenth power via hole. The second end of the device control circuit in each of the four device regions is connected to a respective one of the four output sub-pads through the connection lead.

The reference voltage sub-pad and the reference voltage lead are connected by the connection lead overlapping with the tenth reference via hole. One of the chip power sub-pad and the drive data sub-pad is connected to the first input lead through the connection lead that overlaps the eighth input via hole, and the other of the chip power sub-pad and the drive data sub-pad is connected to the second input lead through the connection lead overlapping with the tenth input via hole.

In an exemplary embodiment of the present disclosure, in each of the control regions, the array substrate is provided with one chip pad group, and the chip pad group is located between the four device regions of the control region. The chip pad group includes two reference voltage sub-pads, a chip power sub-pad, a drive data sub-pad, a strobe signal sub-pad, a relay signal sub-pad and four output sub-pads. The second end of the device control circuit in each of the four device regions is electrically connected to a respective one of the four output sub-pads through the connection lead.

In one of the signal channel regions, each of the control regions is numbered sequentially, wherein the control region with a serial number of 1 is located at an end of the signal channel region along its extension direction. The chip pad groups in each of the control regions are sequentially cascaded according to the serial number of the control region. The strobe signal sub-pad of the chip pad group in the control region with a serial number of 1 is connected with the address lead through the connection lead overlapping with the address via hole. The relay signal sub-pad of the chip pad group in the control region with a serial number of (n−1) is connected to the strobe signal sub-pad of the chip pad group in the control region with a serial number of n through the connection lead, wherein is a positive integer greater than 1 and not greater than the number of the control regions in one signal channel.

In each of the first control regions, along the second direction, the reference voltage sub-pad is located between the strobe signal sub-pad and the first reference via hole. One of the reference voltage sub-pad and the reference voltage lead is connected by the connection lead overlapping with the first reference via hole. One of the chip power sub-pad and the drive data sub-pad is connected with the first input lead through the connection lead overlapping with the first input via hole, and the other of the chip power sub-pad and the drive data sub-pad is connected with the second input lead through the connection lead overlapping with the third input via hole.

In an exemplary embodiment of the present disclosure, in each of the control regions, the array substrate is provided with one chip pad group, and the chip pad group is located between the four device regions of the control region. The chip pad group includes two reference voltage sub-pads, a chip power sub-pad, a drive data sub-pad, a strobe signal sub-pad, a relay signal sub-pad and four output sub-pads. The second end of the device control circuit in each of the four device regions is electrically connected to a respective one of the four output sub-pads through the connection lead.

In one of the signal channel regions, each of the control regions is numbered sequentially, wherein the control region with a serial number of 1 is located at an end of the signal channel region along its extension direction. The chip pad groups in each of the control regions are sequentially cascaded according to the serial number of the control region. The strobe signal sub-pad of the chip pad group in the control region with a serial number of 1 is connected with the address lead through the connection lead overlapping with the address via hole. The relay signal sub-pad of the chip pad group in the control region with a serial number of (n−1) is connected to the strobe signal sub-pad of the chip pad group in the control region with a serial number of n through the connection lead.

When the wiring substrate includes the fifth reference via hole, in each of the first control regions, along the second direction, the reference voltage sub-pad is located between the strobe signal sub-pad and the first reference via hole. The chip pad group is located at a side along the second direction of the fifth reference via hole. One of the reference voltage sub-pads is connected with the reference voltage lead through the connection lead that overlaps with the first reference via hole. The other of the reference voltage sub-pads is connected with the reference voltage lead through the connection lead that overlaps with the fifth reference via hole. One of the chip power sub-pad and the drive data sub-pad is connected to the first input lead through the connection lead overlapping with the first input via hole, and the other of the chip power sub-pad and the drive data sub-pad is connected to the second input lead through the connection lead that overlaps with the third input via hole.

In an exemplary embodiment of the present disclosure, when the wiring substrate includes the second control regions, in each of the second control regions, the first end of the device control circuit in the first device region is connected with the first power voltage lead through the connection lead overlapping with the seventh power via hole. The first end of the device control circuit in the third device region is connected to the first power voltage lead through the connection lead overlapping with the eighth power via hole. The first end of the device control circuit in the second device region is connected to the second power voltage lead through the connection lead overlapping with the ninth power via hole. The first end of the device control circuit in the fourth device region is connected with the second power voltage lead through the connection lead overlapping with the tenth power via hole. The second end of the device control circuit in each of the four device regions is connected to a respective one of the four output sub-pads through the connection lead.

One of the reference voltage sub-pads is connected with the reference voltage lead through the connection lead overlapping with the tenth reference via hole. One of the chip power sub-pad and the drive data sub-pad is connected to the first input lead through the connection lead overlapping with the eighth input via hole, and the other of the chip power sub-pad and the drive data sub-pad is connected to the second input lead through the connection lead overlapping with the tenth input via hole.

According to another aspect of the present disclosure, there is provided a light emitting module including the above-mentioned array substrate.

BRIEF DESCRIPTION OF THE DRAWINGS

The drawings herein are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

Figure 1:
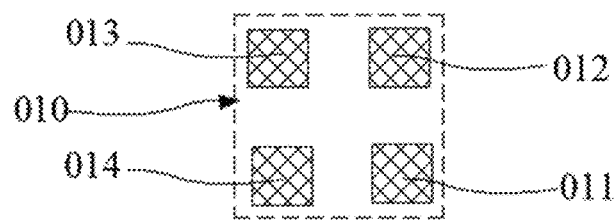
FIG. 1 is a schematic position diagram of each pin of the first chip according to an embodiment of the present disclosure.

REFERENCE NUMERALS 101, base substrate; 102, first metal wiring layer; 1021, copper seed layer; 1022, copper growth layer; 103, insulating material layer; 1031, first passivation layer; 1032, planarized organic material layer; 104, second metal wiring layer; 105, insulating protection layer; 1051, second passivation layer; 1052, organic protection layer; 106, microchip; 107, functional device; 108, buffer layer; 201, control region; 210, control region row; 220, control region column; 2011, first control region; 2012, second control region; 300, drive lead; 301, protruding part; 302, accommodating notch; 303, first support metal part; 304, second support metal part; 305, third support metal part; 306, fourth support metal part; 310, first power voltage lead; 320, first input lead; 330, reference voltage lead; 340, second input lead; 350, second power voltage lead; 360, address lead; 361, first address lead; 362, second address lead; 371, first voltage distribution line; 372, second voltage distribution line; 373, bridging lead; 374, conductive connection part; 400, fan-out lead; 500, connection lead; 010, first chip; 011, reference voltage pin; 012, output pin; 013, first input pin; 014, second input pin; P10, first pad group; P11, reference voltage sub-pad; P12, output sub-pad; P13, first input sub-pad; P14, second input sub-pad; 020, second chip; 021, reference voltage pin; 0221, first output pin; 0222, second output pin; 0223, third output pin; 0224, fourth output pin; 023, chip power pin; 024, drive data pin; 025, address pin; P20, second pad group; P21, reference voltage sub-pad; P221, first output sub-pad; P222, second output sub-pad; P223, third output sub-pad; P224, fourth output sub-pad; P23, chip power sub-pad; P24, drive data sub-pad; P25, address sub-pad; 030, third chip; 031, reference voltage pin; 0321, first output pin; 0322, second output pin; 0323, third output pin; 0324, fourth output pin; 033, chip power pin; 034, drive data pin; 035, strobe signal pin; 036, relay signal pin; P30, third pad group;

P31, reference voltage sub-pad; P321, first output sub-pad; P322, second output sub-pad; P323, third output sub-pad; P324, fourth output sub-pad; P33, chip power sub-pad; P34, drive data sub-pad; P35, strobe signal sub-pad; P36, relay signal sub-pad; 040, fourth chip; 041, reference voltage pin; 0421, first output pin; 0422, second output pin; 0423, third output pin; 0424, fourth output pin; 043, chip power pin; 044, drive data pin; 045, strobe signal pin; 046, relay signal pin; P40, fourth pad group; P41, reference voltage sub-pad; P421, first output sub-pad; P422, second output sub-pad; P423, third output sub-pad; P424, fourth output sub-pad; P43, chip power sub-pad; P44, drive data sub-pad; P45, strobe signal sub-pad; P46, relay signal sub-pad; P50, device pad group; P51, first device sub-pad; P52, second device sub-pad; HV1, first power via hole; HV2, second power via hole; HV3, third power via hole; HV4, fourth power via hole; HV5, fifth power via hole; HV6, sixth power via hole; HV7, seventh power via hole; HV8, eighth power via hole; HV9, ninth power via hole; HV10, tenth power via hole; HI1, first input via hole; HI2, second input via hole; HI3, third input via hole; HI4, fourth input via hole; HI5, fifth input via hole; HI6, sixth input via hole; HI7, seventh input via hole; HI8, eighth input via hole; HI9, ninth input via hole; HI10, tenth input via hole; HR1, first reference via hole; HR2, second reference via hole; HR3, third reference via hole; HR4, fourth reference via hole; HR5, fifth reference via hole; HR6, sixth reference via hole; HR7, seventh reference via hole; HR8, eighth reference via hole; HR9, ninth reference via hole; HR10, tenth reference via hole; HD1, first address via hole; HD2, second address via hole; HD3, third address via hole; A, device region; B, binding region; C, first direction; D, second direction.

DETAILED DESCRIPTION OF THE EMBODIMENTS

Example embodiments will now be described more fully with reference to the accompanying drawings. However, the example embodiments can be implemented in various forms, and should not be construed as being limited to the embodiments set forth herein. On the contrary, these embodiments are provided so that the present disclosure will be comprehensive and complete, and the concept of the example embodiments is fully conveyed to those skilled in the art. The same reference numerals in the figures indicate the same or similar structures, and thus their detailed descriptions will be omitted. In addition, the drawings are only schematic illustrations of the present disclosure, and are not necessarily drawn to scale.

The terms "a", "an", "the", "said" and "at least one" are used to indicate the presence of one or more elements/components/etc. The terms "including" and "have" are used to indicate open-ended inclusion, meaning that in addition to the listed elements/components/etc., there may be other elements/components/etc. The terms "first", "second" and "third" etc. are only used as a marker, not to limit the number of objects.

In the related art, an array substrate used as an actively driven Mini LED substrate may include a base substrate, a first metal wiring layer, an insulating material layer, a second metal wiring layer, and an insulating protection layer that are stacked in sequence, and may further comprise microchips and light emitting elements bound on the second metal wiring layer. The first metal wiring layer may be provided with drive leads. The second metal wiring layer is provided with a device pad group for binding light emitting elements and a chip pad group for binding microchips, and is further provided with the connection leads for connecting the device pad group, the chip pad group and the drive leads. Under the control of microchips, the light emitting elements can emit light in a controlled manner. In the related art, there are a variety of different microchips that can be used for array substrates.

Exemplarily, referring to FIG. 1, the first chip 010, as a microchip, has four different pins, namely, a first input pin 013, a second input pin 014, a reference voltage pin 011, and an output pin 012. The four pins are distributed in a rectangular region, and are respectively located at the four top corners of the rectangular region. The reference voltage pin 011 is used to load the reference voltage GND to the first chip 010, the first input pin 013 is used to load the first input signal Pwr to the first chip 010, and the second input pin 014 is used to load the second input signal Di to the first chip 010.

The first chip 010 may be configured to, according to the first input signal Pwr loaded on the first input pin 013 and the second input signal Di loaded on the second input pin 014, output, in the first time period, a relay signal through the output pin 012, and provide, in the second time period, a light emitting path for the light emitting element through the output pin 012. The relay signal is an address signal or a strobe signal. After the second input pin 014 of a first chip 010 is loaded with the relay signal, the first chip 010 can receive the first input signal Pwr loaded on the first input pin 013. The first input signal Pwr is a power line carrier communication signal, which can provide drive data while providing the first chip 010 with the chip operating voltage VCC. When the first chip 010 is applied to an array substrate, one or more interconnected light emitting elements can form a light emitting region, and one light emitting region can be connected to an output pin 012 of a first chip 010. In this way, one first chip 010 can drive one light emitting region, and multiple first chips 010 can be cascaded sequentially to form a signal channel. In a signal channel, the n-th stage of first chip 010 responds to the relay signal of the (n−1)th stage of first chip 010, and sends a relay signal to the (n+1)th stage of first chip 010, thereby achieving control over the first chip 010 at all stages.

Figure 2:
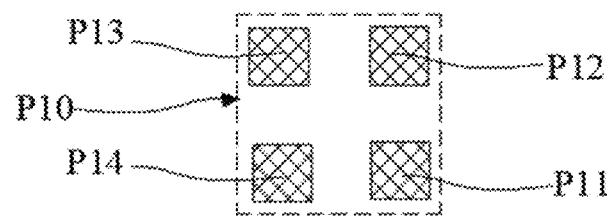
FIG. 2 is a schematic position diagram of each sub-pad of the first pad group according to an embodiment of the present disclosure.

Referring to FIG. 2, in order to connect with the first chip 010, a first pad group P10 as a chip pad group needs to be provided on the array substrate. The first pad group P10 has multiple sub-pads each corresponding to a respective pin of the first chip 010. The first pad group P10 may include a reference voltage sub-pad P11 for binding and connecting with the reference voltage pin 011 of the first chip 010, an output sub-pad P12 for binding and connecting with the output pin 012 of the first chip 010, a first input sub-pad P13 for binding and connecting with the first input pin 013 of the first chip 010, and a second input sub-pad P14 for binding and connecting with the second input pin 014 of the first chip 010.

Figure 3:
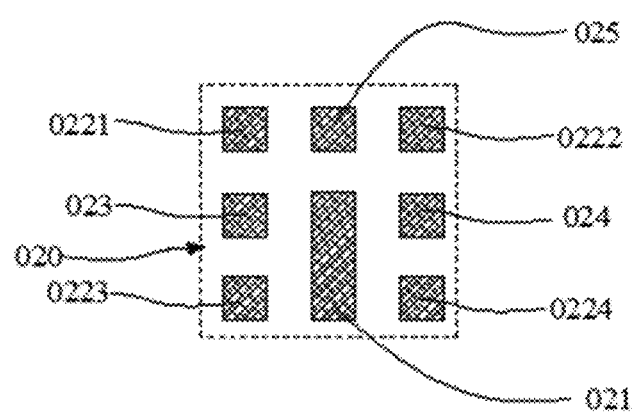
FIG. 3 is a schematic position diagram of each pin of the second chip according to an embodiment of the present disclosure.

As another example, referring to FIG. 3, the second chip 020 is a microchip with eight different pins, namely the chip power pin 023, the drive data pin 024, the address pin 025, the reference voltage pin 011, and four output pins (including the first output pin 0221, the second output pin 0222, the third output pin 0223, and the fourth output pin 0224). Eight pins are distributed in a rectangular region. The four top corners of the rectangular region are respectively provided with four output pins. The chip power pin 023, the drive data pin 024, the address pin 025, and the reference voltage pin 021 are respectively set at the middle parts of the four edges of the rectangular region. The chip power pin 023 and the drive data pin 024 are respectively located on two opposite edges. The chip power pin 023 is used to load the chip operating voltage VCC to the second chip 020, the drive data pin 024 is used to load drive data Data to the second chip 020, and the reference voltage pin 021 is used to load the reference voltage GND to the second chip 020. The address pin 025 is used to load the strobe signal to the second chip 020, and the four output pins are used to load the drive signals output by the second chip 020 respectively.

The second chip 020 is configured to receive the drive data Data loaded on the drive data pin 024 under the control of the strobe signal loaded on the address pin 025. Then, according to the received drive data Data, the chip operating voltage VCC loaded on the chip power pin 023, and the reference voltage GND loaded on the reference voltage pin 021, light emitting paths are provided respectively for the light emitting elements through the four output pins. When the second chip 020 is applied to an array substrate, one or more interconnected light emitting elements can form a light emitting region, and one light emitting region can be connected to an output pin of a second chip 020. In this way, any output pin of the second chip 020 can be used to control one light emitting region. That is, one second chip 020 can control the four light emitting regions to emit light independently. The multiple second chips 020 may be arranged in multiple rows, and the array substrate scans through each row of second chip row by row to realize the control over each second chip 020.

Figure 4:
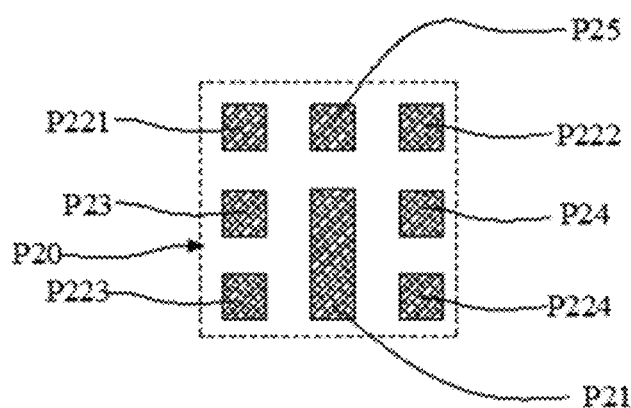
FIG. 4 is a schematic position diagram of each sub-pad of the second pad group according to an embodiment of the present disclosure.

With reference to FIG. 4, in order to complete the connection with the second chip 020, a second pad group P20 as a chip pad group needs to be provided on the array substrate. The second pad group P20 includes eight sub-pads, which are respectively the chip power sub-pad P23 for binding and connecting to the chip power pin 023, the drive data sub-pad P24 for binding and connecting to the drive data pin 024, the address sub-pad P25 for binding and connecting to the address pin 025, the reference voltage sub-pad P11 for binding and connecting to the reference voltage pin 011, and four output sub-pads each for binding and connecting with a respective one of the four output pins. The four output sub-pads include a first output sub-pad P221 for binding and connecting with the first output pin 0221, a second output sub-pad P222 for binding and connecting with the second output pin 0222, a third output sub-pad P223 for binding and connecting with the third output pin 0223, and a fourth output sub-pad P224 for binding and connecting with the fourth output pin 0224. Referring to FIG. 4, eight sub-pads are distributed in a rectangular region. The four top corners of the rectangular region are respectively provided with the four output sub-pads. The chip power sub-pad P23, the drive data sub-pad P24, the address sub-pad P5, and the reference voltage sub-pad P21 are respectively set at the middle parts of the four edges of the rectangular region. The chip power sub-pad P23 and the drive data sub-pad P24 are respectively located on two oppositely arranged edges. The reference voltage sub-pad P11 and the address sub-pad P25 are respectively located on two oppositely arranged edges. The reference voltage sub-pad P11 can also extend toward the center of the rectangular region.

Figure 5:
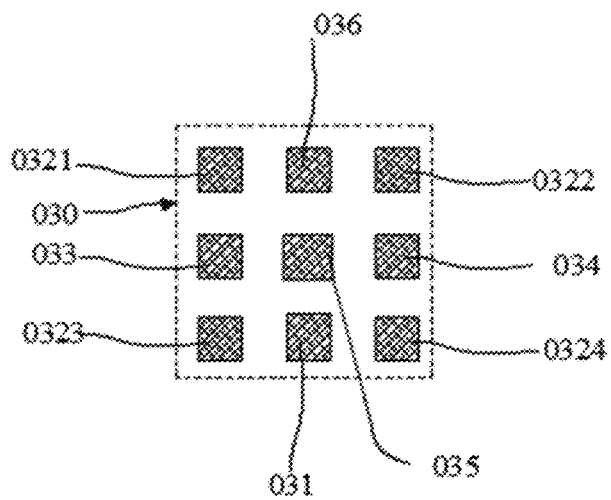
FIG. 5 is a schematic position diagram of each pin of the third chip according to an embodiment of the present disclosure.

Illustratively again, referring to FIG. 5, the third chip 030 as a microchip includes nine pins, namely, the chip power pin 033, the drive data pin 034, the strobe signal pin 035, the relay signal pin 036, the reference voltage pin 031, and four output pins. The four output pins respectively include a first output pin 0321, a second output pin 0322, a third output pin 0323, and a fourth output pin 0324. Nine pins are arranged in a 3×3 array in a rectangular region. The four top corners of the rectangular region are respectively provided with the four output pins. The center of the rectangular region is provided with the strobe signal pin 035. The four edges of the rectangular regions are respectively provided with the relay signal pin 036, the chip power pin 033, the reference voltage pin 031, and the drive data pin 034. The chip power pin 033 and the drive data pin 034 are respectively located on two opposite edges. The relay signal pin 036 and the reference voltage pin 031 are respectively located on two opposite edges. The chip power pin 033 is used to load the chip operating voltage VCC to the third chip 030. The drive data pin 034 is used to load drive data Data to the third chip 030. The reference voltage pin 031 is used to load the reference voltage GND to the third chip 030. The strobe signal pin 035 is used to load the strobe signal to the third chip 030. The relay signal pin 036 is used to load the relay signal output by the third chip 030, and the four output pins are respectively used for loading the drive signal output by the third chip 030. The relay signal is a strobe signal. When the strobe signal pin 035 of a third chip 030 is loaded with a relay signal, the third chip 030 can receive the drive data Data loaded on the drive data pin 034.

The third chip 030 is configured to, according to the strobe signal or relay signal loaded on the strobe signal pin 035, and also according to the drive data Data loaded on the drive data pin 034, output a relay signal through the relay signal pin 036, and provide light emitting paths for the light emitting elements through the four output pins. When the third chip 030 is applied to an array substrate, one or more interconnected light emitting elements can form a light emitting region, and one light emitting region can be connected to an output pin of a third chip 030. The four output pins of a third chip 030 can respectively drive a light emitting region. That is, one third chip 030 can drive four light emitting regions. Multiple third chips 030 can be cascaded in sequence to form a signal channel. In a signal channel, the first stage of third chip 030 sends a relay signal to the second stage of third chip 030 in response to the strobe signal, and the nth stage of third chip 030 responds to the relay signal of the (n−1)th stage of third chip 030 and sends a relay signal to the (n+1)th stage of third chip 030, so as to realize the control over the third chip 030 at all stages.

Figure 6:
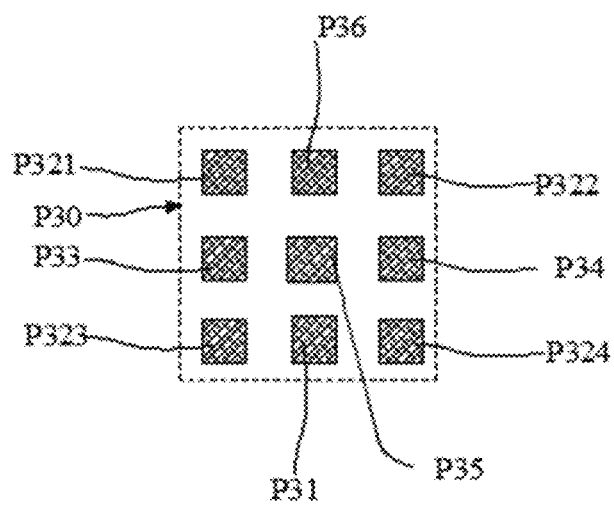
FIG. 6 is a schematic position diagram of each sub-pad of the third pad group according to an embodiment of the present disclosure.

Referring to FIG. 6, in order to realize the connection with the third chip 030, a third pad group P30 as a chip pad group needs to be provided on the array substrate. The third pad group P30 includes nine sub-pads each corresponding to a respective one of the nine pins of the third chip 030. The nine sub-pads are respectively the chip power sub-pad P33 for binding and connecting with the chip power pin 033, the drive data sub-pad P34 for binding and connecting with the drive data pin 034, the strobe signal sub-pad P35 for binding and connecting with the strobe signal pin 035, the relay signal sub-pad P36 for binding and connecting with the relay signal pin 036, the reference voltage sub-pad P31 for binding and connecting with the reference voltage pin 031, and four output sub-pads each for binding and connecting with a respective one of the four output pins. The four output sub-pads respectively include a first output sub-pad P321, a second output sub-pad P322, a third output sub-pad P323, and a fourth output sub-pad P324. The nine sub-pads are arranged in a 3×3 array in a rectangular region. The four top corners of the rectangular region are respectively provided with the four output sub-pads. The center of the rectangular region is provided with the strobe signal sub-pad P35. The four edges of the rectangular region are respectively provided with the relay signal sub-pad P36, the chip power sub-pad P33, the reference voltage sub-pad P31, and the drive data sub-pad P34. The chip power sub-pad P33 and the drive data sub-pad P34 are respectively located on two opposite edges. The relay signal sub-pad P36 and the reference voltage sub-pad P31 are respectively located on two opposite edges.

Figure 7:
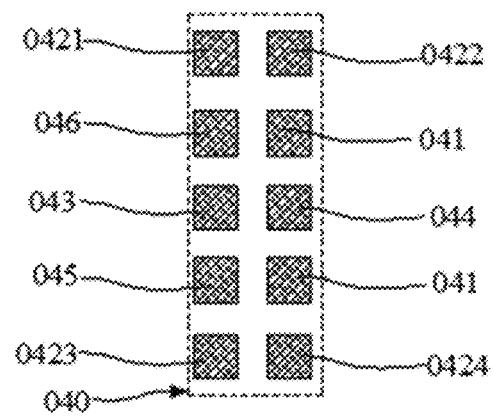
FIG. 7 is a schematic position diagram of each pin of the fourth chip according to an embodiment of the present disclosure.

Illustratively again, referring to FIG. 7, the fourth chip 040 is a microchip and includes ten pins, namely, the chip power pin 043, the drive data pin 044, the strobe signal pin 045, the relay signal pin 046, two reference voltage pins 041, and four output pins. The four output pins include a first output pin 0421, a second output pin 0422, a third output pin 0423, and a fourth output pin 0424, respectively. Ten pins are arranged in 5×2 in a rectangular region. The first column is provided with the first output pin 0421, the relay signal pin 046, the chip power pin 043, the strobe signal pin 045, and the third output pin 0423 in sequence. In the second column, the second output pin 0422, the reference voltage pin 041, the drive data pin 044, the reference voltage pin 041, and the fourth output pin 0424 are arranged in sequence. The chip power pin 043 is used to load the chip operating voltage VCC to the fourth chip 040. The drive data pin 044 is used to load the drive data Data to the fourth chip 040. The reference voltage pin 041 is used to load the reference voltage GND to the fourth chip 040. The strobe signal pin 045 is used to load the strobe signal to the fourth chip 040. The relay signal pin 046 is used to load the relay signal output by the fourth chip 040. The four output pins are used to load the drive signal output by the fourth chip 040. The relay signal is a strobe signal. When the strobe signal pin 045 of a fourth chip 040 is loaded with a relay signal, the fourth chip 040 can receive the drive data Data loaded on the drive data pin 044.

The fourth chip 040 is configured to, according to the strobe signal or relay signal loaded on the strobe signal pin 045, and according to the drive data loaded on the drive data pin 044, output the relay signal through the relay signal pin 046, and provide light emitting paths for the light emitting elements through the four output pins. When the fourth chip 040 is applied to an array substrate, one or more interconnected light emitting elements can form a light emitting region, and one light emitting region can be connected to an output pin of a fourth chip 030. In this way, the four output pins of the fourth chip 040 can respectively drive one light emitting region. That is, one fourth chip 040 can drive four light emitting regions. Multiple fourth chips 040 can be cascaded sequentially to form a signal channel. In a signal channel, the nth stage of fourth chip 040 responds to the relay signal of the (n−1)th stage of fourth chip 040 and sends a relay signal to the (n+1)th stage of fourth chip 040 to realize the control over each fourth chip 040.

Figure 8:
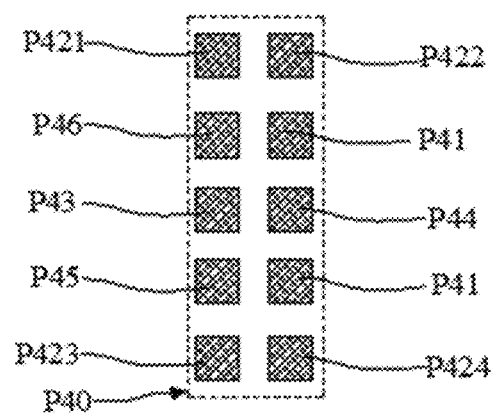
FIG. 8 is a schematic position diagram of each sub-pad of the fourth pad group according to an embodiment of the present disclosure.
Figure 9:
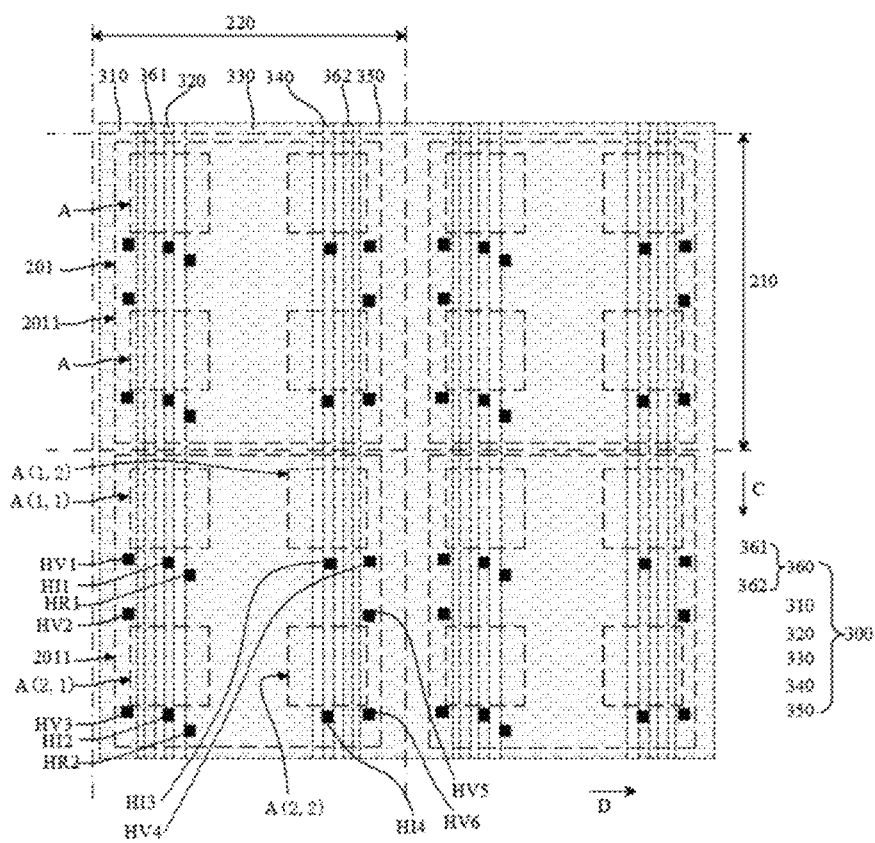
FIG. 9 is a schematic diagram of a partial structure of a wiring substrate according to an embodiment of the present disclosure, wherein FIG. 9 only illustrates the relative position between at least part of the via holes provided on the first metal wiring layer and the insulating material layer.
Figure 10:
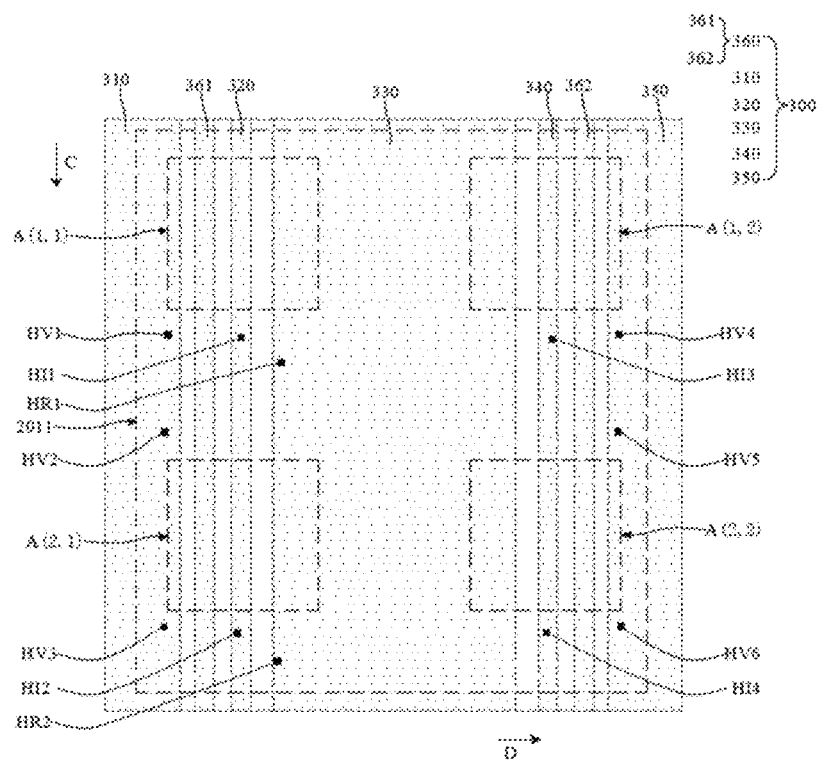
FIG. 10 is a partial enlarged schematic diagram in a first control region of the wiring substrate shown in FIG. 9, wherein FIG. 10 only illustrates the relative position between at least part of the via holes provided on the first metal wiring layer and the insulating material layer.

Referring to FIG. 8, in order to complete the electrical connection with the fourth chip 040, a fourth pad group P40 as a chip pad group needs to be provided on the array substrate. The fourth pad group P40 includes ten sub-pads each corresponding to a respective one of the ten pins of the fourth chip 040. They are respectively the chip power sub-pad P43 for binding and connecting with the chip power pin 043, the drive data sub-pad P44 for binding and connecting with the drive data pin 044, the strobe signal sub-pad P45 for binding and connecting to the strobe signal pin 045, the relay signal sub-pad P46 for binding and connecting with the relay signal pin 046, two reference voltage sub-pads P41 each for binding and connecting with a respective one of the two reference voltage pins 041, and four output sub-pads each for binding and connecting to a respective one of the four output pins. The four output sub-pads respectively include a first output sub-pad P421 for binding and connecting with the first output pin 0421, a second output sub-pad P422 for binding and connecting with the second output pin 0422, a third output sub-pad P423 for binding and connecting with the third output pin 0423, and a fourth output sub-pad P424 for binding and connecting with the fourth output pin 0424. Ten sub-pads are distributed in a 5×2 array in a rectangular region. The first column is provided with the first output sub-pad P421, the relay signal sub-pad P46, the chip power sub-pad P43, the strobe signal sub-pad P45 and the third output sub-pad P423 in sequence. The second column is provided with the second output sub-pad P422, the reference voltage sub-pad P41, the drive data sub-pad P44, the reference voltage sub-pad P41 and the fourth output sub-pad P424 in sequence.

As can be seen from above, for different microchips, there are differences in the number of pins, the signals that each pin is used to load, and the position distribution of the pins that load the same signal. The number of light emitting regions that can be driven by different microchips may also be different. As a result, when forming an array substrate, each type of array substrate has different requirements for the arrangement of the drive leads on the first metal wiring layer, the connection leads on the second metal wiring layer, and the arrangement of the device pad groups, leading that different array substrates have great differences in structure.

In addition, in the related art, when preparing the array substrate, uncontrolled short-circuit defects are likely to occur between the drive leads of the first metal wiring layer and the connection leads of the second metal wiring layer. If the connection leads are adjusted at will, the probability of short circuits between the connection leads and the drive leads of different signals may increase, and the yield rate of the array substrate will decrease.

Figure 48:
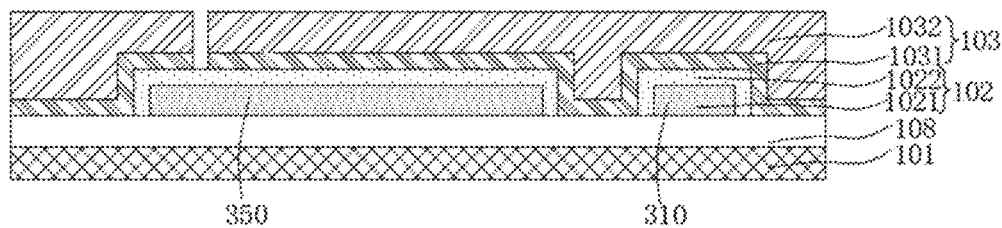
FIG. 48 is a schematic cross-sectional structure diagram of the wiring substrate at the position MN in FIG. 47 according to an embodiment of the present disclosure.

In order to simplify the preparation process of different array substrates, and reduce the preparation cost of different array substrates without reducing the yield of the array substrate, the present disclosure provides a wiring substrate. Referring to FIG. 48, the wiring substrate of the present disclosure includes a base substrate 101, a first metal wiring layer 102, and an insulating material layer 103 stacked in sequence. The wiring substrate can be used to further prepare at least two different types of array substrates, and microchips used on the array substrate of each type can be different in type. In other words, on the basis of the wiring substrate provided by the present disclosure, referring to FIG. 49, the required second metal wiring layer 104 and insulating protection layer 105 can be further prepared, and the functional devices (not shown in FIG. 49) and the required microchips (not shown in FIG. 49) can be bound to obtain the required array substrate. In this way, the wiring substrate of the present disclosure can be used as an intermediate substrate suitable for different types of array substrates, so that different types of array substrates can use the same process, material and equipment during the preparation of the wiring substrate, for example, sharing the same mask, etc. Thus, the cost of different types of array substrates is reduced, and the productivity and yield of different types of array substrates can be improved.

In the wiring substrate provided by the present disclosure, referring to FIG. 48, the insulating material layer 103 may be provided with a plurality of via holes exposing the first metal wiring layer 102. When an array substrate is prepared based on the wiring substrate of the present disclosure, referring to FIG. 49, the second metal wiring layer 104 may be connected to the first metal wiring layer 102 through at least some of these via holes, and the rest of these via holes may be filled with the insulating protection layer 105. When different array substrates are prepared based on the wiring substrate of the present disclosure, the via hole used to connect the second metal wiring layer 104 and the first metal wiring layer 102 in one type of array substrate can still be used in another type of array substrate for connecting the second metal wiring layer 104 with the first metal wiring layer 102, and it can also be filled with the insulating protection layer 105 without overlapping with the second metal wiring layer 104. Of course, when different array substrates are prepared based on the wiring substrate of the present disclosure, the via holes that are filled with the insulating protection layer 105 and do not overlap with the second metal wiring layer 104 in one type of array substrate can be used in another type of array substrate to connect the second metal wiring layer 104 and the first metal wiring layer 102, and it can still be filled with the insulating protection layer 105 without overlapping with the second metal wiring layer 104. In this way, the insulating material layer 103 of the wiring substrate according to the present disclosure can be applied to different types of array substrates by providing redundant via holes.

In the present disclosure, when two structures are described as overlapping, it means that the orthographic projection of one structure on the base substrate overlaps with the orthographic projection of the other structure on the base substrate. When two structures are described as completely overlapping, it means that the orthographic projection of one structure on the base substrate is completely located within the orthographic projection of the other structure on the base substrate.

In the wiring substrate and the array substrate of the present disclosure, the base substrate 101 may be an inorganic material base substrate or an organic material base substrate. For example, in an embodiment of the present disclosure, the material of the base substrate can be glass materials such as soda-lime glass, quartz glass, sapphire glass, or metal materials such as stainless steel, aluminum, nickel, etc. In another embodiment of the present disclosure, the material of the base substrate may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), polyethylene naphthalate (PEN), or a combination thereof.

Optionally, in an embodiment of the present disclosure, the base substrate 101 may be a glass substrate.

Optionally, in terms of patterns and functions, the first metal wiring layer 102 may include drive leads and fan-out leads connected to the drive leads. In an embodiment of the present disclosure, the first metal wiring layer 102 may further include binding pads connected to the fan-out leads. It can be understood that the region of the first metal wiring layer serving as the binding pad has a surface not covered by any other insulating film, so as to ensure electrical connection with external signal source circuits such as printed circuit boards.

With regard to the hierarchical structure, the first metal wiring layer 102 may include a metal layer, or may include multiple layers of metal. Illustratively, referring to FIG. 48, the first metal wiring layer 102 may include a copper seed layer 1021 and a copper growth layer 1022 that are sequentially stacked on one side of the base substrate 101. In some embodiments, the copper growth layer 1022 can be disposed on the surface of the copper seed layer 1021 away from the base substrate 101, and can expose at least part of the sides of the copper seed layer 1021. For example, the orthographic projections on the base substrate 101 of the copper seed layer 1021 and the copper growth layer 1022 roughly coincide with each other. In other embodiments, the copper growth layer 1022 may completely cover the sides of the copper seed layer 1021 and the surface thereof away from the base substrate 101.

In some embodiments, the copper seed layer 1021 may be formed by a magnetron sputtering method, and the copper growth layer 1022 may be formed by an electroplating or electroless plating method. Optionally, the copper seed layer 1021 may include a first metal adhesion layer and a first copper metal layer sequentially stacked on one side of the base substrate 101. The first metal adhesion layer may reinforce the binding force between the first copper metal layer and the base substrate 101. The material of the first metal adhesion layer can be an alloy material containing molybdenum. For example, it can be a molybdenum-niobium alloy, a molybdenum-niobium-copper alloy, and the like. Optionally, the first metal wiring layer 102 may further include a first metal protection layer located on the side of the copper growth layer 1022 away from the base substrate 101. The first metal protection layer can prevent the surface of the copper growth layer 1022 from being oxidized. The material of the first metal protection layer may be an alloy containing nickel or molybdenum. For example, it may be a copper-nickel alloy, a molybdenum-niobium alloy, a molybdenum-titanium-nickel (MTD) alloy, and the like. In some embodiments, the first metal wiring layer 102 may further include an etching barrier layer located on the surface of the first metal wiring layer 102 away from the base substrate 101, so that when preparing the second metal wiring layer 104 of the array substrate, the etching of the first metal wiring layer 102 is reduced or avoided. The material of the etching barrier layer may be conductive metal oxide, for example, indium zinc oxide.

The first metal wiring layer 102 can be prepared in a variety of different methods. Exemplarily, in an embodiment of the present disclosure, an unpatterned copper seed layer 1021 covering the base substrate 101 may be formed first, and then copper is deposited using a copper electroplating method to form an unpatterned copper growth layer 1022. Finally, the patterned copper seed layer 1021 and the unpatterned copper growth layer 1022 are patterned to obtain the first metal wiring layer 102. Illustratively, in another embodiment of the present disclosure, a patterned copper seed layer 1021 may be formed first, and then a pattern defining layer covering the base substrate 101 and exposing the copper seed layer 1021 may be formed. After that, the copper electroplating method may be used to form the patterned copper growth layer 1022 on the patterned copper seed layer 1021, so as to obtain the first metal wiring layer 102. Then, the pattern defining layer is removed. Illustratively, in another embodiment of the present disclosure, an unpatterned copper seed layer 1021 covering the base substrate 101 may be formed first, and then a pattern defining layer is formed on the side of the copper seed layer 1021 away from the base substrate 101. The pattern defining layer only exposes the position where the copper growth layer 1022 needs to be formed. After that, a patterned copper growth layer 1022 is formed on the unpatterned copper seed layer 1021 by the copper electroplating method. After removing the pattern defining layer, the unpatterned copper seed layer 1021 is patterned to obtain the first metal wiring layer 102.

It can be understood that the first metal wiring layer can also be formed by multiple times of magnetron sputtering methods. Exemplarily, the first metal wiring material layer may be formed by multiple times of magnetron sputtering, and the thickness of the metal layer formed by each time of magnetron sputtering is not greater than 1 micron. Then, the first metal wiring material layer is patterned, to form the first metal wiring layer. As another example, a plurality of metal wiring sublayers with the same pattern may be sequentially formed, and each metal wiring sublayer is sequentially stacked to form the first metal wiring layer. When forming each metal wiring sublayer, a metal wiring material sublayer can be formed by magnetron sputtering first, and the thickness of the metal wiring material sublayer is not more than 1 micron. Then, the metal wiring material sublayer is patterned to form the metal wiring sublayer.

It should be understood that the foregoing introduction to the structure, material and preparation method of the first metal wiring layer is only an exemplary introduction to the first metal wiring layer. In other embodiments of the present disclosure, the first metal wiring layer may exhibit other film structures, or use other materials, or use other methods to prepare.

Optionally, referring to FIG. 48, the insulating material layer 103 may include a planarized organic material layer 1032. The material of the planarized organic material layer 1032 may be an organic material, such as polyimide, epoxy resin, phenol resin, or other organic materials. In an embodiment of the present disclosure, the planarized organic material layer 1032 may be an organic material containing a photosensitizer. The planarized organic material layer 1032 can provide a planarized surface for the second metal wiring layer of the array substrate, and adjust the capacitance value between the first metal wiring layer and the second metal wiring layer.

Optionally, referring to FIG. 48, the insulating material layer 103 may further include a first passivation layer 1031. The first passivation layer 1031 is located between the planarized organic material layer 1032 and the first metal wiring layer 102 for protecting the first metal wiring layer 102. The material of the first passivation layer 1031 may be an inorganic dielectric material, such as silicon nitride, silicon oxide, or silicon oxynitride. In an embodiment of the present disclosure, the material of the first passivation layer 1031 may be silicon nitride.

Optionally, the wiring substrate and the array substrate of the present disclosure may further include a buffer layer 108, which is located between the base substrate 101 and the first metal wiring layer 102, and is used to eliminate the stress on the base substrate 101 exerted by the first metal wiring layer 102 and the insulating material layer 103. The material of the buffer layer 108 may be an inorganic dielectric material, such as silicon nitride, silicon oxide, or silicon oxynitride. In an embodiment of the present disclosure, the material of the buffer layer 108 may be silicon nitride.

Figure 49:
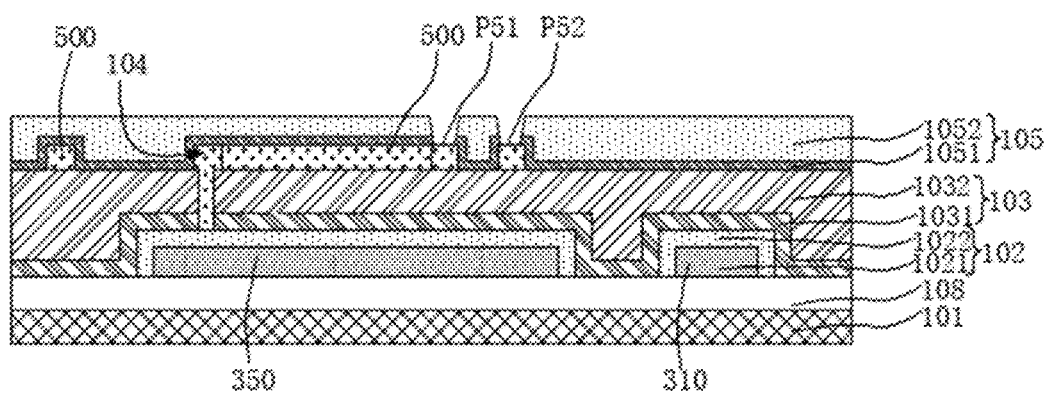
FIG. 49 is a schematic cross-sectional structure diagram of the array substrate at the position MN in FIG. 47 according to an embodiment of the present disclosure, wherein FIG. 49 does not show the functional device bound and connected to the device pad group.

Referring to FIG. 49, the array substrate provided in the present disclosure may include the wiring substrate provided in the present disclosure, and a second metal wiring layer 104 and an insulating protection layer 105 that are sequentially stacked on the surface of the wiring substrate, and also include functional devices (not shown in FIG. 49) and microchips (not shown in FIG. 49). The second metal wiring layer 104 is located on a side of the insulating material layer 103 away from the base substrate 101, and is connected to the first metal wiring layer 102 through a via hole located on the insulating material layer 103. It can be understood that, in some embodiments, part of the via holes on the insulating material layer 103 are not used to connect the first metal wiring layer 102 and the second metal wiring layer 104, and are filled by the insulating protection layer 105. In other words, in an array substrate, at least part of the via holes on the insulating material layer 103 may be filled with the insulating protection layer 105.

The second metal wiring layer 104 may include a second metal adhesion layer and a second copper metal layer stacked in sequence. The second metal adhesion layer is used to enhance the binding force between the second copper metal layer and the planarized organic material layer 1032. The material of the second metal adhesion layer can be an alloy material containing molybdenum, for example, a molybdenum-niobium alloy, a molybdenum-niobium-copper alloy, and the like. Further, the second metal wiring layer 104 may also include a second metal protection layer located on the side of the second copper metal layer away from the base substrate 101, so as to prevent the surface of the second copper metal layer from being oxidized, and to improve the binding force between the functional devices/the microchips and the second metal wiring layer 104. The material of the second metal protection layer may be an alloy containing nickel. For example, it may be a copper-nickel alloy or a copper-titanium alloy. In terms of pattern and function, the second metal wiring layer 104 may include a plurality of device pad groups for binding functional devices, a plurality of chip pad groups for binding microchips, and a plurality of connection leads 500. In an array substrate, the functional device is bound and connected with the device pad group, the microchip is bound and connected with the chip pad group, and the device pad group and the chip pad group are connected with the connection lead 500. At least part of the connection leads 500 is connected to the first metal wiring layer 102 through at least part of the via holes provided on the insulating material layer 103.

Optionally, at least part of the connection leads 500 may extend along the second direction D, or at least partly extend along the second direction D, so as to reduce the overlapping length between part of the connection leads 500 and part of the drive leads, and reduce the insulating material layer 103 fails locally thereby resulting in a risk of defective short circuit. Further, for some connection leads 500, especially for connection leads 500 that overlap with a plurality of different drive leads, when the connection leads 500 are bent, at least part of the lead sections of the connection leads 500 may extend along the second direction D, and the remaining lead sections may extend along the first direction.

Figure 31:
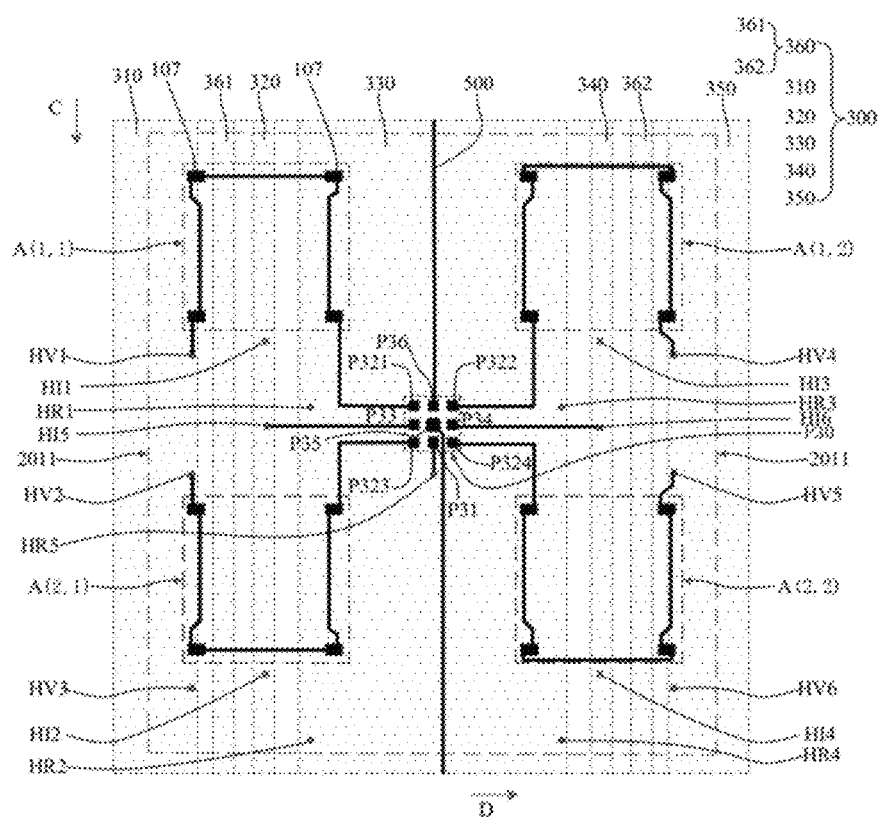
FIG. 31 is a schematic structure diagram of the fifteenth array substrate in a first control region according to an embodiment of the present disclosure, wherein, FIG. 31 only illustrates the drive leads, the relative position between at least part of the via holes provided on the insulating material layer, the connection leads (indicated by thick lines), the third pad group used to bind the third chip, and the functional devices in each device region.
Figure 32:
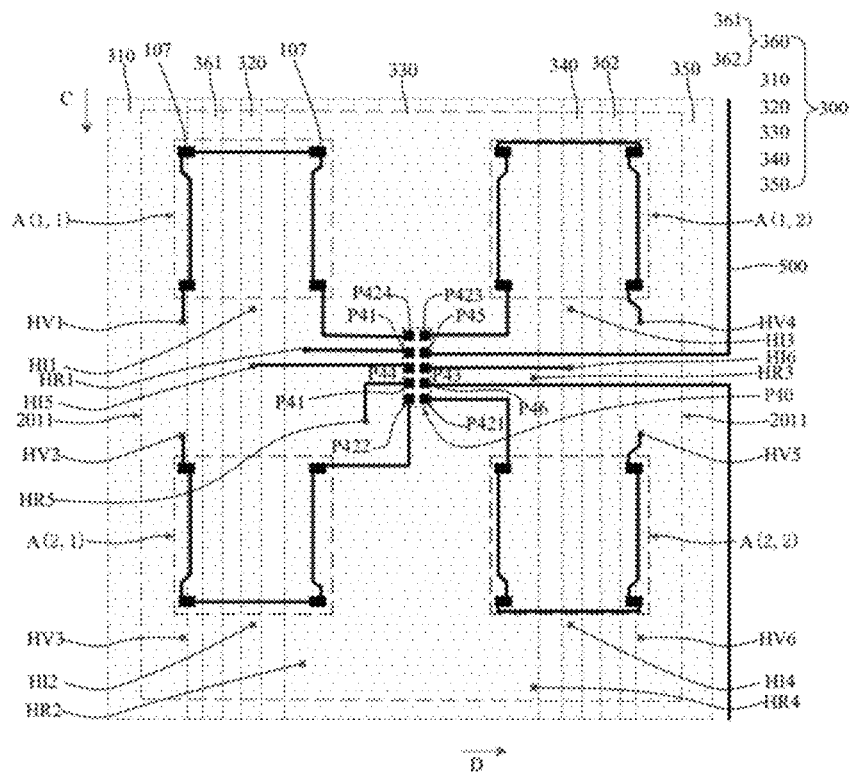
FIG. 32 is a schematic structure diagram of the sixteenth array substrate in a first control region according to an embodiment of the present disclosure, wherein, FIG. 32 only illustrates the drive leads, the relative position between at least part of the via holes provided on the insulating material layer, the connection leads (indicated by thick lines), the fourth pad group used to bind the fourth chip, and the functional devices in each device region.
Figure 33:
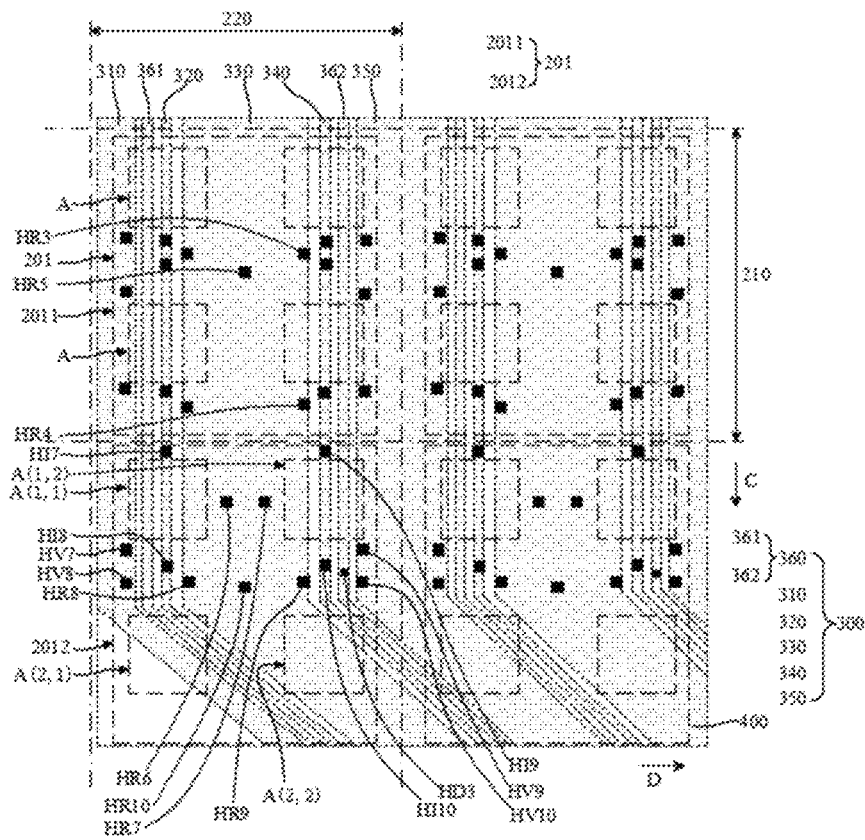
FIG. 33 is a schematic diagram of a partial structure of a wiring substrate according to an embodiment of the present disclosure, wherein FIG. 33 only illustrates the relative position between at least part of the via holes provided on the first metal wiring layer and the insulating material layer.

Exemplarily, in some embodiments, referring to FIGS. 31 to 33, the connection leads electrically connected to the first input lead or the second input lead may extend along the second direction without being bent, so that the extension direction of these connection leads 500 is perpendicular to the extension direction of the drive leads. Thus, the overlapping length between the connection leads and the reference voltage leads can be reduced, and the risk of short circuit failure can be reduced. Illustratively, in another embodiment of the present disclosure, referring to FIGS. 24 to 26, the connection lead connected to the first input lead or the second input lead may extend along the second direction to a position overlapping with the input lead. Then, it bends and extends along the first direction until overlapping with the input via hole. The lead sections extending along the second direction of these connection leads 500 share a small overlapping length with the reference voltage lead, so that the raising short circuit defect of the array substrate can be avoided. The lead sections extending along the first direction of these connection leads can overlap with the first input lead or the second input lead. Therefore, even if a short circuit occurs, it will not cause a change in the potential on these connection leads. That is, no short circuit defect will be exhibited.

The insulating protection layer 105 may include an organic protection layer 1052, and the organic protection layer 1052 may include an organic insulating material, for example, a resin material. Optionally, the organic protection layer 1052 may further include inorganic materials. For example, it may include inorganic particles dispersed in a resin. Exemplarily, the organic protection layer 1052 may be an organic-inorganic composite layer formed by cross-linking and curing acrylic monomers dispersed with nano titanium oxide particles.

Optionally, the insulating protection layer 105 may further include a second passivation layer 1051 between the organic protection layer 1052 and the second metal wiring layer 104. The second passivation layer 1051 is used to protect the second metal wiring layer 104, and its material may be an inorganic dielectric material, such as silicon nitride, silicon oxide or silicon oxynitride. In an embodiment of the present disclosure, the material of the second passivation layer 1051 may be silicon nitride.

The insulating protection layer 105 may have via holes exposing each sub-pad of the device pad group and each sub-pad of the chip pad group, so as to bind and connect the functional devices and the microchips on the array substrate.

In the present disclosure, the array substrate may be bound with functional devices and microchips, wherein the microchips are used to control each functional device. The functional device may be a current-driven element, such as a heating element, a light emitting element, a sound emitting element, etc., or an electronic element that realizes a sensing function, such as a photosensitive element, a heat-sensitive element, and the like. In some embodiments, the functional device may be a light emitting element, such as a Micro LED or a Mini LED. In other embodiments, part of the functional devices may be light emitting elements, and another part of the functional devices may be sensors, for example, temperature sensors, pressure sensors, infrared sensors, and other electronic elements.

Referring to FIG. 9, FIG. 15, FIG. 21, FIG. 27, and FIG. 33, the wiring substrate provided by the present disclosure has a plurality of control regions 201 distributed in an array, and the plurality of control regions 201 are arranged into a plurality of control region rows 210 and a plurality of control regions column 220. Each control region column 220 includes a plurality of control regions 201 arranged along the first direction C, and each control region row 210 includes a plurality of control regions 201 arranged along the second direction D. The second direction D is parallel to the plane where the wiring substrate is located and intersects with the first direction C.

Optionally, the included angle between the second direction D and the first direction C may be from 85° to 90°. In an embodiment of the present disclosure, the second direction D and the first direction C are perpendicular to each other.

Referring to FIG. 9, FIG. 15, FIG. 21, FIG. 27 and FIG. 33, each control region 201 includes four device regions A distributed in an array, and the device regions A are used for arranging functional devices 107 electrically connected to each other. In the array substrate of the present disclosure, a device control circuit may be provided in a device region A, and the device control circuit includes one functional device or a plurality of electrically connected functional devices. Exemplarily, referring to FIG. 11, in an embodiment of the present disclosure, one control circuit may include four light emitting elements connected in series in sequence. Further, referring to FIG. 47, the device control circuit may include a connection lead 500 located on the second metal wiring layer 104 and a device pad group P50 corresponding to the functional device (not shown in FIG. 47). The device pad group P50 is connected to the connection lead 500 and bound to the functional device. Illustratively, in an embodiment of the present disclosure, one device pad group P50 includes a first device sub-pad P51 and a second device sub-pad P52 arranged in a pair, wherein the first device sub-pad P51 and the second device sub-pad P52 are respectively used for binding and connecting with the positive and negative electrodes of the light emitting element.

In some embodiments, each device region A on the wiring substrate may be distributed in an array. The 2*2 four device regions A adjacent to each other can form a control region 201 of the present disclosure.

Referring to FIG. 10, FIG. 16, FIG. 22, FIG. 28 and FIG. 34, in one control region 201, the four device regions A can be numbered as the first device region A (1, 1), the second device region A (1, 2), the third device region A (2, 1), and the fourth device region A (2, 2). The first device region A (1, 1) is the device region A located in the first row along the first direction C and in the first column along the second direction D in the control region 201. The second device region A (1, 2) is the device region A located in the first row along the first direction C and in the second column along the second direction D in the control region 201. The third device region A (2, 1) is the device region A located in the second row along the first direction C and in the first column along the second direction D in the control region 201. The fourth device region A (2, 2) is the device region A located in the second row along the first direction C and in the second column along the second direction D in the control region 201.

Referring to FIGS. 9, 15, 21, 27 and 33, in the wiring substrate and the array substrate of the present disclosure, the first metal wiring layer 102 is provided with drive leads 300 extending along the first direction C. In each control region column 220, the drive leads 300 include at least a first power voltage lead 310, a first input lead 320, a reference voltage lead 330, a second input lead 340, and a second power voltage lead 350 that are arranged in sequence along the second direction D. The wiring substrate also has at least one signal channel extending along the first direction C, and each signal channel includes at least one control region column 220. In each signal channel, the drive lead 300 at least further includes one address lead 360. In some embodiments, one signal channel includes one control region column 220.

The first power voltage lead 310 and the second power voltage lead 350 may be the power voltage leads of the wiring substrate and the array substrate. The first input lead 320 and the second input lead 340 may be the input leads of the wiring substrate and the array substrate. The insulating material layer 103 may be provided with a power via hole exposing a partial region of the power voltage lead (first power voltage lead 310 or second power voltage lead 350), so that one end of the device control circuit is connected to the power voltage lead through the power via hole. The insulating material layer 103 may be provided with a reference via hole exposing a partial region of the reference voltage lead 330, and the reference voltage lead 330 supplies power to the reference voltage pin of the microchip through the reference via hole. The insulating material layer 103 may be provided with an input via hole exposing a partial region of the input lead (first input lead 320 or second input lead 340), so that part of the pins of the microchip are connected to the input lead through the input via hole.

Referring to FIG. 9, FIG. 15, FIG. 21, FIG. 27 and FIG. 33, the control region 201 may include the first control regions 2011. In one of the first control regions 2011, the insulating material layer 103 is provided with a first, second, third, fourth, fifth and sixth power via hole, a first, second, third and fourth input via hole, a first reference via hole HR1 and a second reference via hole HR2.

Referring to FIGS. 10, 16, 22, and 28, the first power via hole HV1, the second power via hole HV2, and the third power via hole HV3 are sequentially arranged along the first direction C and expose partial regions of the first power voltage lead 310. The first power via hole HV1 is located at the side of the first device region A(1,1) away from the third device region A(2,1) or located between the first device region A(1,1) and the third device region A(2,1). The second power via hole HV2 is located between the first device region A(1,1) and the third device region A(2,1). The third power via hole HV3 is located at the side of the third device region A(2,1) away from the first device region A(1,1). The fourth power via hole HV4, the fifth power via hole HV5, and the sixth power via hole HV6 are sequentially arranged along the first direction C and expose partial regions of the second power voltage lead 350. The fourth power via hole HV4 is located at the side of the second device region A(1,2) away from the fourth device region A(2,2) or located between the second device region A(1,2) and the fourth device region A(2, 2). The fifth power via hole HV5 is located between the second device region A (1,2) and the fourth device region A (2, 2). The sixth power via hole HV6 is located at a side of the fourth device region A (2, 2) away from the second device region A (1,2).

In the wiring substrate, the specific positions of the first power via hole HV1 and the fourth power via hole HV4 can be determined in advance according to the arrangement of the device control circuit in the device region A. The device control circuit in the device region A may have a first end and a second end, wherein the second end is used for electrical connection with the microchip, and the first end is used for connection with the power voltage lead through the connection lead overlapping with the power via hole. Under the design principle of minimizing the length of the connection lead in the device control circuit, the first end of the device control circuit can be close to a vertex of the device region, and the vertex is located at a side along the second direction of the device region away from the reference voltage lead. In the first device region A (1, 1) and the second device region A (1,2), when along the first direction the vertex is located at a side of the device region in the first direction, the first power via hole HV1 may be located at the side of the first device region A (1, 1) close to the third device region A (2, 1), and the fourth power via hole HV4 may be located at a side of the second device region A (1,2) close to the fourth device region A(2,2). In the first device region A (1, 1) and the second device region A (1,2), when along the first direction the vertex is located at a side of the device region in the opposite direction of the first direction, the first power via hole HV1 may be located at the side of the first device region A(1,1) away from the third device region A(2,1), and the fourth power via hole HV4 may be located at a side of the second device region A(1, 2) away from the fourth device region A (2, 2).

In some embodiments, the device region A is provided with N*N functional devices 107 arranged in an array and connected in series in sequence. When N is an even number not less than 2, the first power via hole HV1 may be located at the side of the first device region A (1, 1) close to the third device region A (2, 1), and the fourth power via hole HV4 may located at the side of the second device region A (1,2) close to the fourth device region A (2, 2). When N is an odd number not less than 2, the first power via hole HV1 may be located at the side of the first device region A (1, 1) away from the third device region A (2, 1), and the fourth power via hole HV4 may located at the side of the second device region A (1,2) away from the fourth device region A (2, 2). In this way, the arrangement of the connection leads 500 in the first device region A (1, 1) and the second device region A (1,2) can be simplified as much as possible. It should be understood that, since the second power via hole HV2 and the third power via hole HV3 are located on respective sides of the third device region A (2, 1), the device control circuit in the third device region A (2, 1) may be connected to one of the second power via hole HV2 and the third power via hole HV3 according to the wiring requirements of the connection lead 500. Correspondingly, since the fifth power via hole HV5 and the sixth power via hole HV6 are located at respective sides of the fourth device region A (2, 2), the device control circuit in the fourth device region A (2, 2) can be connected to one of the fifth power via hole HV5 and the sixth power via hole HV6 based on the wiring requirements of the connection lead 500.

In some other embodiments, the wiring substrate of the present disclosure is provided with two first power via holes HV1 and two fourth power via holes HV4 in the first control region 2011. The two first power via holes HV1 are respectively located at two sides of the first device region A (1, 1), and the two fourth power via holes HV4 are respectively located at two sides of the second device region A (1,2). In this way, the array substrate can select, according to the wiring requirements of the second metal wiring layer, one of the first power via holes HV1 to realize the electrical connection between the device control circuit in the first device region A (1, 1) and the first power voltage lead 310, and one of the fourth power via holes HV4 to realize the electrical connection between the device control circuit in the second device region A (1,2) and the fifth power voltage lead 350.

The first input via hole HI1 and the second input via hole HI2 respectively expose a partial region of the first input lead 320. The first input via hole HI1 is located between the edge of the first device region A(1,1) away from the third device region A(2,1)) and the edge of the third device region A(2,1) close to the first device region A(1,1). The second input via hole HI2 is located at a side of the third device region A(2,1) away from the first device region A(1,1). The third input via hole HI3 and the fourth input via hole HI4 respectively expose a partial region of the second input lead 340. The third input via hole HI3 is located between the edge of the second device region A(1,2) away from the fourth device region A(2,2) and the edge of the fourth device region A(2,2) close to the second device region A(1, 2). The fourth input via hole HI4 is located at the side of the fourth device region A (2, 2) away from the second device region A (1,2).

The first reference via hole HR1 and the second reference via hole HR2 respectively expose a partial region of the reference voltage lead 330. Along the first direction C, the first reference via hole HR1 is located between the first device region A(1,1) and the third device region A (2, 1), and the second reference via hole HR2 is located at the side of the third device region A (2, 1) away from the first device region A (1, 1).

In any signal channel region, the insulating material layer 103 is also provided with at least one address via hole that exposes a partial region of the address lead 360.

Figure 50:
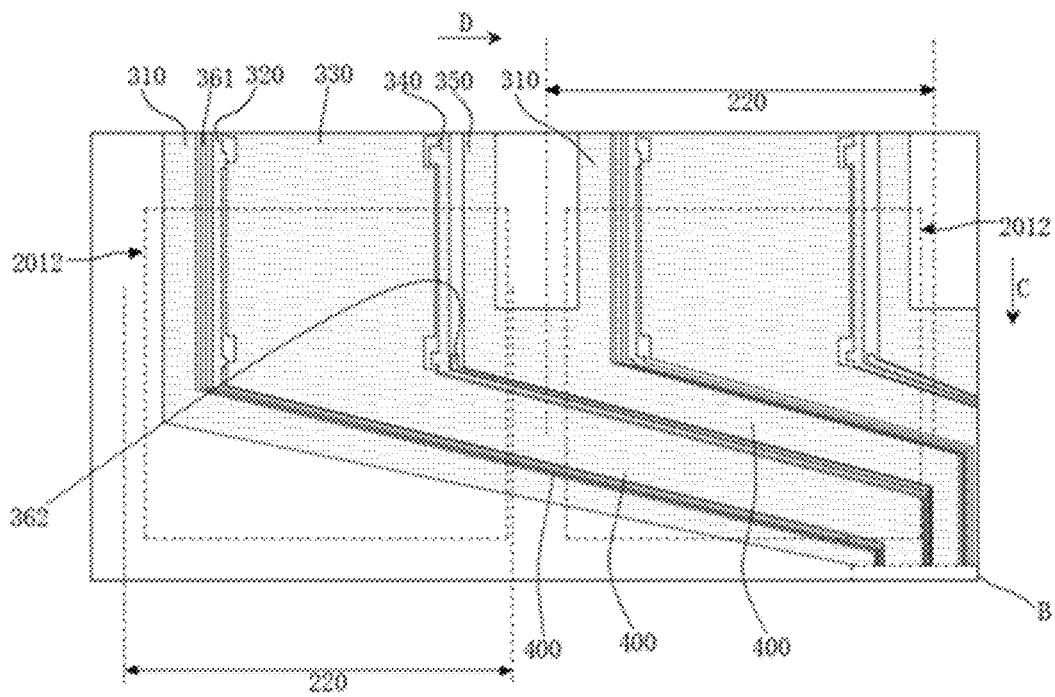
FIG. 50 is a schematic structure diagram of the first metal wiring layer at an end close to the binding region according to an embodiment of the present disclosure.

Optionally, referring to FIG. 50, the wiring substrate may further have a fan-out region and a binding region B, wherein the first metal wiring layer 102 is provided in the fan-out region with fan-out leads 400 each connected to a respective one of the drive leads 300. The binding region B is provided with binding pads each connected to a respective one of the fan-out leads 400. Referring to FIG. 50, in an embodiment of the present disclosure, the fan-out lead 400 and the binding pad are located at the side along the first direction C of the corresponding drive lead 300. That is, along the first direction C, the binding region B is located at the terminating end of the wiring substrate. In another embodiment of the present disclosure, the drive lead is located at a side along the first direction C of the corresponding fan-out lead and the binding pad. That is, along the first direction C, the binding region B is located at the starting end of the wiring substrate.

In some embodiments, the binding region B may be disposed close to an edge of the wiring substrate. For example, the binding region B is located at an edge of the wiring substrate in the first direction C or an edge in the opposite direction of the first direction C. The wiring substrate and the array substrate of the present disclosure may be provided with at least one row of binding pads in the binding region B. Further, in the same row of binding pads, each binding pad may be arranged along the second direction D. In an embodiment of the present disclosure, each binding pad is arranged in a row along the second direction D, and is arranged in a one-to-one correspondence with each drive lead 300.

Optionally, two binding pads connected correspondingly to two adjacent power voltage leads in two adjacent signal channels are connected to each other to form a whole. Furthermore, the two fan-out leads 400 connected to two adjacent power voltage leads may also be connected to each other to form a whole. This is equivalent to that two adjacent power voltage leads are connected to the same binding pad through the same fan-out lead 400. Optionally, the binding region is provided with a plurality of binding electrodes arranged at equal intervals along the second direction D, and each binding electrode has the same width. One or more adjacent binding electrodes may be connected to the same fan-out lead, acting as a whole as a binding pad connected to the binding lead. As the number of binding electrodes included in a binding pad becomes larger, the width of the binding pad becomes larger.

The wiring substrate provided by the present disclosure can be applied to at least two different microchips to prepare different array substrates with different microchips. These array substrates include the wiring substrate provided by the present disclosure, and the second metal wiring layer 104 and the insulating protection layer 105 laminated on the side of the insulating material layer 103 of the wiring substrate away from the base substrate 101, and are further bound with microchips and functional devices.

Optionally, in the array substrate based on the wiring substrate of the present disclosure, in the first control region 2011, one of the second power via hole HV2 and the third power via hole HV3 is used to overlap with the connection lead 500, so that the device control circuit in the third device region A (2, 1) is connected to the first power voltage lead 310. The other one of the second power via hole HV2 and the third power via hole HV3 may not overlap with any second metal wiring layer 104 and is filled with the insulating protection layer 105. One of the fifth power via hole HV5 and the sixth power via hole HV6 is used to overlap with the connection lead 500, so that the device control circuit in the fourth device region A (2, 2) is connected to the second power voltage lead 350. The other of the fifth power via hole HV5 and the sixth power via hole HV6 may not overlap with any second metal wiring layer 104, and is filled with the insulating protection layer 105.

Figure 11:
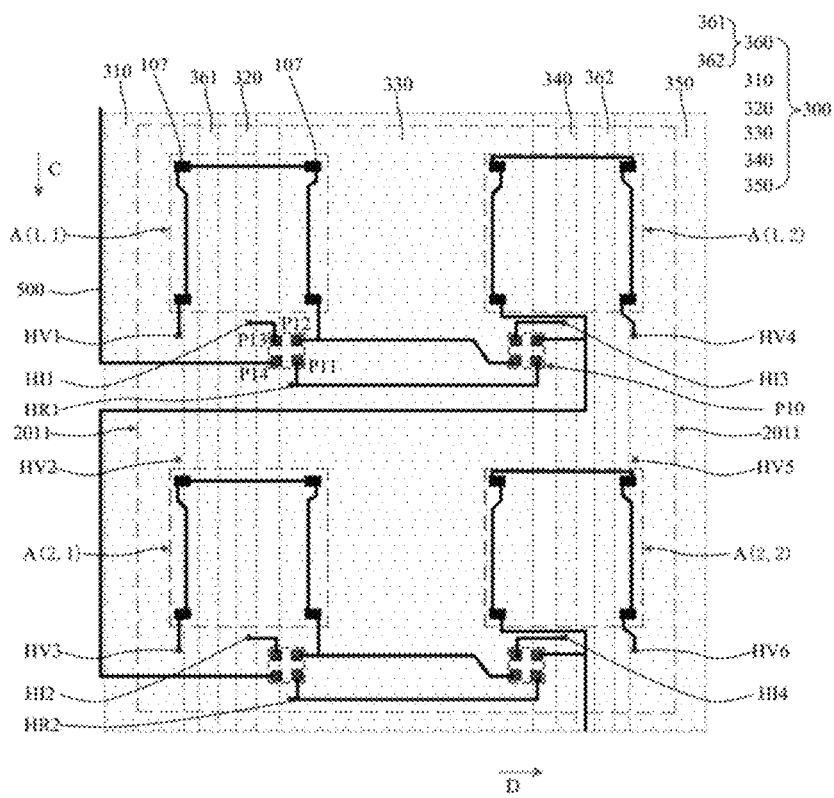
FIG. 11 is a schematic structure diagram of the first array substrate in a first control region according to an embodiment of the present disclosure, wherein, FIG. 11 only illustrates the drive leads, the relative position between at least part of the via holes provided on the insulating material layer, the connection leads (indicated by thick lines), the first pad group used to bind the first chip, and the functional devices in each device region.

The wiring substrate provided in the present disclosure can be used to prepare an array substrate with a first chip. For example, it can be used to prepare a first array substrate. The base substrate 101, the first metal wiring layer 102 and the insulating material layer 103 of the first array substrate form the wiring substrate in an embodiment. FIG. 11 shows a schematic structure diagram of a first array substrate in a first control region 2011. FIG. 11 only shows the drive leads 300, the positions of at least part of the via holes provided on the insulating material layer 103, the connection leads 500 (represented by thick lines), the first pad group P10 for binding the first chip, the functional devices 107 in each device region A, and the like.

Referring to FIG. 11, the first array substrate may be provided with in a first control region 2011 four first pad groups P10 each corresponding to a respective one of the four device regions A. Each of the first pad groups P10 is located at a side along the first direction C of the corresponding device region A. The first pad group P10 corresponding to the second device region A(1,2) is located at a side along the second direction D of the first pad group P10 corresponding to the first device region A(1,1). The first pad group P10 corresponding to the fourth device region A (2, 2) is located at a side along the second direction D of the first pad group P10 corresponding to the third device region A (2, 1).

In the first control region 2011 of the first array substrate, the reference voltage sub-pad P11 of the first pad group P10 corresponding to the first device region A(1,1) and the reference voltage sub-pad P11 of the first pad group P10 corresponding to the second device region A(1,2) are connected with the reference voltage lead 330 through the connection lead 500 that overlaps with the first reference via hole HR1.

The reference voltage sub-pad P11 of the first pad group P10 corresponding to the third device region A (2, 1) and the reference voltage sub-pad P11 of the first pad group P10 corresponding to the fourth device region A (2, 2) are connected with the reference voltage lead 330 through the connection lead 500 overlapping with the second reference via hole HR2. This can enable the reference voltage sub-pad P11 of each first pad group P10 to be electrically connected with the reference voltage lead 330. Further, in the first control region 2011 of the first array substrate, orthographic projections on the wiring layer 102 of the connection lead 500 overlapping with the first reference via hole HR1 and the connection lead 500 overlapping with the second reference via hole HR2 are not exceeding the range of the reference voltage lead 330. In this way, even if the layout failure of the insulating material layer 103 causes the connection leads 500 and the reference voltage lead 330 to be short-circuited, the voltage on these leads will not be changed to cause defects.

In a signal channel of the first array substrate, each device region A can be numbered sequentially. The first pad group P10 corresponding to the device region A with a serial number of 1 can be located at an end of the signal channel along its extension direction. For example, it is located at the end close to the binding region B or at the end far away from the binding region B. In the signal channel, the first pad group P10 corresponding to each device region A can be numbered row by row and column by column according to the Z shape, or numbered row by row and column by column according to the S shape, or numbered row by row and column by column according to the N shape, or numbered row by row and column by column according to the U shape or inverted U shape. In the present disclosure, the row direction is a direction along the second direction D or its opposite direction, and the column direction is a direction along the first direction C or its opposite direction. In a signal channel, the first pad group P10 corresponding to each device region A can be cascaded in order according to the serial number, wherein the first pad group P10 and the second input sub-pad P14 corresponding to the device region A with a serial number of 1 are connected to one of the address leads 360 through a connection lead 50 that overlaps with the address via hole. The output sub-pad P12 of the first pad group P10 corresponding to the device region A with a serial number of (n−1) and the second input sub-pad P14 of the first pad group P10 corresponding to the device region A with a serial number of n are connected through the connection lead 500, wherein n is an integer greater than 1 and not greater than the number of device regions in one signal channel.

For example, in an embodiment of the first array substrate, the first pad group P10 corresponding to the first device region A (1, 1), the first pad group P10 corresponding to the second device region A (1,2), the first pad group P10 corresponding to the third device region A (2, 1), and the first pad group P10 corresponding to the fourth device region A (2, 2) are sequentially cascaded. The output sub-pad P12 of the first pad group P10 corresponding to the first device region A (1, 1) is connected with the second input sub-pad P14 of the first pad group P10 corresponding to the second device region A (1,2). The output sub-pad P12 of the first pad group P10 corresponding to the second device region A(1, 2) is connected with the second input sub-pad P14 of the first pad group P10 corresponding to the third device region A(2,1). The output sub-pad P12 of the first pad group P10 corresponding to the third device region A (2, 1) is connected with the second input sub-pad P14 of the first pad group corresponding to the fourth device region A (2, 2). In two adjacent control regions 201, the output sub-pad P12 of the first pad group P10 corresponding to the fourth device region A (2, 2) located in the control region 201 at a side along the opposite direction of the first direction C is connected with the second input sub-pad P14 of the first pad group P10 corresponding to the first device region A(1, 1) located in the control region 201 at a side along the first direction C.

Figure 47:
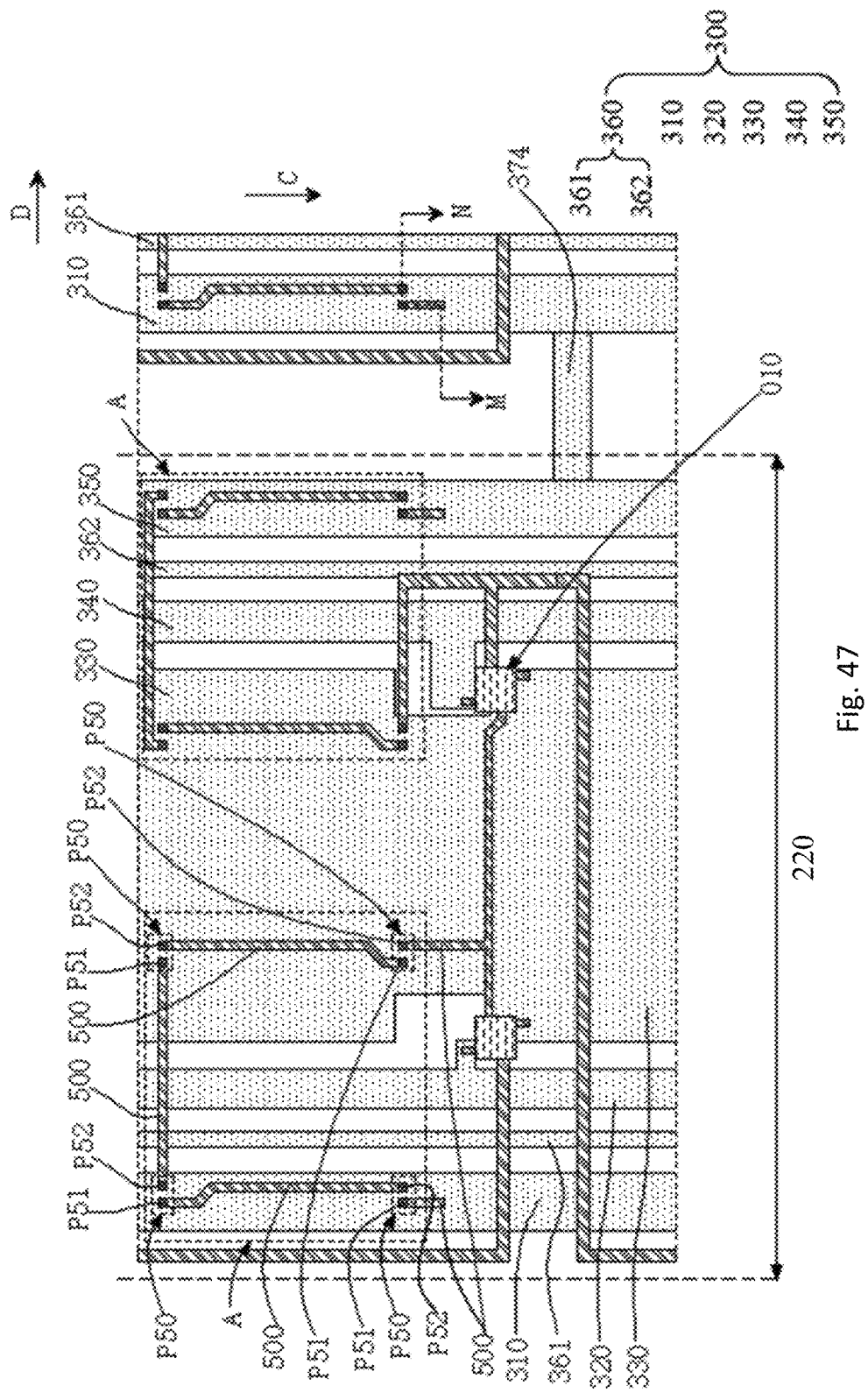
FIG. 47 is a schematic diagram of a partial structure of an array substrate according to an embodiment of the present disclosure, wherein FIG. 47 does not show the functional device that is bound and connected to the device pad group.

Referring to FIG. 11, the first array substrate is provided with a device control circuit in the device region A, wherein the first end of the device control circuit and the power voltage lead are connected through a connection lead 500 that overlaps with the power via hole, and the second end of the device control circuit is connected to the output sub-pad P12 of the first pad group P10 corresponding to the device region A through the connection lead 500. Referring to FIG. 47, the first end of the device control circuit may be the first device sub-pad P51 in a device pad group P50 located on the power voltage lead, and the second end of the device control circuit may be the second device sub-pad P52 in a device pad group P50 close to the corresponding first chip 010 in the first direction C and close to the axis of the reference voltage lead 330 in the second direction D. In this way, the length of the connection lead 500 for connecting the output pin 012 of the first chip 010 and the second end of the device control circuit can be reduced as much as possible, and the overlapping length between these connection leads 500 and the reference voltage lead 330 can be reduced. Thus, the risk of short circuits between these connection leads 500 and the reference voltage leads 330 is reduced.

For example, in an embodiment of the present disclosure, four light emitting elements arranged in series and arranged in a 2*2 array are disposed in a device region A. The first light emitting element and the power voltage lead are connected through the connection lead 500 overlapping with the power via hole. The fourth light emitting element is connected to the output sub-pad P12 of the first pad group P10 through the connection lead 500. The three connection leads 500 for connecting the four light emitting elements in series are distributed in a notch shape as a whole with the opening facing toward the first direction C. In an embodiment, in the first control region 2011, the first power via hole HV1 may be disposed at the side of the first device region A(1, 1) in the first direction C, and the fourth power via hole HV4 may be disposed at the side of the second device region A(1,2) in the first direction C. The first end of the device control circuit in the first device region A (1, 1) and the first power voltage lead 310 are connected through a connection lead 500 that overlaps with the first power via hole HV1. The first end of the device control circuit in the second device region A(1, 2) and the second power voltage lead 350 are connected by a connection lead 500 that overlaps with the fourth power via hole HV4. The first end of the device control circuit in the third device region A (2, 1) and the first power voltage lead 310 are connected through a connection lead 500 that overlaps with the third power via hole HV3. The first end of the device control circuit in the fourth device region A (2, 2) and the second power voltage lead 350 are connected by a connection lead 500 that overlaps with the sixth power via hole HV6.

In the first control region 2011, the first input sub-pad P13 of the first pad group P10 corresponding to the first device region A(1,1) is connected with the first input lead 320 through a connection lead 500 overlapping with the first input via hole HI1. The first input sub-pad P13 of the first pad group P10 corresponding to the third device region A (2, 1) is connected with the first input lead 320 through a connection lead 500 overlapping with the second input via hole HI2. The first input sub-pad P13 of the first pad group P10 corresponding to the second device region A(1,2) is connected with the second input lead 340 through the connection lead 500 overlapping with the third input via hole HI3. The first input sub-pad P13 of the first pad group P10 corresponding to the fourth device region A (2, 2) is connected with the second input lead 340 through the connection lead 500 overlapping with the fourth input via hole HI4.

In the first array substrate, the first power voltage lead 310 and the second power voltage lead 350 can be used to load the power voltage VLED for driving the device control circuit. For example, they can load the power voltage VLED for driving each light emitting element in the device control circuit to emit light. The reference voltage lead 330 may be used to load the reference voltage GND. One of the first input lead 320 and the second input lead 340 may be used to load the first input signal Pwr. In a signal channel, at least one address lead 360 can be used to load the second input signal Di. In this way, under the control of each drive lead 300, each first chip 010 and functional device 107 can operate normally.

Figure 39:
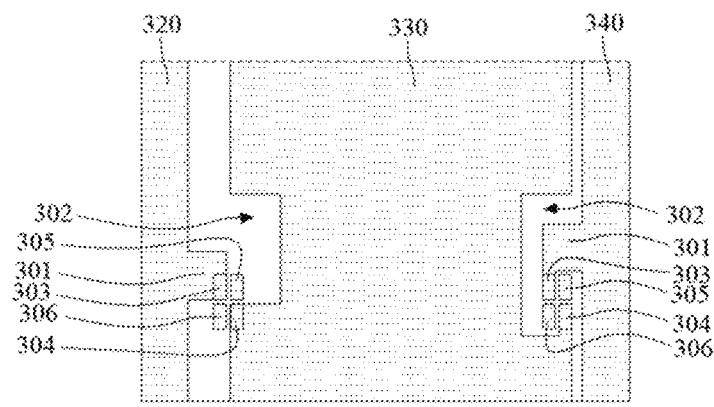
FIG. 39 is a schematic diagram of a partial structure of an input lead and a reference voltage lead in a wiring substrate according to an embodiment of the present disclosure.

In some embodiments of the present disclosure, referring to FIG. 39, among the input leads (for example, the first input lead 320 and the second input lead 340) and the reference voltage lead 330 adjacent to the wiring substrate, the input lead is provided with a protruding part 301 that protrudes toward a side of the reference voltage lead 330, and the reference voltage lead 330 is provided with an accommodating notch 302 corresponding to the protruding part 301 of the reference voltage lead 330 and capable of accommodating the protruding part 301. Correspondingly, in the first array substrate, the first pad group P10 can be arranged close to the protruding part 301, so that the orthographic projection on the first metal wiring layer 102 of the first input sub-pad P13 of the first pad group P10 is located on the protruding part 301 of the input lead, and the orthographic projection on the first metal wiring layer 102 of the reference voltage sub-pad P11 of the first pad group P10 is located on the reference voltage lead 330. In other words, referring to FIG. 39, at least part of the protruding part 301 of the input lead may serve as the first support metal part 303, and the first support metal part 303 may completely overlap with the input sub-pad of the first pad group P10. At least part of the reference voltage lead 330 close to the accommodating notch 302 may serve as the second support metal part 304, and the second support metal part 304 may completely overlap with the reference voltage sub-pad P11 of the first pad group P10. The connection lead 500 connected to the reference voltage sub-pad P11 and overlapped with the reference via hole may completely overlap with the reference voltage lead 330. In this way, the risk of short-circuit failure caused by the insulation failure of the insulating material layer 103 is further reduced.

Further, referring to FIG. 39, in the wiring substrate, the first metal wiring layer 102 may also be provided with a third support metal part 305 and a fourth support metal part 306, both of which are located between the input lead and the reference voltage lead 330, and insulated from the input lead and the reference voltage lead 330. The orthographic projection of the third support metal part 305 on the base substrate 101 coincides with the orthographic projection of the output sub-pad P12 on the base substrate 101. The orthographic projection of the second support metal part 304 on the base substrate 101 coincides with the orthographic projection of the second input sub-pad P14 on the base substrate 101. In this way, the distance between each sub-pad of the first pad group P10 and the base substrate 101 can be substantially the same, which facilitates the binding of the first chip 010.

Figure 12:
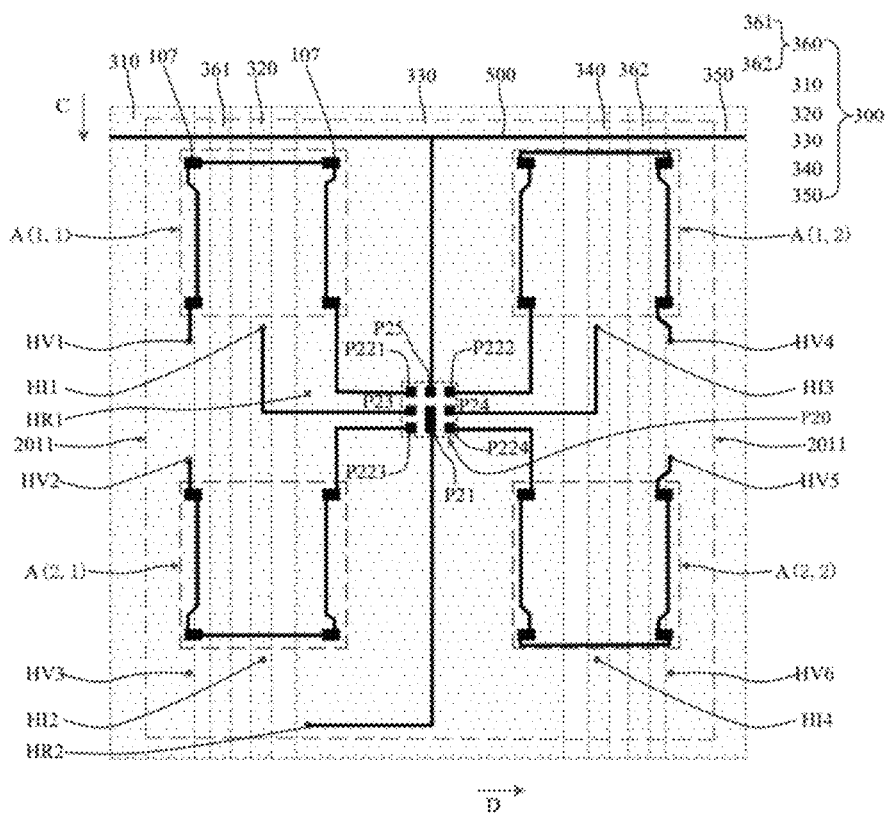
FIG. 12 is a schematic structure diagram of the second array substrate in a first control region according to an embodiment of the present disclosure, wherein, FIG. 12 only illustrates the drive leads, the relative position between at least part of the via holes provided on the insulating material layer, the connection leads (indicated by thick lines), the second pad group used to bind the second chip, and the functional devices in each device region.

The wiring substrate provided in the present disclosure can also be used to prepare an array substrate with a second chip 020. For example, it can be used to prepare a second array substrate. The base substrate 101, the first metal wiring layer 102 and the insulating material layer 103 of the second array substrate form the wiring substrate in an embodiment. FIG. 12 shows a schematic structural diagram of a second array substrate in a first control region 2011. FIG. 12 only shows the drive leads 300, the positions of the via holes provided on the insulating material layer 103, the connection leads 500 (indicated by thick lines), the second pad group P20 for binding the second chip 020, the functional devices 107 in each device region A, and so on.

Referring to FIG. 12, the second array substrate may be provided in a first control region 2011 with a second pad group P20 for binding the second chip 020, and the second pad group P20 may be located between the four device regions A in the first control region 2011. In other words, in one first control region 2011, along the first direction C, the second pad group P20 is located between the first device region A (1, 1) and the third device region A (2, 1). Along the second direction D, the second pad group P20 is located between the first device region A (1, 1) and the second device region A (1,2). The reference voltage sub-pad P21 of the second pad group P20 is located at a side along the first direction C of the address sub-pad P25 of the second pad group P20, so as to ensure that the connection lead 500 connected with the reference voltage sub-pad P21 of the second pad group P20 can extend to overlap with the second reference via hole HR2, and the connection lead 500 completely overlaps with the reference voltage lead 330. In this way, when the connection lead 500 and the reference voltage lead 330 are short-circuited, defects can be avoided on the second array substrate. One of the chip power sub-pad P23 and the drive data sub-pad P24 is connected to the first input lead 320 through a connection lead 500 overlapping with the first input via hole HI1. The other of the chip power sub-pad P23 and the drive data sub-pad P24 is connected to the second input lead 340 through the connection lead 500 overlapping with the third input via hole HI3. The four input sub-pads are respectively connected to the second ends of the device control circuits in the four device regions through the connection leads 500.

Optionally, referring to FIG. 12, in the second array substrate, the chip power sub-pad P23 of the second pad group P20 is located at a side along the opposite side of the second direction D of the drive data sub-pad P24. In this way, the chip power sub-pad P23 of the second pad group P20 and the first input lead 320 can be connected through the connection lead 500 overlapping with the first input via hole HI1. The drive data sub-pad P24 of the second pad group P20 and the second input lead 340 may be connected by a connection lead 500 overlapping with the third input via hole HI3. The address sub-pad P25 of the second pad group P20 and the address lead 360 may be connected by a connection lead 500 that overlaps with the address via hole.

With reference to FIG. 12, in the first control region 2011 of the second array substrate, the first end of the device control circuit in the first device region A (1, 1) and the first power voltage lead 310 are connected through the connection lead 500 overlapping with the first power via hole HV1. The second end of the device control circuit in the first device region A(1,1) and the first output sub-pad P221 of the second pad group P20 are connected by the connection lead 500. The first end of the device control circuit in the second device region A (1, 2) and the second power voltage lead 350 are connected through the connection lead 500 overlapping with the fourth power via hole HV4. The second end of the device control circuit in the second device region A (1,2) and the second output sub-pad P222 of the second pad group P20 are connected by the connection lead 500. The first end of the device control circuit in the third device region A (2, 1) and the first power voltage lead 310 are connected through a connection lead 500 that overlaps with the second power via hole HV2 or the third power via hole HV3. The second end of the device control circuit in the third device region A (2, 1) and the third output sub-pad P223 of the second pad group P20 are connected by the connection lead 500. The first end of the device control circuit in the fourth device region A (2, 2) and the second power voltage lead 320 are connected through the connection lead 500 that overlaps with the fifth power via hole HV5 or the sixth power via hole HV6. The second end of the device control circuit in the fourth device region A (2, 2) and the fourth output sub-pad P224 of the second pad group P20 are connected by the connection lead 500. The first end of the device control circuit may be a sub-pad in a device pad group P50 located on the power voltage lead, and the second end of the device control circuit may a sub-pad in a device pad group P50 close to the second chip 020 in the first direction C and close to the axis of the reference voltage lead 330 in the second direction D. This can minimize the length of the connection lead 500 between the output pin 012 of the second chip 020 and the second end of the device control circuit, and reduce the overlapping length between these connection leads 500 and the reference voltage lead 330, thereby reducing the risk of bad short circuit between these connection leads 500 and the reference voltage lead 330.

Optionally, in at least part of the control regions, the device control circuit in the first device region A (1, 1) has connection leads for connecting with each functional device, and the device control circuit in the third device region A (2, 1) has connection leads for connecting with each functional device. The connection leads in the first device region A (1, 1) and the connection leads in the third device region A (2, 1) are symmetrical about a symmetry axis, and the symmetry axis is parallel to the second direction. The device control circuit in the second device region A (1,2) has connection leads to connect each functional device, and the device control circuit in the fourth device region A (2, 2) has connection leads to connect each functional device. The connection leads in the second device region A (1, 2) and the connection leads in the fourth device region A (2, 2) are symmetrical about a symmetry axis, and the symmetry axis is parallel to the second direction.

Illustratively, in an embodiment of the present disclosure, four light emitting elements arranged in series and in a 2*2 array are provided in one device region A. The first light emitting element and the power voltage lead are connected through a connection lead 500 overlapping with the power via hole. The fourth light emitting element is connected to the output sub-pad P12 of the second pad group P20 through the connection lead 500. In the first device region A (1, 1) and the second device region A (1,2), the three connection leads 500 for connecting the four light emitting elements in series are distributed as a whole in a notch shape with the opening facing toward the first direction C. In the third device region A (2, 1) and the fourth device region A (2, 2), the three connection leads 500 for connecting the four light emitting elements in series are formed as a whole in a notch shape with the opening facing toward the opposite direction of the first direction C. In an embodiment, in the first control region 2011, the first power via hole HV1 may be disposed at the side of the first device region A(1, 1) in the first direction C, and the fourth power via hole HV4 may be disposed at the side along the first direction C of the second device region A(1,2). The first end of the device control circuit in the first device region A (1, 1) and the first power voltage lead 310 are connected through a connection lead 500 that overlaps with the first power via hole HV1. The first end of the device control circuit in the third device region A (2, 1) and the first power voltage lead 310 are connected through a connection lead 500 that overlaps with the second power via hole HV2. The first end of the device control circuit in the second device region A(1, 2) and the second power voltage lead 350 are connected by a connection lead 500 that overlaps with the fourth power via hole HV4. The first end of the device control circuit in the fourth device region A (2, 2) and the second power voltage lead 350 are connected through a connection lead 500 that overlaps with the fifth power via hole HV5.

In the second array substrate, the first power voltage lead 310 and the second power voltage lead 350 can be used to load the power voltage VLED for driving the device control circuit. For example, they can load the power voltage VLED for driving each light emitting element in the device control circuit to emit light. The reference voltage lead 330 may be used to load the reference voltage GND. The first input lead 320 may be used to load the chip operating voltage VCC, and the second input lead 340 may be used to load the drive data Data. At least part of the address leads 360 can be used to load a strobe signal. In this way, under the control of each drive lead 300, each second chip 020 and functional device 107 can operate normally.

Optionally, in the first control region 2011 of the second array substrate, the first reference via hole HR1, the second input via hole HI2, and the fourth input via hole HI4 may not overlap with any second metal wiring layer 104, and filled by the insulating protection layer 105.

Figure 13:
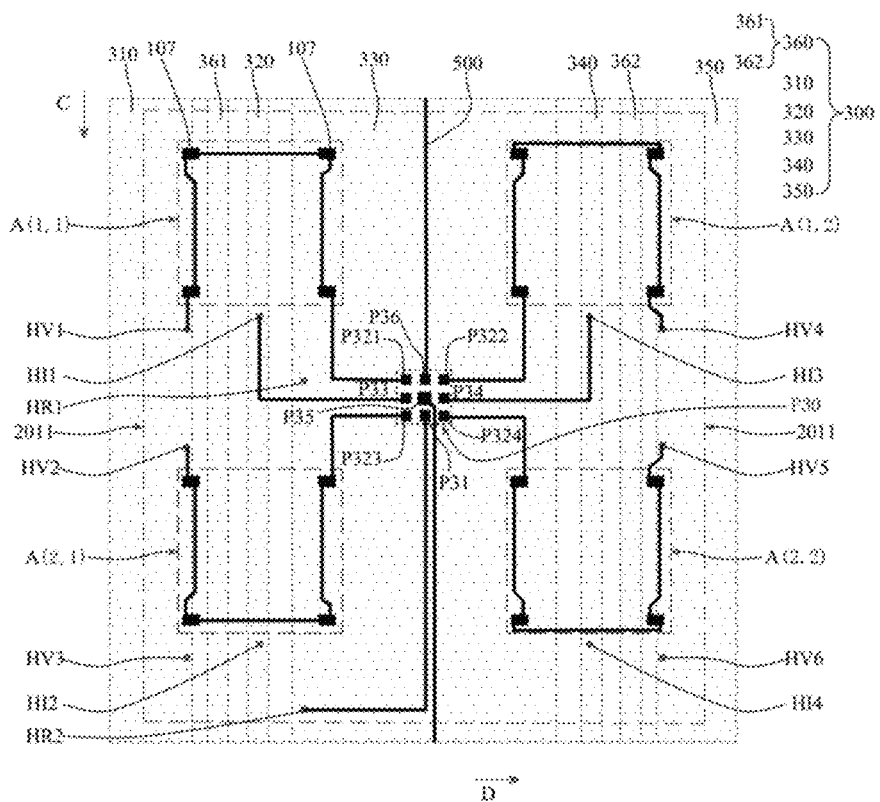
FIG. 13 is a schematic structure diagram of the third array substrate in a first control region according to an embodiment of the present disclosure, wherein, FIG. 13 only illustrates the drive leads, the relative positions between at least part of the via holes provided on the insulating material layer, the connection leads (indicated by thick lines), the third pad group used to bind the third chip, and the functional devices in each device region.

The wiring substrate provided in the present disclosure can be used to prepare an array substrate with a third chip 030. For example, it can be used to prepare a third array substrate. The base substrate 101, the first metal wiring layer 102 and the insulating material layer 103 of the third array substrate form the wiring substrate in an embodiment. Exemplarily, FIG. 13 shows a schematic structural diagram of a third array substrate in a first control region 2011. FIG. 13 only shows the drive leads 300, the positions of the via holes provided on the insulating material layer 103, the connection lead 500 (indicated by thick lines), the third pad group P30 for binding the third chip 030, the functional device 107 in each device region A, and the like.

Referring to FIG. 13, the third array substrate may be provided in a first control region 2011 with a third pad group P30 for binding the third chip 030, and the third pad group P30 may be located between the four device regions A in the first control region 2011. In other words, in a first control region 2011, along the first direction C, the third pad group P30 is located between the first device region A (1, 1) and the third device region A (2, 1). In the second direction D, the third pad group P30 is located between the first device region A (1, 1) and the second device region A (1,2). Optionally, the reference voltage sub-pad P31 of the third pad group P30 is located at the side along the first direction C of the relay signal sub-pad P36 of the third pad group P30, which is more beneficial to allow the connection lead 500 connected to the reference voltage sub-pad P31 of the third pad group P30 extending to overlap with the second reference via hole HR2, and the connection lead 500 completely overlaps with the reference voltage lead 330. In this way, when the connection lead 500 and the reference voltage lead 330 are short-circuited, defects can be avoided on the third array substrate.

In a first control region 2011 of the third array substrate, the reference voltage sub-pad P31 and the reference voltage lead 330 may be connected by a connection lead 500 overlapping with the second reference via hole HR2. One of the chip power sub-pad P33 and the drive data sub-pad P34 is connected with the first input lead 320 through the connection lead 500 overlapping with the first input via hole HI1, and the other of the chip power sub-pad P33 and the drive data sub-pad P34 is connected to the second input lead 340 through the connection lead 500 overlapping with the third input via hole HI3.

Exemplarily, referring to FIG. 13, in the third array substrate, the chip power sub-pad P33 of the third pad group P30 is located at the side along the opposite direction of the second direction D of the drive data sub-pad P34. In this way, the chip power sub-pad P33 of the third pad group P30 and the first input lead 320 are connected through the connection lead 500 overlapping with the first input via hole HI1. The drive data sub-pad P34 of the third pad group P30 and the second input lead 340 are connected by the connection lead 500 overlapping with the third input via hole HI3.

Referring to FIG. 13, in the first control region 2011 of the third array substrate, the first end of the device control circuit in the first device region A (1, 1) and the first power voltage lead 310 are connected through a connection lead 500 overlapping with the first power via hole HV1. The second end of the device control circuit in the first device region A(1,1) is connected to the first output sub-pad P321 of the third pad group P30 through the connection lead 500. The first end of the device control circuit in the second device region A (1, 2) and the second power voltage lead 350 are connected through the connection lead 500 overlapping with the fourth power via hole HV4. The second end of the device control circuit in the second device region A (1,2) is connected to the second output sub-pad P322 of the third pad group P30 through the connection lead 500. The first end of the device control circuit in the third device region A (2, 1) is connected with the first power voltage lead 310 through the connection lead 500 overlapping with one of the second power via hole HV2 and the third power via hole HV3. The second end of the device control circuit in the third device region A (2, 1) is connected to the third output sub-pad P323 of the third pad group P30 through the connection lead 500. The first end of the device control circuit in the fourth device region A (2, 2) is connected to the second power voltage lead 350 through the connection lead 500 overlapping with one of the fifth power via hole HV5 and the sixth power via hole HV6. The second end of the device control circuit in the fourth device region A (2, 2) is connected to the fourth output sub-pad P324 of the third pad group P30 through the connection lead 500. The first end of the device control circuit may be a sub-pad in a device pad group P50 located on the power voltage lead, and the second end of the device control circuit may be a sub-pad in a device pad group P50 close to the third chip 030 in the first direction C and close to the axis of the reference voltage lead 330 in the second direction D. This can minimize the length of the connection lead 500 between the output pin of the third chip 030 and the second end of the device control circuit, and reduce the overlapping length between these connection leads 500 and the reference voltage lead 330, thereby reducing the risk of a bad short circuit between these connection leads 500 and the reference voltage lead 330.

Optionally, in at least part of the control regions, the device control circuit in the first device region A (1, 1) has connection leads for connecting with each functional device, and the device control circuit in the third device region A (2, 1) has connection leads for connecting with each functional device. These connection leads in the first device region A (1, 1) and these connection leads in the third device region A (2, 1) are symmetrical about a symmetry axis, and the symmetry axis is parallel to the second direction. The device control circuit in the second device region A (1,2) has connection leads to connect each functional device, and the device control circuit in the fourth device region A (2, 2) has connection leads to connect each functional device. The connection leads of the second device region A (1, 2) and the connection leads in the fourth device region A (2, 2) are symmetrical about a symmetry axis, and the symmetry axis is parallel to the second direction.

Exemplarily, referring to FIG. 13, in an embodiment of the present disclosure, four light emitting elements arranged in series and in a 2*2 array are provided in a device region A. The first light emitting element is connected to the power voltage lead through a connection lead 500 overlapping with the power via hole. The fourth light emitting element is connected to the output sub-pad of the third pad group P30 through the connection lead 500. In the first device region A (1, 1) and the second device region A (1,2), the three connection leads 500 for connecting the four light emitting elements in series are distributed as a whole in a notch shape with the opening facing toward the first direction C. In the third device region A (2, 1) and the fourth device region A (2, 2), the three connection leads 500 for connecting the four light emitting elements in series are formed as a whole in a notch shape with the opening facing toward the opposite direction of the first direction C. In an embodiment, in the first control region 2011, the first power via hole HV1 may be disposed on the side in the first direction C of the first device region A(1, 1), and the fourth power via hole HV4 may be disposed at a side in the first direction C of the second device region A(1,2). The first end of the device control circuit in the first device region A (1, 1) and the first power voltage lead 310 are connected through a connection lead 500 that overlaps with the first power via hole HV1. The first end of the device control circuit in the third device region A (2, 1) and the first power voltage lead 310 are connected through a connection lead 500 that overlaps with the first power via hole HV2. The first end of the device control circuit in the second device region A(1, 2) and the second power voltage lead 350 are connected by a connection lead 500 that overlaps with the fourth power via hole HV4. The first end of the device control circuit in the fourth device region A (2, 2) and the second power voltage lead 350 are connected through a connection lead 500 that overlaps with the fifth power via hole HV5.

In a signal channel of the third array substrate, each control region 201 can be numbered sequentially. The control region 201 with a serial number of 1 can be located at an end of the signal channel in its extension direction. For example, it can be located at the end close to the binding region B, or located at the end away from the binding zone B. When there is only one control region column 220 in one signal channel, each control region 201 may be numbered sequentially along the first direction C or the opposite direction of the first direction C. When there are multiple control region columns 220 in one signal channel, in the signal channel, each control region 201 can be numbered row by row and column by column in a Z shape, or numbered row by row and column by column in an S shape, or numbered row by row and column by column in an N shape, or numbered row by row and column by column in a U shape or inverted U shape. In one signal channel, the third pad group P30 in each control region 201 can be cascaded in sequence according to the serial order of the control region 201. The strobe signal sub-pad P35 of the third pad group P30 in the control region 201 with a serial number of 1 is connected with the address lead 360 through a connection lead 500 that overlaps with the address via hole. The relay signal sub-pad P36 of the third pad group P30 in the control region 201 with a serial number of (n-1) is connected with the strobe signal sub-pad P35 of the third pad group P30 in the control region 201 with a serial number of n by the connection lead 500. In this way, the third array substrate can realize the mutual cascade connection of various third chips 030 in one signal channel, and further realize the control over each device control circuit in the signal channel, wherein n is a positive integer greater than 1, and not greater than the number of control regions in one signal channel.

In the third array substrate, the first power voltage lead 310 and the second power voltage lead 350 can be used to load the power voltage VLED for driving the device control circuit. For example, they can load the power voltage VLED for driving each light emitting element in the device control circuit to emit light. The reference voltage lead 330 may be used to load the reference voltage GND. The first input lead 320 may be used to load the chip operating voltage VCC, and the second input lead 340 may be used to load the drive data Data. In a signal channel, the address lead 360 connected to the third pad group P30 of the first stage of control region 201 can be loaded with a strobe signal. In this way, under the control of each drive lead 300, each third chip 030 and the functional device 107 can operate normally.

Optionally, in the first control region 2011 of the third array substrate, the first reference via hole HR1, the second input via hole HI2, and the fourth input via hole HI4 may not overlap with any second metal wiring layer 10, and filled by the insulating protection layer 105.

Figure 14:
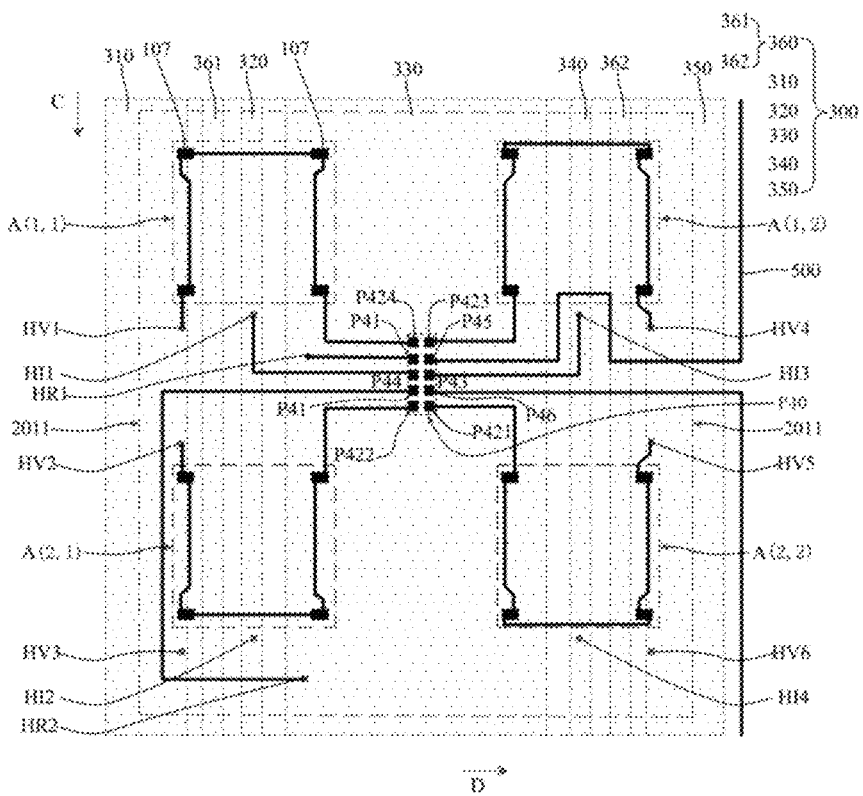
FIG. 14 is a schematic structure diagram of the fourth array substrate in a first control region according to an embodiment of the present disclosure, wherein, FIG. 14 only illustrates the drive leads, the relative position between at least part of the via holes provided on the insulating material layer, the connection leads (indicated by thick lines), the fourth pad group used to bind the fourth chip, and the functional devices in each device region.

The wiring substrate provided in the present disclosure can also be used to prepare an array substrate with a fourth chip 040. For example, it can be used to prepare a fourth array substrate. The base substrate 101, the first metal wiring layer 102 and the insulating material layer 103 of the fourth array substrate form the wiring substrate in an embodiment. Exemplarily, FIG. 14 shows a schematic structural diagram of a fourth array substrate in a first control region 2011. FIG. 14 only shows the drive leads 300, the positions of the via holes provided on the insulating material layer 103, the connection leads 500 (indicated by thick lines), the fourth pad group P40 for binding the fourth chip 040, the functional device 107 in each device region A, and so on.

Referring to FIG. 14, the fourth array substrate may be provided in a first control region 2011 with a fourth pad group P40 for binding the fourth chip 040, and the fourth pad group P40 may be located between the four device regions A in the first control region 2011. In other words, in one first control region 2011, along the first direction C, the fourth pad group P40 is located between the first device region A (1, 1) and the third device region A (2, 1). In the second direction D, the fourth pad group P40 is located between the first device region A (1, 1) and the second device region A (1,2). The chip power sub-pad P43 and the drive data sub-pad P44 of the fourth pad group P40 are arranged along the second direction D or the opposite direction thereof, so that the fourth pad group P40 has two columns of sub-pads, wherein each column of sub-pads have five sub-pads arranged along the first direction C. This can simplify the design of the connection lead 500 of the fourth array substrate, reduce the length of the connection lead 500, and thereby reduce the probability of a short circuit between the connection lead 500 and the drive lead 300 of the first metal wiring layer 102. Referring to FIG. 14, in the second direction D or the opposite direction thereof, compared to the strobe signal sub-pad P45 of the fourth pad group P40, the reference voltage sub-pad P41 of the fourth pad group P40 is located at the side close to the first reference via hole HR1. In this way, it can be ensured that the connection lead 500 connected to the reference voltage sub-pad P41 of the fourth pad group P40 can extend to overlap with the first reference via hole HR1 or the second reference via hole HR2.

Exemplarily, referring to FIG. 14, compared to the second power voltage lead 350, the first reference via hole HR1 is close to the first power voltage lead 310. In this way, the fourth pad group P40 includes two columns of sub-pads. Along the first direction C, the five sub-pads close to the first power voltage lead 310 are sequentially the fourth output sub-pad P424, the reference voltage sub-pad P41, the drive data sub-pad P44, the reference voltage sub-pad P41, and the second output sub-pad P422. Along the first direction C, the five sub-pads close to the second power voltage lead 350 are sequentially the third output sub-pad P423, the strobe signal sub-pad P45, the chip power sub-pad P43, the relay signal sub-pad P46, and the first output sub-pad P421.

Optionally, referring to FIG. 14, in the first control region 2011 of the fourth array substrate, the reference voltage sub-pad P41 of the fourth pad group P40 close to the first reference via hole HR1 is connected to the reference voltage lead 330 through the connection lead 500 overlapping with the first reference via hole HR1. The connection lead 500 can completely overlap with the reference voltage lead 330. In the first control region 2011 of the fourth array substrate, the reference voltage sub-pad P41 of the fourth pad group P40 away from the first reference via hole HR1 is connected to the reference voltage lead 330 through the connection lead 500 overlapping with the second reference via hole HR2.

In an embodiment of the present disclosure, of the two reference voltage sub-pads P41, only one reference voltage sub-pad may be electrically connected to the reference voltage lead 330, and the other reference voltage sub-pad P41 may not be electrically connected to the reference voltage lead 330. In this way, the fourth chip 040 can obtain the reference voltage through one reference voltage sub-pad P41, which can meet the operating requirements of the fourth chip 040. In an embodiment, of the two reference voltage sub-pads P41, the reference voltage sub-pad P41 close to the first reference via hole HR1 can be electrically connected to the reference voltage lead 330.

Optionally, referring to FIG. 14, in the first control region 2011 of the fourth array substrate, of the chip power sub-pad P43 and the drive data sub-pad P44 of the fourth pad group P40, the sub-pad close to the first input lead 320 is connected to the first input lead 320 through the connection lead 500 that overlaps with the first input via hole HI1, and the sub-pad far away from the first input lead 320 is connected to the second input lead 340 through the connection lead 500 that overlaps with the third input via hole HI3. In this way, the length of the connection leads 500 can be minimized, and the risk of short circuit between these connection leads 500 and the reference voltage lead 330 can be reduced.

Exemplarily, in an embodiment of the present disclosure, referring to FIG. 14, in the first control region 2011 of the fourth array substrate, the drive data sub-pad P44 and the first input lead 320 are connected through a connection lead 500 overlapping with the first input via hole HI1; and the chip power sub-pad P43 and the second input lead 340 are connected through a connection lead 500 overlapping with the fourth input via hole HI4.

In the first control region 2011 of the fourth array substrate, the first ends of the device control circuits of the four device regions A are connected to the power voltage leads by connection leads 500 that overlap with the power via holes. The second ends of the device control circuits of the four device regions A are connected to the four output sub-pads of the fourth pad group P40 through the connection leads 500 in a one-to-one correspondence. The second end of the device control circuit is connected to the output sub-pad closest thereto.

In an embodiment of the present disclosure, referring to FIG. 14, in the first control region 2011 of the fourth array substrate, the first end of the device control circuit in the first device region A (1, 1) is connected to the first power voltage lead 310 through the connection lead 500 overlapping with the first power via hole HV1. The second end of the device control circuit in the first device region A(1,1) is connected to the fourth output sub-pad P424 of the fourth pad group P40 through the connection lead 500. The first end of the device control circuit in the third device region A (2, 1) is connected to the first power voltage lead 310 through the connection lead 500 overlapping with one of the second power via hole HV2 and the third power via hole HV3. The second end of the device control circuit in the third device region A (2, 1) is connected to the second output sub-pad P422 of the fourth pad group P40 through the connection lead 500. The first end of the device control circuit in the second device region A (1, 2) is connected to the second power voltage lead 350 through the connection lead 500 overlapping with the fourth power via hole HV4. The second end of the device control circuit in the second device region A (1,2) is connected to the third output sub-pad P423 of the fourth pad group P40 through the connection lead 500. The first end of the device control circuit in the fourth device region A (2, 2) is connected with the second power voltage lead 350 through the connection lead 500 overlapping with one of the fifth power via hole HV5 and the sixth power via hole HV6. The second end of the device control circuit in the fourth device region A (2, 2) is connected to the first output sub-pad P421 of the fourth pad group P40 through the connection lead 500. The first end of the device control circuit may be a sub-pad in a device pad group P50 located on the power voltage lead, and the second end of the device control circuit may be a sub-pad in a device pad group P50 close to the fourth pad in the first direction C and close to the axis of the reference voltage lead 330 in the second direction D. This can minimize the length of the connection lead 500 for connecting the output pin of the fourth chip 040 and the second end of the device control circuit, and reduce the overlapping length between these connection leads 500 and the reference voltage lead 330, thereby reducing the risk of a bad short circuit between these connection lead 500 and the reference voltage lead 330.

Optionally, in at least part of the control regions, the device control circuit in the first device region A (1, 1) has connection leads for connecting each functional device, and the device control circuit in the third device region A (2, 1) has connection leads for connecting each functional device. These connection leads in the first device region A (1, 1) and these connection leads in the third device region A (2, 1) are symmetrical about a symmetry axis, and the symmetry axis is parallel to the second direction. The device control circuit in the second device region A (1,2) has connection leads to connect each functional device, and the device control circuit in the fourth device region A (2, 2) has connection leads to connect each functional device. The connection leads of the second device region A (1, 2) and the connection leads in the fourth device region A (2, 2) are symmetrical about a symmetry axis, and the symmetry axis is parallel to the second direction.

Illustratively, in an embodiment of the present disclosure, four light emitting elements arranged in series and in a 2*2 array are provided in one device region A. The first light emitting element and the power voltage lead are connected through a connection lead 500 overlapping with the power via hole. The fourth light emitting element is connected to the output sub-pad of the fourth pad group P40 through the connection lead 500. In the first device region A (1, 1) and the second device region A (1,2), the three connection leads 500 for connecting the four light emitting elements in series are distributed as a whole in a notch shape with the opening facing toward the first direction C. In the third device region A (2, 1) and the fourth device region A (2, 2), the three connection leads 500 for connecting the four light emitting elements in series are formed as a whole in a notch shape with the opening facing toward the opposite direction of the first direction C. In an embodiment, in the first control region 2011, the first power via hole HV1 may be disposed on the side of the first device region A(1, 1) in the first direction C, and the fourth power via hole HV4 may be disposed on the side in the first direction C of the second device region A(1,2). The first end of the device control circuit in the first device region A (1, 1) and the first power voltage lead 310 are connected through a connection lead 500 that overlaps with the first power via hole HV1. The first end of the device control circuit in the third device region A (2, 1) and the first power voltage lead 310 are connected through a connection lead 500 that overlaps with the second power via hole HV2. The first end of the device control circuit in the second device region A(1, 2) and the second power voltage lead 350 are connected by a connection lead 500 that overlaps with the fourth power via hole HV4. The first end of the device control circuit in the fourth device region A (2, 2) and the second power voltage lead 350 are connected through a connection lead 500 that overlaps with the fifth power via hole HV5.

In a signal channel of the fourth array substrate, each control region 201 can be numbered sequentially, wherein the control region 201 with a serial number of 1 can be located at an end of the signal channel in its extension direction. For example, it can be located at the end close to the binding region B or the end away from the binding region B. When there is only one control region column 220 in one signal channel, each control region 201 may be numbered sequentially along the first direction C or the opposite direction of the first direction C. When there are multiple control region columns 220 in one signal channel, in the signal channel, each control region 201 can be numbered row by row and column by column in a Z shape, or numbered row by row and column by column in an S shape, or numbered row by row and column by column in an N shape, or numbered row by row and column by column in a U shape or inverted U shape. In one signal channel, the fourth pad group P40 in each control region 201 can be cascaded in sequence according to the serial number of the control region 201. The strobe signal sub-pad P45 of the fourth pad group P40 in the first stage of control region 201 is connected to the address lead 360 by a connection lead 500 overlapping with the address via hole. The relay signal sub-pad P46 of the fourth pad group P40 in the (n−1)th stage of control region 201 is connected to the strobe signal sub-pad P45 of the fourth pad group P40 in the n-th stage of control region 201 by the connection lead 500. In this way, the fourth array substrate can realize in a signal channel the mutual cascade connection of the respective fourth chips 040, thereby realizing the control over each device control circuit in the signal channel.

In the fourth array substrate, the first power voltage lead 310 and the second power voltage lead 350 can be used to load the power voltage VLED for driving the device control circuit. For example, they can load the power voltage VLED for driving each light emitting element in the device control circuit to emit light. The reference voltage lead 330 may be used to load the reference voltage GND. Of the first input lead 320 and the second input lead 340, the one connected to the chip power sub-pad P43 can be used to load the chip operating voltage VCC, and the other can be used to load the drive data Data. In a signal channel, the address lead 360 electrically connected to the fourth pad group P40 of the first stage of control region 201 can be loaded with a strobe signal. In this way, under the control of each drive lead 300, each fourth chip 040 and functional device 107 can operate normally.

Optionally, in the first control region 2011 of the fourth array substrate, the second input via hole HI2 and the fourth input via hole HI4 may not overlap with any second metal wiring layer 104, and are filled by the insulating protection layer 105.

Optionally, referring to FIG. 10, FIG. 16, FIG. 22, and FIG. 28, in the wiring substrate provided by the present disclosure, in one control region column 220, the first power via hole HV1 and the fourth power via hole HV4 are symmetrical about the first symmetry axis, the second power via hole HV2 and the fifth power via hole HV5 are symmetrical about the second symmetry axis, and the third power via hole HV3 and the sixth power via hole HV6 are symmetrical about the third symmetry axis. The first symmetry axis, the second symmetry axis, and the third symmetry axis extend along the first direction C and coincide with each other. In this way, the design and preparation of the wiring substrate can be facilitated, the cost of the wiring substrate can be reduced, and the cost of each array substrate based on the wiring substrate can be further reduced.

Optionally, referring to FIG. 10, FIG. 16, FIG. 22, and FIG. 28, in a control region column 220, the first input via hole HI1 and the third input via hole HI3 are symmetrical about the fourth symmetry axis, and the second input via hole HI2 and the fourth input via hole HI4 are symmetrical about the fifth symmetry axis. The fourth symmetry axis and the fifth symmetry axis extend along the first direction C and coincide with each other. In this way, the design and preparation of the wiring substrate can be facilitated, the cost of the wiring substrate can be reduced, and the cost of each array substrate based on the wiring substrate can be further reduced.

Optionally, referring to FIGS. 10, 16, 22, and 28, in a first control region 2011, along the first direction C, the first power via hole HV1 and the fourth power via hole HV4 are located between the first device region A(1,1) and the first reference via hole HR1, the second power via hole HV2 and the fifth power via hole HV5 are located between the third device region A(2,1) and the first reference via hole HR1, and the third power via hole HV3 and the sixth power via hole HV6 are located between the third device region A(2, 1) and the second reference via hole HR2. In this way, in a first control region 2011, in the first direction C, there is a wiring space for array substrate wiring between the first power via hole HV1 and the first reference via hole HR1, there is a wiring space for array substrate wiring between the second power via hole HV2 and the first reference via hole HR1, there is a wiring space for array substrate wiring between the fourth power via hole HV4 and the first reference via hole HR1, and there is a wiring space for array substrate wiring between the fifth power via hole HV5 and the first reference via hole HR1. The array substrate may be provided with connection leads 500 extending along the second direction D in these wiring spaces, so that the overlapping lengths between these connection leads 500 and different drive leads 300 are minimized.

Figure 15:
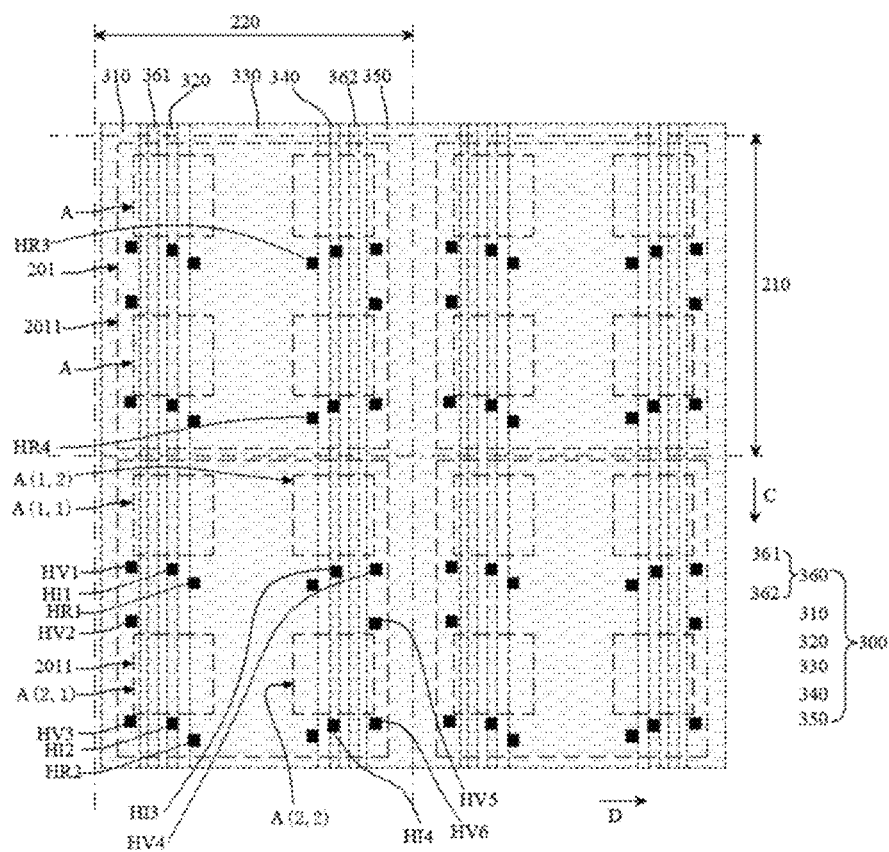
FIG. 15 is a schematic diagram of a partial structure of a wiring substrate according to an embodiment of the present disclosure, wherein FIG. 15 only illustrates the relative position between at least part of the via holes provided on the first metal wiring layer and the insulating material layer.
Figure 16:
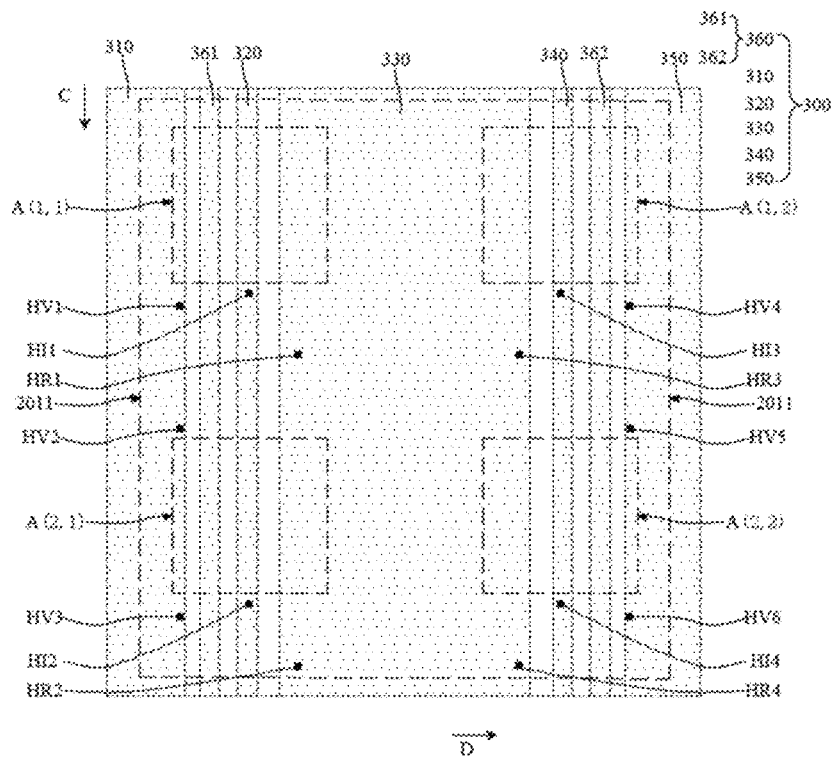
FIG. 16 is a partial enlarged schematic diagram in a first control region of the wiring substrate shown in FIG. 15, wherein FIG. 16 only illustrates the relative position between at least part of the via holes provided on the first metal wiring layer and the insulating material layer.

In an embodiment of the present disclosure, referring to FIGS. 15 and 16, in the wiring substrate of the present disclosure, in a first control region 2011, the insulating material layer 103 may also be provided with the third reference via hole HR3 and the fourth reference via hole HR4 exposing partial regions of the reference voltage lead 330. The third reference via hole HR3 and the first reference via hole HR1 are respectively located on two sides of the axis of the reference voltage lead 330, and the fourth reference via hole HR4 and the second reference via hole HR2 are respectively located on two sides of the axis of the reference voltage lead 330. In an embodiment, in the first control region 2011 of the wiring substrate, each device region A may have corresponding reference via holes. The first device region A (1, 1) can be arranged correspondingly to the first reference via hole HR1, the second device region A (1,2) can be arranged correspondingly to the third reference via hole HR3, the third device region A (2, 1) can be arranged correspondingly to the second reference via hole HR2, and the fourth device region A (2, 2) can be arranged correspondingly to the fourth reference via hole HR4.

Further, the third reference via hole HR3 and the first reference via hole HR1 are symmetrical about the sixth symmetry axis. The fourth reference via hole HR4 and the second reference via hole HR2 are symmetrical about the seventh symmetry axis. The sixth symmetry axis and the seventh symmetry axis extend along the first direction C and coincide with each other. In this way, the design and preparation of the wiring substrate can be facilitated, the cost of the wiring substrate can be reduced, and the cost of each array substrate based on the wiring substrate can be further reduced.

Based on the wiring substrate in an embodiment, in addition to the first to fourth array substrates described above, other array substrates using any one of the first chip 010 to the fourth chip 040 can also be prepared.

Exemplarily, the wiring substrate in an embodiment may be used to prepare a fifth array substrate provided with the first chip 010. The structure of the second metal wiring layer 104 of the fifth array substrate may be basically the same as that of the first array substrate, or local adjustments may be made in view of above. When the wiring substrate in an embodiment is used, the connection between the reference voltage sub-pad P11 of the first pad group P10 corresponding to the device region A in the fifth array substrate and the reference voltage lead 330 is more flexible. For example, the connection to the reference voltage lead 330 may be made through the reference via hole corresponding to the device region A.

Figure 17:
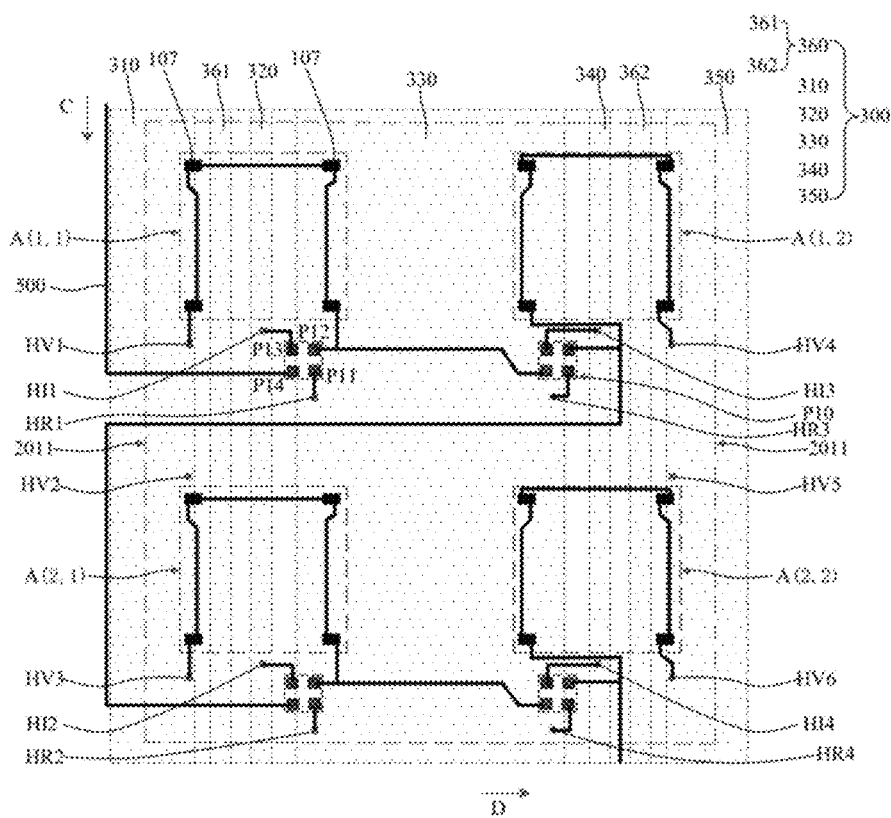
FIG. 17 is a schematic structural diagram of a fifth array substrate in a first control region according to an embodiment of the present disclosure, wherein, FIG. 17 only illustrates the drive leads, the relative position between at least part of the via holes provided on the insulating material layer, the connection leads (indicated by thick lines), the first pad group used to bind the first chip, and the functional devices in each device region.

For example, referring to FIG. 17, in the fifth array substrate, the reference voltage sub-pad P11 of the first pad group P10 corresponding to the first device region A(1, 1) is connected to the reference voltage lead 330 through the connection lead 500 overlapping with the first reference via hole HR1. The reference voltage sub-pad P11 of the first pad group P10 corresponding to the second device region A(1, 2) is connected to the reference voltage lead 330 by a connection lead 500 that overlaps with the third reference via hole HR3. The reference voltage sub-pad P11 of the first pad group P10 corresponding to the third device region A (2, 1) is connected to the reference voltage lead 330 by a connection lead 500 that overlaps with the second reference via hole HR2. The reference voltage sub-pad P11 of the first pad group P10 corresponding to the fourth device region A (2, 2) is connected to the reference voltage lead 330 through a connection lead 500 overlapping with the fourth reference via hole HR4. In this way, the length of the connection lead 500 between the reference voltage sub-pad P11 of each first pad group P10 and the reference voltage lead 330 is basically the same. This can improve the uniformity of the operating environment for each first chip 010, thereby improving the operating stability of the fifth array substrate and being beneficial to the debugging of the fifth array substrate.

Figure 18:
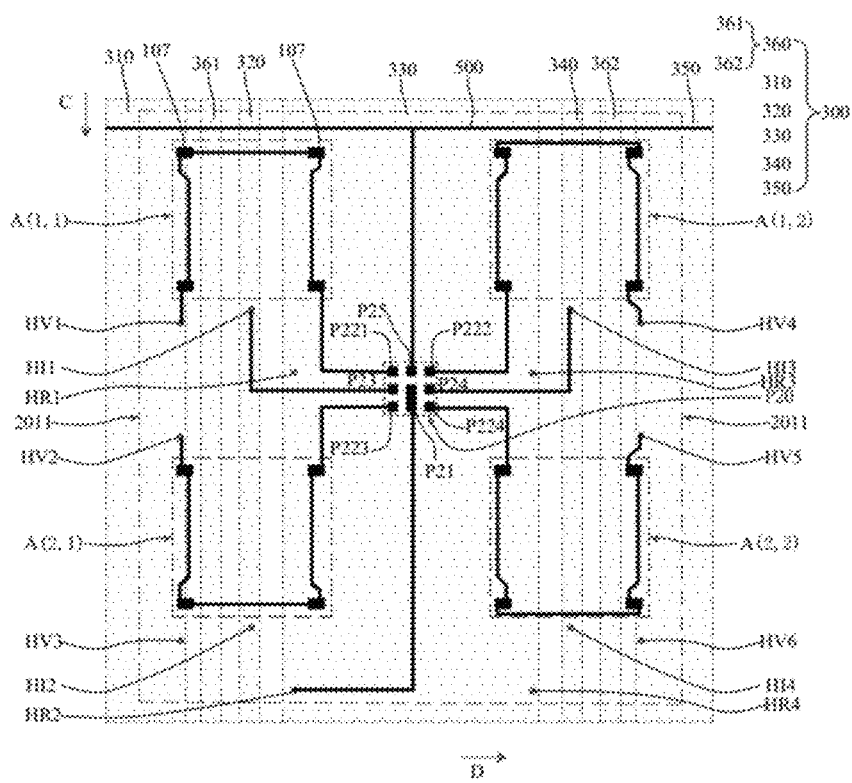
FIG. 18 is a schematic structure diagram of the sixth array substrate in a first control region according to an embodiment of the present disclosure, wherein, FIG. 18 only illustrates the drive leads, the relative position between at least part of the via holes provided on the insulating material layer, the connection leads (indicated by thick lines), the second pad group used to bind the second chip, and the functional devices in each device region.

Illustratively again, the wiring substrate in an embodiment may be used to prepare a sixth array substrate provided with the second chip 020. Referring to FIG. 18, the structure of the second metal wiring layer 104 of the sixth array substrate may be basically the same as that of the second array substrate, or local adjustments may be made in view of above. When the wiring substrate in an embodiment is used, the connection between the reference voltage sub-pad P21 of the second pad group P20 in the first control region 2011 of the fifth array substrate and the reference voltage lead 330 is more flexible. In the sixth array substrate, in the first control region 2011, the connection lead 500 connected to the reference voltage sub-pad P21 of the second pad group P20 and the reference voltage lead 330 may overlap with the second reference via hole HR2, or may overlap with the fourth reference via hole HR4, or may overlap with the second reference via hole HR2 and the fourth reference via hole HR4 at the same time. In the first control region 2011, the connection lead 500 for connecting the reference voltage sub-pad P21 and the reference voltage lead 330 may completely overlap with the reference voltage lead 330.

Optionally, in the first control region 2011 of the sixth array substrate, the first reference via hole HR1, the third reference via hole HR3, the second input via hole HI2, and the fourth input via hole HI4 may not be overlap with any second metal wiring layer 104 and are filled with the insulating protection layer 105. One of the second reference via hole HR2 and the fourth reference via hole HR4 is used to overlap with the connection lead 500, so that the reference voltage sub-pad P11 is connected to the reference voltage lead 330 through the connection lead 500. The other of the second reference via hole HR2 and the fourth reference via hole HR4 may not overlap with any second metal wiring layer 104 and is filled with the insulating protection layer 105.

Figure 19:
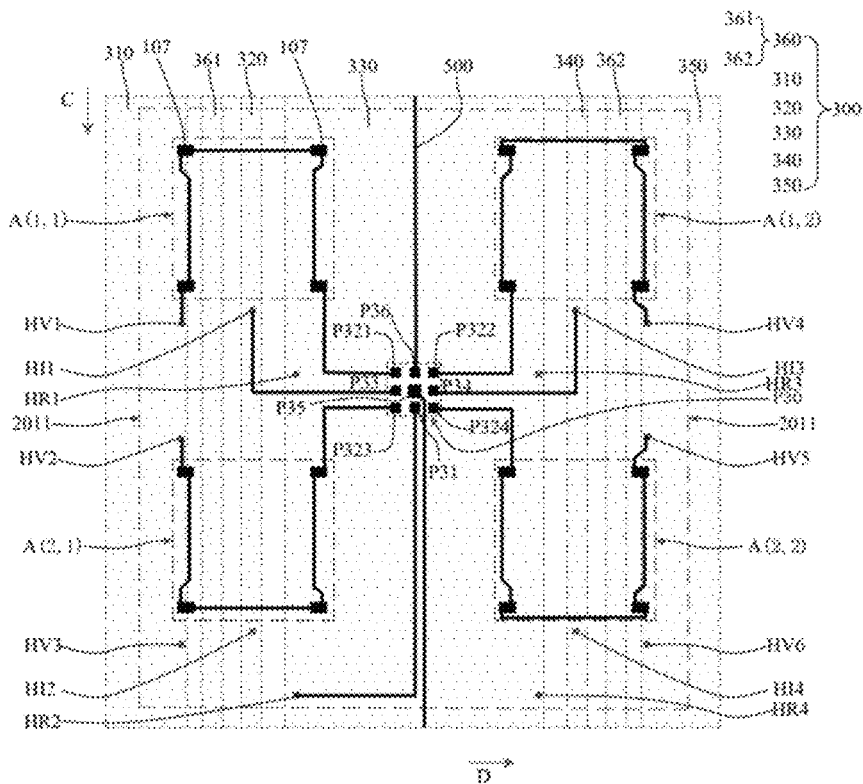
FIG. 19 is a schematic structure diagram of a seventh array substrate in a first control region according to an embodiment of the present disclosure, wherein, FIG. 19 only illustrates the drive leads, the relative position between at least part of the via holes provided on the insulating material layer, the connection leads (indicated by thick lines), the third pad group used to bind the third chip, and the functional devices in each device region.

Illustratively again, the wiring substrate in an embodiment may be used to prepare a seventh array substrate provided with the third chip 030. Referring to FIG. 19, the structure of the second metal wiring layer 104 of the seventh array substrate may be basically the same as that of the third array substrate, or local adjustments may be made in view of above. When the wiring substrate in an embodiment is used, the connection between the reference voltage sub-pad P31 of the third pad group P30 and the reference voltage lead 330 in the first control region 2011 of the seventh array substrate is more flexible. In the seventh array substrate, in the first control region 2011, the connection lead 500 connected to the reference voltage sub-pad P31 of the third pad group P30 and the reference voltage lead 330 may overlap with the second reference via hole HR2, or may overlap with the fourth reference via hole HR4. In the first control region 2011, the connection lead 500 for connecting the reference voltage sub-pad P31 and the reference voltage lead 330 may completely overlap with the reference voltage lead 330.

Optionally, in the first control region 2011 of the seventh array substrate, the first reference via hole HR1, the third reference via hole HR3, the second input via hole HI2, and the fourth input via hole HI4 may not overlap with any second metal wiring layer 104 and are filled with the insulating protection layer 105. One of the second reference via hole HR2 and the fourth reference via hole HR4 is used to overlap with the connection lead 500, so that the reference voltage sub-pad P31 is connected to the reference voltage lead 330 through the connection lead 500. The other of the second reference via hole HR2 and the fourth reference via hole HR4 may not overlap with any second metal wiring layer 104 and is filled with the insulating protection layer 105.

Figure 20:
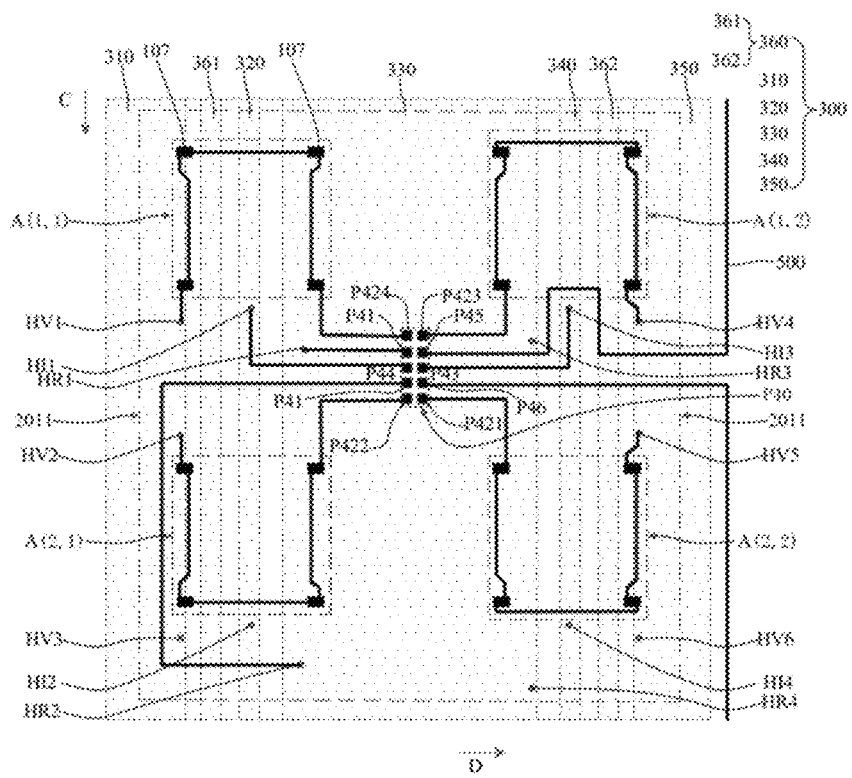
FIG. 20 is a schematic structure diagram of an eighth array substrate in a first control region according to an embodiment of the present disclosure, wherein, FIG. 20 only illustrates the drive leads, the relative position between at least part of the via holes provided on the insulating material layer, the connection leads (indicated by thick lines), the fourth pad group used to bind the fourth chip, and the functional devices in each device region.

Illustratively again, the wiring substrate in an embodiment may be used to prepare an eighth array substrate provided with the fourth chip 040. Referring to FIG. 20, the structure of the second metal wiring layer 104 of the eighth array substrate may be basically the same as that of the fourth array substrate, or local adjustments may be made in view of above. When the wiring substrate in an embodiment is used, the arrangement of the fourth pad group P40 of the eighth array substrate in the first control region 2011 is more flexible.

In the eighth array substrate, the fourth pad group P40 still includes two columns of sub-pads, and the number of sub-pads in each column is 5 sub-pads. No matter whether the reference voltage sub-pad P41 is located on the side close to the first reference via hole HR1 or located on the side close to the third reference via hole HR3, the two reference voltage sub-pads P41 can be connected to the reference via hole.

In an embodiment of the present disclosure, of the two reference voltage sub-pads P41, only one reference voltage sub-pad P41 may be electrically connected to the reference voltage lead 330 through the connection lead 500, and the other reference voltage sub-pad P41 may not be electrically connected to the reference voltage lead 330. In this way, the fourth chip 040 can obtain the reference voltage GND through one reference voltage sub-pad P41, which can meet the operating requirements of the fourth chip 040. In an embodiment, of the two reference voltage sub-pads P41, the reference voltage sub-pad P41 close to the first reference via hole HR1 or the third reference via hole HR3 can be electrically connected to the reference voltage lead 330 through the connection lead 500.

Optionally, in the first control region 2011 of the eighth array substrate, the second input via hole HI2 and the fourth input via hole HI4 may not overlap with any second metal wiring layer 104, and are filled by the insulating protection layer 105. At least one of the first reference via hole HR1 to the fourth reference via hole HR4 is used to overlap with the connection lead 500, and the remaining reference via holes may not overlap with any second metal wiring layer 104 and are filled by the insulating protection Layer 105.

Optionally, in the wiring substrate provided by the present disclosure, referring to FIG. 16, in a first control region 2011, the third reference via hole HR3 and the fourth reference via hole HR4 are located at the side of the first reference via hole HR1 and the second reference via hole HR2 away from the first power voltage lead 310.

In a first control region 2011, the first power via hole HV1, the first input via hole HI1, the first reference via hole HR1, the fourth power via hole HV4, the third input via hole HI3, and the third reference via hole HR3 form the first group of via holes; and one of the second power via hole HV2 and the third power via hole HV3, the second input via hole HI2, the second reference via hole HR2, one of the fifth power via hole HV5 and the sixth power via hole HV6, the fourth input via hole HI4, and the fourth reference via hole HR4 constitute a second group of via holes. The relative position between the via holes in the first group of via holes is the same as the relative position between the via holes in the second group of via holes. This can simplify the design and preparation of the wiring substrate and reduce the cost of various array substrates. In addition, this can also simplify the design and preparation of the array substrate, and facilitate the debugging of the array substrate.

Figure 21:
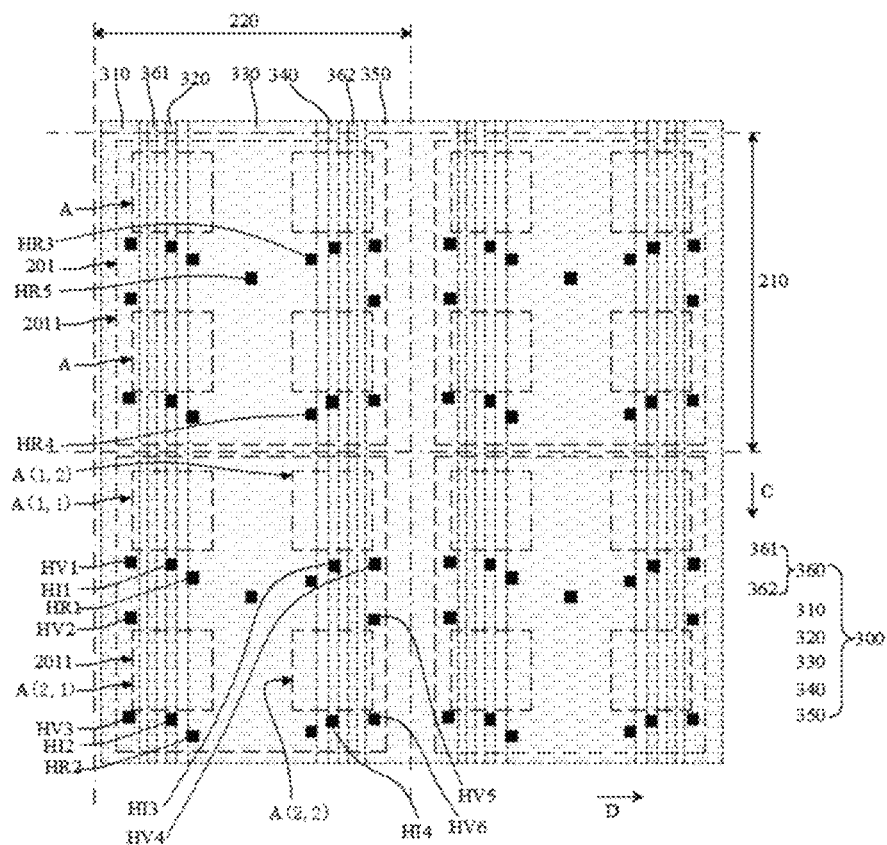
FIG. 21 is a schematic diagram of a partial structure of a wiring substrate according to an embodiment of the present disclosure, wherein FIG. 21 only illustrates the relative position between at least part of the via holes provided on the first metal wiring layer and the insulating material layer.
Figure 22:
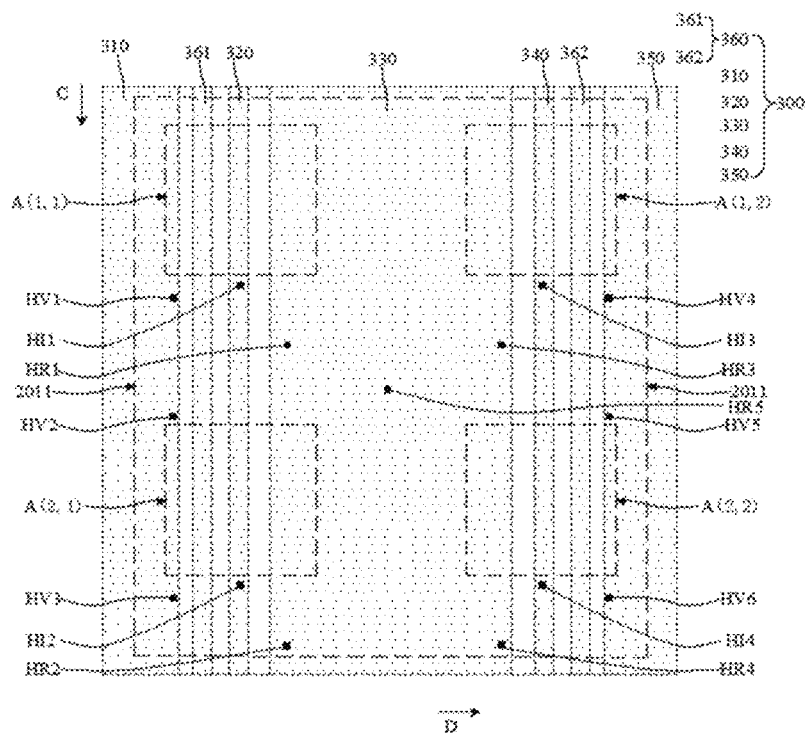
FIG. 22 is a partial enlarged schematic diagram in a first control region of the wiring substrate shown in FIG. 21, wherein FIG. 22 only illustrates the relative position between at least part of the via holes provided on the first metal wiring layer and the insulating material layer.

In an embodiment of the present disclosure, in the wiring substrate provided by the present disclosure, referring to FIGS. 21 and 22, in a first control region 2011, the insulating material layer 103 is further provided with the fifth reference via hole HR5 exposing a partial region of the reference voltage lead 330, wherein the fifth reference via hole HR5 is located between the four device regions A. In this way, when the wiring substrate is used to prepare different array substrates, the connection leads 500 of some array substrates can be further simplified.

Figure 23:
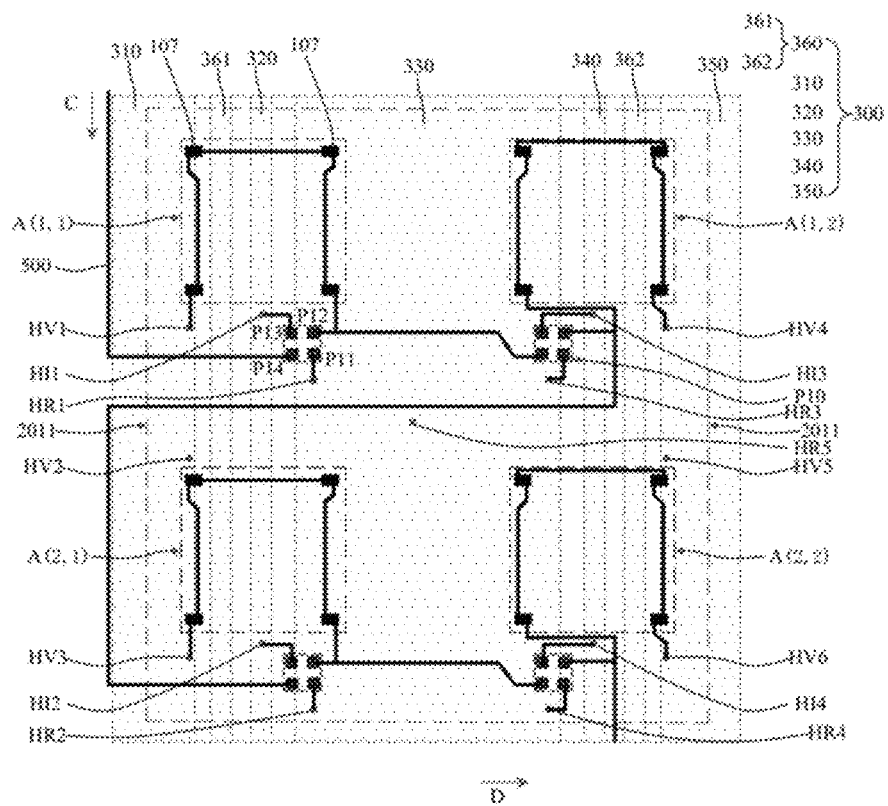
FIG. 23 is a schematic structure diagram of a ninth array substrate in a first control region according to an embodiment of the present disclosure, wherein, FIG. 23 only illustrates the drive leads, the relative position between at least part of the via holes provided on the insulating material layer, the connection leads (indicated by thick lines), the first pad group used to bind the first chip, and the functional devices in each device region.

Exemplarily, the wiring substrate in an embodiment may be used to prepare a ninth array substrate provided with the first chip 010. Referring to FIG. 23, the structure of the second metal wiring layer 104 of the ninth array substrate can be the same as that of the first array substrate or the fifth array substrate, or local adjustments can be made in view of above. Optionally, in the first control region 2011 of the ninth array substrate, the fifth reference via hole HR5 may not overlap with any second metal wiring layer 104 and be filled with the insulating protection layer 105.

Illustratively again, the wiring substrate in an embodiment may be used to prepare a tenth array substrate provided with the second chip 020. The structure of the second metal wiring layer 104 of the tenth array substrate may be the same as that of the second array substrate or the sixth array substrate, or local adjustments may be made in view of above.

Figure 24:
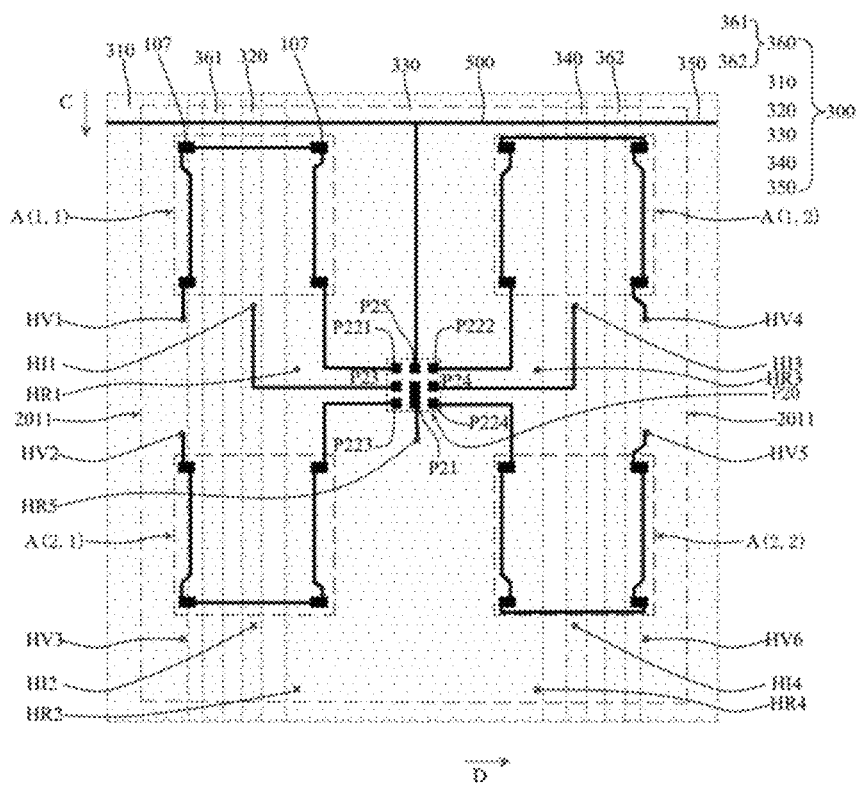
FIG. 24 is a schematic structure diagram of the tenth array substrate in a first control region according to an embodiment of the present disclosure, wherein, FIG. 24 only illustrates the drive leads, the relative position between at least part of the via holes provided on the insulating material layer, the connection leads (indicated by thick lines), the second pad group used to bind the second chip, and the functional devices in each device region.

In an embodiment of the tenth array substrate, referring to FIG. 24, compared with the second array substrate or the sixth array substrate, the reference voltage sub-pad P21 of the tenth array substrate and the reference voltage lead 330 are connected through the connection lead 500 overlapping with the fifth reference via hole HR5.

In an embodiment of the tenth array substrate, compared with the second array substrate or the sixth array substrate, the reference voltage sub-pad P21 of the tenth array substrate may also be located at the side of the address sub-pad P25 along the opposite direction of the first direction C. At this time, the reference voltage sub-pad P21 and the reference voltage lead 330 can be connected through the connection lead 500 overlapping with the fifth reference via hole HR5.

Optionally, in the first control region 2011 of the tenth array substrate, the reference voltage sub-pad P21 of the tenth array substrate is connected to the reference voltage lead 330 through a connection lead 500 that overlaps with the fifth reference via hole HR5. The first reference via hole HR1 to the fourth reference via hole HR4 may not overlap with any second metal wiring layer 104 and be filled with the insulating protection layer 105.

Illustratively again, the wiring substrate in an embodiment may be used to prepare the eleventh array substrate provided with the third chip 030. The structure of the second metal wiring layer 104 of the eleventh array substrate can be the same as that of the third array substrate or the seventh array substrate, or local adjustments can be made in view of above.

Figure 25:
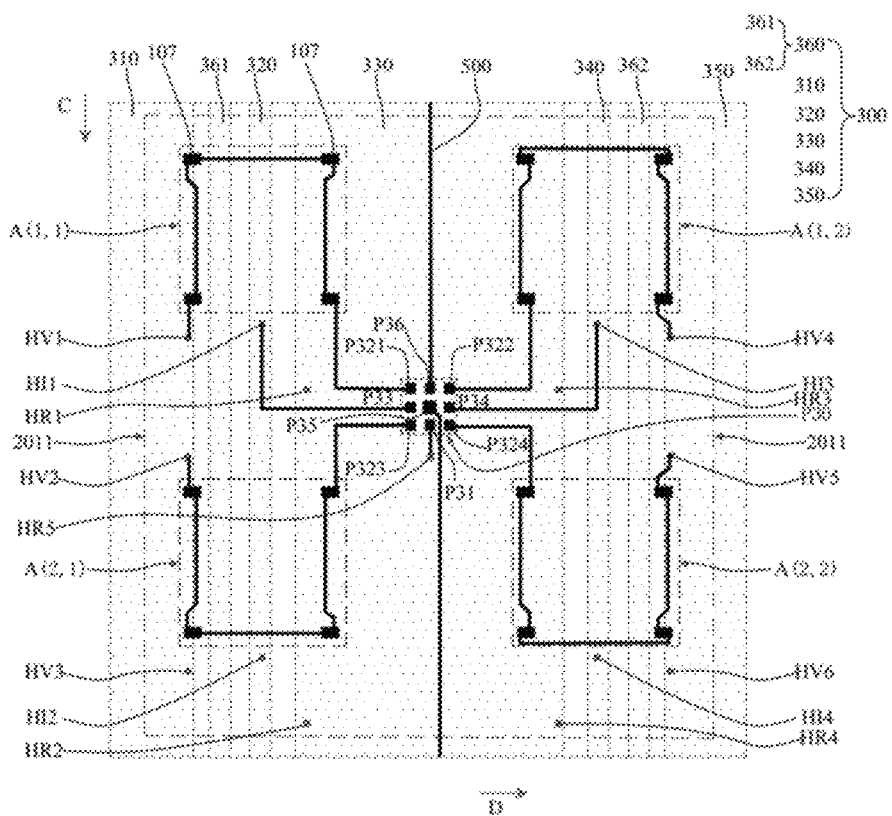
FIG. 25 is a schematic structure diagram of the eleventh array substrate in a first control region according to an embodiment of the present disclosure, wherein, FIG. 25 only illustrates the drive leads, the relative position between at least part of the via holes provided on the insulating material layer, the connection leads (indicated by thick lines), the third pad group used to bind the third chip, and the functional devices in each device region.

In an embodiment of the eleventh array substrate, referring to FIG. 25, compared with the seventh array substrate, the reference voltage sub-pad P31 of the eleventh array substrate is connected to the reference voltage lead 330 through the connection lead 500 overlapping with the fifth reference via hole HR5.

Optionally, in the first control region 2011 of the eleventh array substrate, the reference voltage sub-pad P31 of the eleventh array substrate is connected to the reference voltage lead 330 through the connection lead 500 overlapping with the fifth reference via hole HR5. The first reference via hole HR1 to the fourth reference via hole HR4 may not overlap with any second metal wiring layer 104, and are filled with the insulating protection layer 105.

Illustratively again, the wiring substrate in an embodiment may be used to prepare a twelfth array substrate provided with the fourth chip 040. The structure of the second metal wiring layer 104 of the twelfth array substrate can be the same as that of the fourth array substrate or the eighth array substrate, or local adjustments can be made in view of above.

Figure 26:
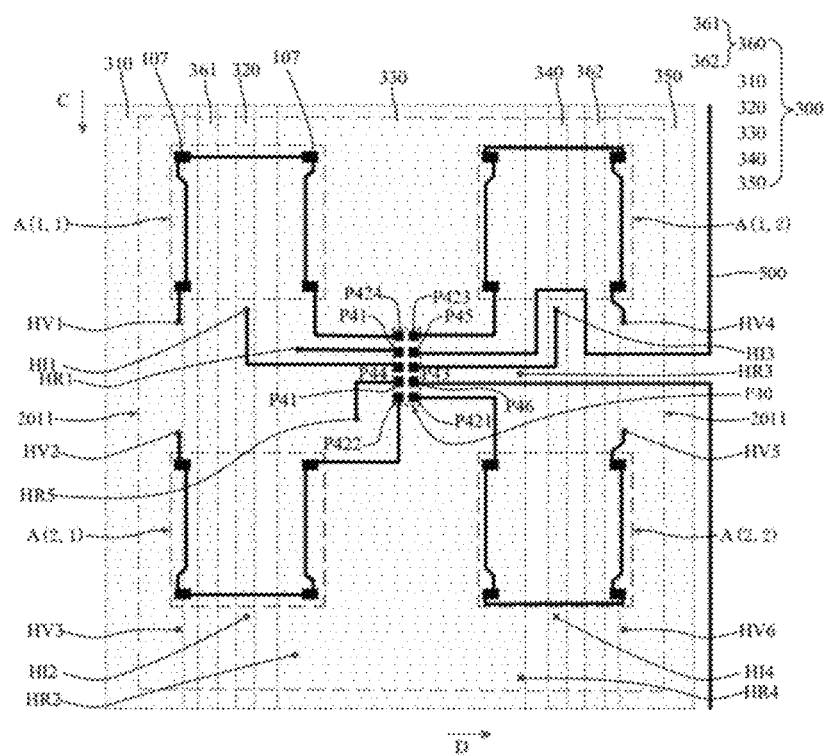
FIG. 26 is a schematic structure diagram of the twelfth array substrate in a first control region according to an embodiment of the present disclosure, wherein, FIG. 26 only illustrates the drive leads, the relative position between at least part of the via holes provided on the insulating material layer, the connection leads (indicated by thick lines), the fourth pad group used to bind the fourth chip, and the functional devices in each device region.

In an embodiment of the twelfth array substrate, referring to FIG. 26, compared with the fourth array substrate or the eighth array substrate, the reference voltage sub-pad P41 of the twelfth array substrate away from the first reference via hole HR1 or away from the third reference via hole HR3 are connected to the reference voltage lead 330 by a connection lead 500 overlapping with the fifth reference via hole HR5.

For example, in the first control region 2011 of the twelfth array substrate, along the second direction D or the opposite direction thereof, of the two sub-pad columns of the fourth pad group P40, the sub-pad column provided with the reference voltage sub-pad P41 is located on the side close to the fifth reference via hole HR5. In other words, along the second direction D, the reference voltage sub-pad P41 is located between the strobe signal sub-pad P45 and the first reference via hole HR1; and the fourth pad group P40 is located at a side along the second direction D of the fifth reference via hole HR5. This is convenient for the reference voltage sub-pad P41 to be electrically connected to the reference voltage lead 330 through the fifth reference via hole HR5.

Optionally, in the first control region 2011 of the twelfth array substrate, one reference voltage sub-pad P41 of the twelfth array substrate is connected to the reference voltage lead 330 through a connection lead 500 overlapping with one of the first reference via hole HR1 and the third reference via hole HR3. Another reference voltage sub-pad P41 is connected to the reference voltage lead 330 through a connection lead 500 overlapping with the fifth reference via hole HR5. The remaining reference via holes may not overlap with any second metal wiring layer 104 and be filled with the insulating protection layer 105.

Figure 27:
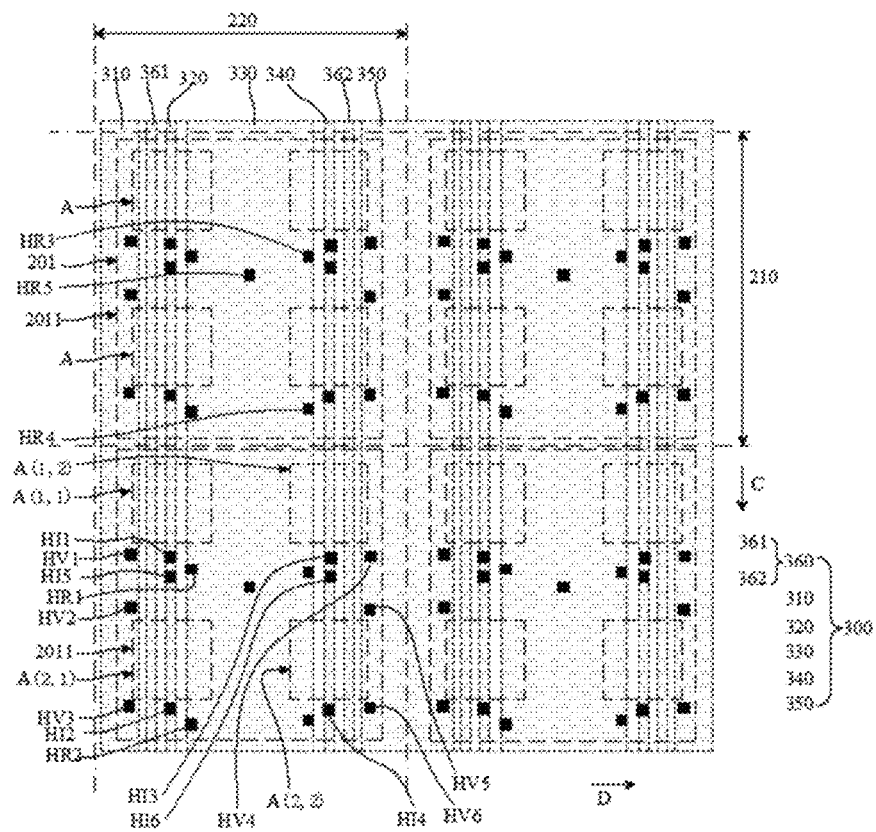
FIG. 27 is a schematic diagram of a partial structure of a wiring substrate according to an embodiment of the present disclosure, wherein FIG. 27 only illustrates the relative position between at least part of the via holes provided on the first metal wiring layer and the insulating material layer.
Figure 28:
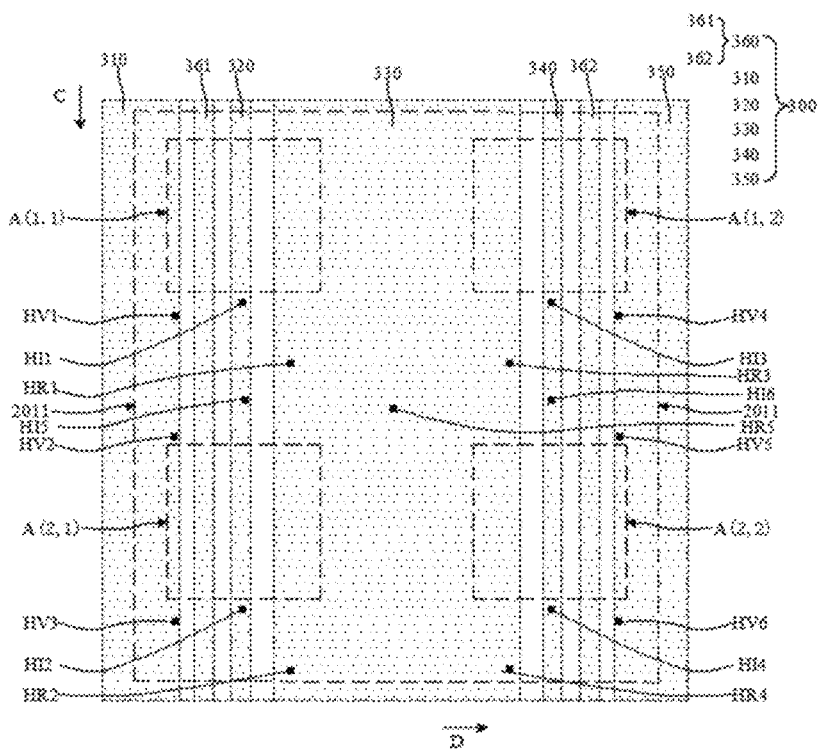
FIG. 28 is a partial enlarged schematic diagram in a first control region of the wiring substrate shown in FIG. 27, wherein FIG. 28 only illustrates the relative position between at least part of the via holes provided on the first metal wiring layer and the insulating material layer.

Optionally, in some embodiments of the wiring substrate of the present disclosure, referring to FIGS. 27 and 28, in a first control region 2011, the insulating material layer 103 is further provided with the fifth input via hole HI5 exposing a partial region of the first input lead 320. Along the first direction C, the fifth input via hole HI5 is located between the first reference via hole HR1 and the third device region A (2, 1). The insulating material layer 103 may also be provided with the sixth input via hole HI6 exposing a partial region of the second input lead 340. The sixth input via hole HI6 and the fifth input via hole HI5 are symmetrical with respect to the axis of the reference voltage lead 330. In this way, the wiring substrate provided by the present disclosure can also be applied to different microchips, and then different array substrates can be prepared.

Figure 29:
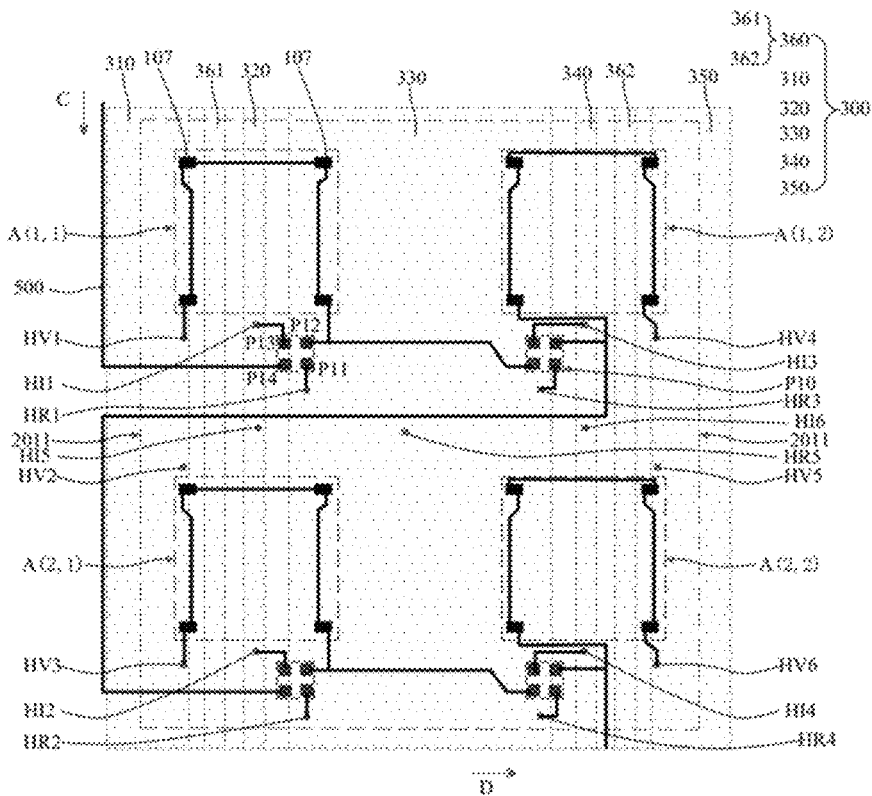
FIG. 29 is a schematic structure diagram of the thirteenth array substrate in a first control region according to an embodiment of the present disclosure, wherein, FIG. 29 only illustrates the drive leads, the relative position between at least part of the via holes provided on the insulating material layer, the connection leads (indicated by thick lines), the first pad group used to bind the first chip, and the functional devices in each device region.

Exemplarily, the wiring substrate in an embodiment may be used to prepare a thirteenth array substrate provided with the first chip 010. Referring to FIG. 29, the structure of the second metal wiring layer 104 of the thirteenth array substrate may be basically the same as that of the first array substrate, the fifth array substrate, or the ninth array substrate, or local adjustments can be made in view of above.

Optionally, in an embodiment of the thirteenth array substrate, in the first control region 2011, the fifth input via hole HI5 and the sixth input via hole HI6 may not overlap with any second metal wiring layer 104, and filled with the insulating protection layer 105.

Optionally, in another embodiment of the thirteenth array substrate, in the first control region 2011, the first input sub-pad P13 of the first pad group P10 corresponding to the first device region A (1, 1) is connected with the first power voltage lead 310 by a connection lead 500 overlapping with the fifth input via hole HI5. The first input via hole HI1 may not overlap with any second metal wiring layer 104, and be filled with the insulating protection layer 105.

Optionally, in another implementation of the thirteenth array substrate, in the first control region 2011, the first input sub-pad P13 of the first pad group P10 corresponding to the second device region A(1,2) is connected to the second power voltage lead 350 through a connection lead 500 overlapping with the sixth input via hole HI6. The third input via hole HI3 may not overlap with any second metal wiring layer 104, and be filled with the insulating protection layer 105.

Illustratively again, the wiring substrate in an embodiment may be used to prepare a fourteenth array substrate provided with the second chip 020. The structure of the second metal wiring layer 104 of the fourteenth array substrate may be basically the same as that of the first array substrate, the fifth array substrate, or the tenth array substrate, or local adjustments can be made in view of above.

In an embodiment of the fourteenth array substrate, in the first control region 2011, the reference voltage sub-pad P21 of the fourteenth array substrate is connected to the reference voltage lead 330 through the connection lead 500 overlapping with any of the first reference via hole HR1, the second reference via hole HR2 and the fifth reference via hole HR5. One of the chip power sub-pad P23 and the drive data sub-pad P24 is connected to the first input lead 320 through a connection lead 500 overlapping with the fifth input via hole HI5. The other of the chip power sub-pad P23 and the drive data sub-pad P24 is connected to the second input lead 340 through a connection lead 500 overlapping with the sixth input via hole HI6. Optionally, the connection lead 500 overlapping with the fifth input via hole HI5 and the connection lead 500 overlapping with the sixth input via hole HI6 may extend straight along the second direction D, so as to reduce the overlapping length with the reference voltage lead 330.

Figure 30:
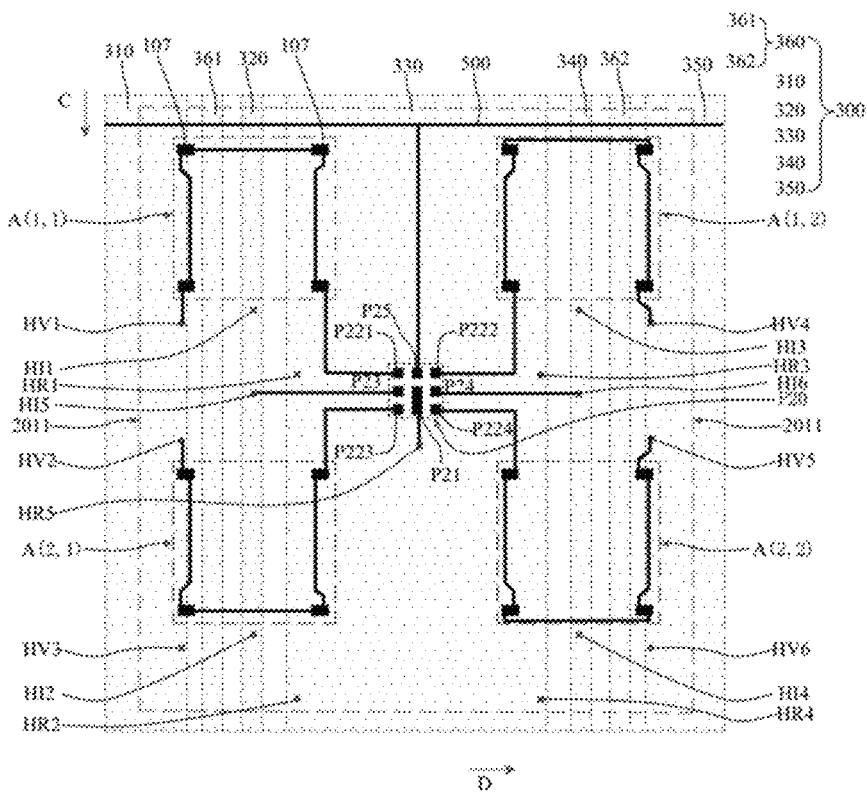
FIG. 30 is a schematic structure diagram of the fourteenth array substrate in a first control region according to an embodiment of the present disclosure, wherein, FIG. 30 only illustrates the drive leads, the relative position between at least part of the via holes provided on the insulating material layer, the connection leads (indicated by thick lines), the second pad group used to bind the second chip, and the functional devices in each device region.

In an embodiment of the present disclosure, referring to FIG. 30, compared with the tenth array substrate, in the first control region 2011, the chip power sub-pad P23 of the fourteenth array substrate is connected to the first input lead 320 by a connection lead 500 overlapping with the fifth input via hole HI5. Optionally, the connection lead 500 extends straight along the second direction, so as to reduce the overlapping length with the reference voltage lead 330. The drive data sub-pad P24 and the second input lead 340 are connected by a connection lead 500 overlapping with the sixth input via hole HI6. Optionally, the connection lead 500 extends straight along the second direction. The first input via hole HI1 and the third input via hole HI3 may not overlap with any second metal wiring layer 104 and may be filled with the insulating protection layer 105.

Illustratively again, the wiring substrate in an embodiment may be used to prepare a fifteenth array substrate provided with the third chip 030. The structure of the second metal wiring layer 104 of the fifteenth array substrate may be the same as that of the third array substrate, the seventh array substrate, or the tenth array substrate, or local adjustments can be made in view of above.

In an embodiment of the fifteenth array substrate, referring to FIG. 31, compared with the eleventh array substrate, in the first control region 2011, the chip power sub-pad P33 of the fifteenth array substrate is connected to the first input lead 320 through a connection lead 500 overlapping with the fifth input via hole HI5. Optionally, the connection lead 500 extends straight along the second direction D. The drive data sub-pad P34 and the second input lead 340 are connected by a connection lead 500 overlapping with the sixth input via hole HI6. Optionally, the connection lead 500 extends straight along the second direction D. The first input via hole HI1 and the third input via hole HI3 may not overlap with any second metal wiring layer 104 and may be filled with the insulating protection layer 105.

Illustratively again, the wiring substrate in an embodiment may be used to prepare a sixteenth array substrate provided with the fourth chip 040. The structure of the second metal wiring layer 104 of the sixteenth array substrate may be the same as that of the fourth array substrate, the eighth array substrate, or the twelfth array substrate, or may be adjusted locally on this basis.

In an embodiment of the sixteenth array substrate, referring to FIG. 32, compared with the twelfth array substrate, in the first control region 2011, the chip power sub-pad P43 of the sixteenth array substrate is connected to the first input lead 320 through a connection lead 500 overlapping with the fifth input via hole HI5. Optionally, the connection lead 500 extends straight along the second direction D. The drive data sub-pad P44 of the sixteenth array substrate and the second input lead 340 are connected by a connection lead 500 overlapping with the sixth input via hole HI6. Optionally, the connection lead 500 extends straight along the second direction D. The first input via hole HI1 and the third input via hole HI3 may not overlap with any second metal wiring layer 104 and may be filled with the insulating protection layer 105.

Optionally, in some embodiments, referring to FIG. 33, in the wiring substrate of the present disclosure and each prepared array substrate, the control region 201 may further include the second control region 2012. In each control region column 220, the second control region 2012 is located at a side of each first control region 2011 in the first direction C. In other words, in one control region column 220, the last control region 201 along the first direction C may be the second control region 2012, and the remaining control regions 201 may be the first control region 2011. Optionally, in each control region column 220, the number of the second control region 2012 is one.

Figure 34:
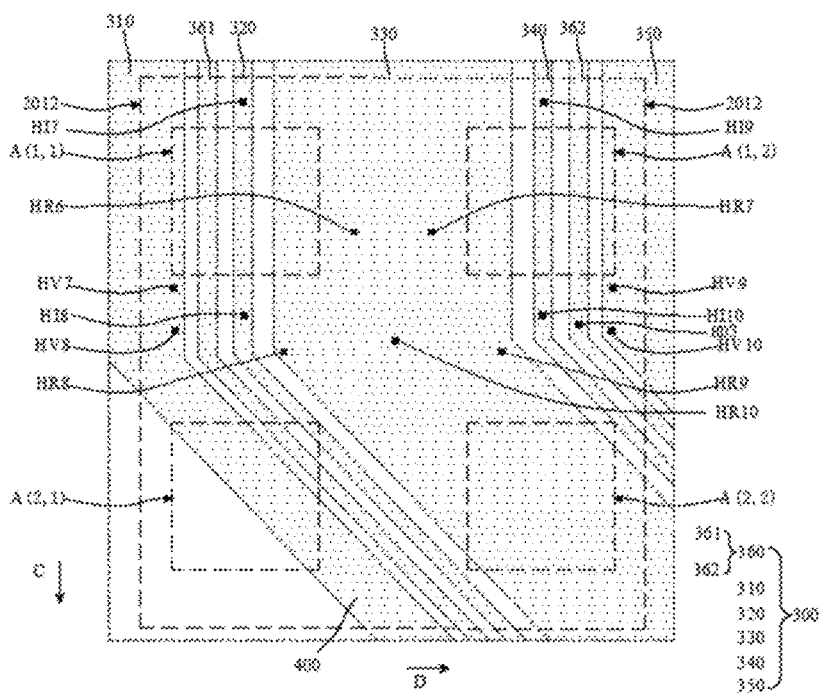
FIG. 34 is a partial enlarged schematic diagram in a second control region of the wiring substrate shown in FIG. 33, wherein FIG. 34 only illustrates the relative position between at least part of the via holes provided on the first metal wiring layer and the insulating material layer.

Optionally, referring to FIG. 34, in an embodiment, the wiring substrate includes a fan-out region, and the first metal wiring layer 102 is provided in the fan-out region with fan-out leads 400 connected to each drive lead 300. The drive lead 300 and the corresponding fan-out lead 400 are connected in the second control region 2012. In other words, the connection position of the fan-out lead 400 and the drive lead 300 is located within the range of each second control region 2012. The fan-out region and the second control region 2012 at least partially overlap with each other.

Optionally, referring to FIG. 34, in the second control region 2012, the first device region A (1, 1) and the second device region A (1,2) are both partially overlapped with the drive lead 300, and neither of them overlaps with the fan-out lead 400. The third device region A (2, 1) and the fourth device region A (2, 2) may partially overlap with the fan-out leads 400.

Referring to FIG. 34, in a second control region 2012 of the wiring substrate and each array substrate of an embodiment, the insulating material layer 103 is provided with a seventh, eighth, ninth and tenth power via hole, a seventh, eight, ninth and tenth input via hole, and a sixth, seventh, eighth, ninth and tenth reference via hole.

The seventh power via hole HV7 and the eighth power via hole HV8 each expose at least a partial region of the first power voltage lead 310. The eighth power via hole HV8 is located at a side of the seventh power via hole HV7 in the first direction, and located between the first device region A (1, 1) and the third device region A (2, 1). In other words, the seventh power via hole HV7 may be located between the first device region A (1, 1) and the third device region A (2, 1), or may be located at a side of the first device region A (1, 1) away from the third device region A(2,1). In an embodiment of the present disclosure, the relative positional relationship between the seventh power via hole HV7 and the first device region A (1, 1) in the second control region 2012 is the same as the relative positional relationship between the first power via hole HV1 and the first device region A (1, 1) in the first control region 2011.

The ninth power via hole HV9 and the tenth power via hole HV10 each expose at least a partial region of the second power voltage lead 350. The tenth power via hole HV10 is located at a side of the ninth power via hole HV9 in the first direction, and located between the second device region A (1,2) and the fourth device region A (2, 2). In other words, the seventh power via hole HV7 may be located between the second device region A(1,2) and the fourth device region A(2,2), or may be located at a side of the second device region A(1,2) away from the fourth device region A (2, 2). In an embodiment of the present disclosure, the relative positional relationship between the ninth power via hole HV9 and the second device region A(1, 2) in the second control region 2012 is the same as the relative positional relationship between the fourth power via hole HV4 and the second device region A(1,2) in the first control region 2011.

The seventh input via hole HI7 and the eighth input via hole HI8 respectively expose a partial region of the first input lead 320. The seventh input via hole HI7 is located at a side of the first device region A (1, 1) away from the third device region A (2, 1). The eighth input via hole HI8 is located between the first device region A (1, 1) and the third device region A (2, 1).

The ninth input via hole HI9 and the tenth input via hole HI10 respectively expose a partial region of the second input lead 340. The ninth input via hole HI9 is located at a side of the second device region A(1,2) away from the fourth device region A(2, 2). The tenth input via hole HI10 is located between the second device region A (1,2) and the fourth device region A (2, 2).

The sixth to tenth reference via hole respectively expose a partial region of the reference voltage lead 330. The sixth reference via hole HR6 and the seventh reference via hole HR7 are arranged along the second direction D and are located between the first device region A(1, 1) and the third device region A (2, 1). The eighth reference via hole HR8 is located between the first device region A (1, 1) and the third device region A (2, 1). The ninth reference via hole HR9 is located between the second device region A (1, 2) and the fourth device region A (2, 2). The tenth reference via hole HR10 is located between the four device regions A of the second control region 2012.

Referring to FIG. 34, in the second control region 2012, a drive lead 300 and the fan-out lead 400 connected thereto may be a bent metal lead as a whole. In the metal lead, the part located at the end of the drive lead 300 along its extending direction is the drive lead 300. In other words, in the second control region 2012, near the junction of the drive lead 300 and the connection lead 500, the size of the drive lead 300 in the second direction D may have shown a trend of gradually shrinking. In the wiring substrate of an embodiment, the seventh to tenth power via hole, the seventh to tenth input via hole, and the sixth to tenth reference via hole may respectively expose a part of the drive lead 300, so that the connection lead 500 of the array substrate may be connected to the drive lead 300 instead of the fan-out lead 400. In this way, although the fan-out leads 400 overlapped with different second control regions 2012 are different, the layout of the drive leads 300 overlapped with the different second control regions 2012 is basically the same. In this way, in each second control region 2012, the wiring substrate of the present disclosure is provided with via holes above the relatively fixedly distributed drive leads 300. This can avoid the fan-out leads 400 to be different, simplify the design and preparation of the wiring substrate, and facilitate the design, preparation and debugging of the array substrate.

The wiring substrate with the second control region 2012 provided in an embodiment can still be applied to different microchips and used to prepare different array substrates.

Exemplarily, the wiring substrate in an embodiment may be used to prepare a seventeenth array substrate having the first chip 010. The structure of the first control region 2011 of the seventeenth array substrate may be the same as that of any one of the first array substrate, the fifth array substrate, the ninth array substrate, and the thirteenth array substrate.

Figure 35:
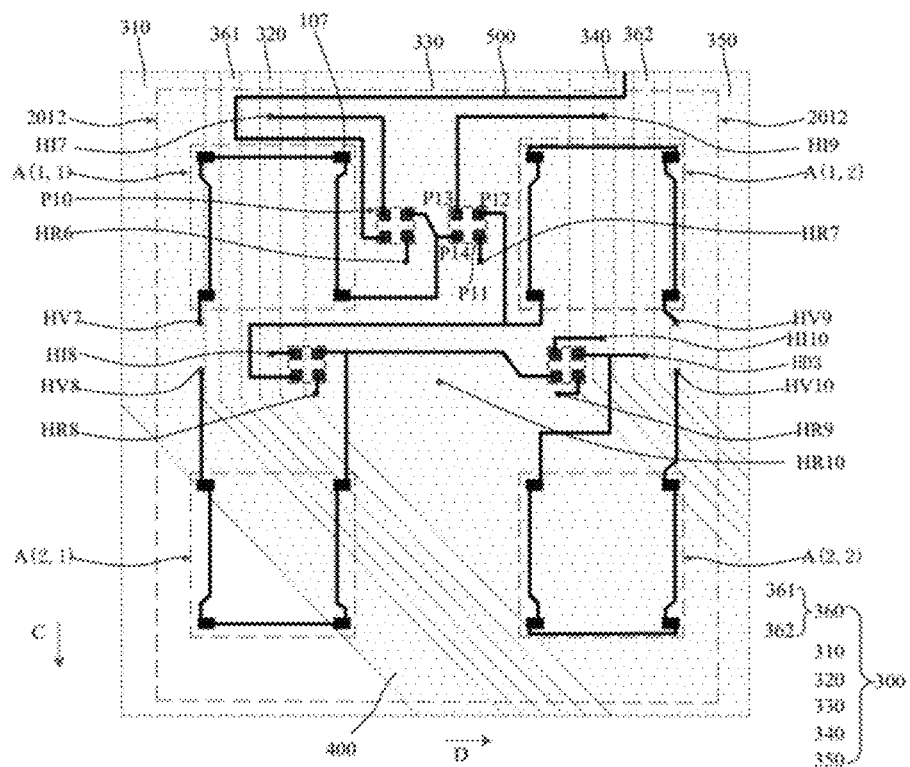
FIG. 35 is a schematic structure diagram of the seventeenth array substrate in a second control region according to an embodiment of the present disclosure, wherein, FIG. 35 only illustrates the drive leads, the relative position between at least part of the via holes provided on the insulating material layer, the connection leads (indicated by thick lines), the first pad group used to bind the first chip, and the functional devices in each device region.

Referring to FIG. 35, in the second control region 2012, the second metal wiring layer 104 of the seventeenth array substrate may include four first pad groups P10 each corresponding to a respective one of the four device regions A. The pattern of each pad group may be the same as the pattern of the first pad group P10 in the first control region 2011.

The first pad group P10 corresponding to the first device region A(1,1) and the first pad group P10 corresponding to the second device region A(1,2) are located between the first device region A(1,1) and the second device region A(1,2). The first pad group P10 corresponding to the first device region A(1,1) is arranged close to the first device region A(1,1), and the first pad group P10 corresponding to the second device region A(1,2) is arranged close to the second device region A(1,2). In the first direction C, the first pad group P10 corresponding to the third device region A (2, 1) is located between the first device region A (1, 1) and the third device region A (2, 1), and the first pad group P10 corresponding to the fourth device region A (2, 2) is located between the second device region A (1,2) and the fourth device region A (2, 2). Optionally, the first pad group P10 corresponding to the third device region A (2, 1) and the first pad group P10 corresponding to the fourth device region A (2, 2) are at least partially overlapped with the reference voltage lead 330. Optionally, the first pad group P10 corresponding to the first device region A (1, 1) and the first pad group P10 corresponding to the second device region A (1,2) are arranged along the second direction D. The first pad group P10 corresponding to the third device region A (2, 1) and the first pad group P10 corresponding to the fourth device region A (2, 2) are arranged along the second direction D.

Referring to FIG. 35, in the second control region 2012, the connection between each first pad group P10 and the device control circuit, and the mutual cascade therebetween, may be the same as those of the first control region. In other words, the first pad group P10 corresponding to each device region A in a signal channel can be cascaded sequentially, so that the output sub-pad P12 of the first pad group P10 corresponding to the (n−1)th stage of device region A is connected to the first input sub-pad P13 of the first pad group P10 corresponding to the n-th stage of device region A by the connection lead 500. The second end of the device control circuit of the device region A is connected to the output sub-pad P12 of the corresponding second pad group P20 through the connection lead 500.

In the first pad group P10 corresponding to the first device region A (1, 1) in the second control region 2012, the reference voltage sub-pad P11 and the reference voltage lead 330 are connected through the connection lead 500 overlapping with the sixth reference via hole HR6. The first input sub-pad P13 and the first input lead 320 are connected through the connection lead 500 overlapping with the seventh input via hole HI7. In the first pad group P10 corresponding to the second device region A(1,2) in the second control region 2012, the reference voltage sub-pad P11 and the reference voltage lead 330 are connected through the connection lead 500 overlapping with the seventh reference via hole HR7. The first input sub-pad P13 and the second input lead 340 are connected through the connection lead 500 overlapping with the ninth input via hole HI9. In the first pad group P10 corresponding to the third device region A (2, 1) in the second control region 2012, the reference voltage sub-pad P11 and the reference voltage lead 330 are connected through the connection lead 500 overlapping with the eighth reference via hole HR8. The first input sub-pad P13 and the first input lead 320 are connected through the connection lead 500 overlapping the eighth input via hole HI8. In the first pad group P10 corresponding to the fourth device region A (2, 2) in the second control region 2012, the reference voltage sub-pad P11 and the reference voltage lead 330 are connected through the connection lead 500 overlapping with the ninth reference via hole HR9. The first input sub-pad P13 and the second input lead 340 are connected through the connection lead 500 overlapping with the tenth input via hole HI10.

With reference to FIG. 35, in the second control region 2012, the first end of the device control circuit of the first device region A (1, 1) is connected to the first power voltage lead 310 through a connection lead 500 overlapping with the seventh power via hole HV7. The first end of the device control circuit of the second device region A (1,2) is connected to the second power voltage lead 350 through the connection lead 500 that overlaps with the ninth power via hole HV9. The first end of the device control circuit of the third device region A (2, 1) is connected to the first power voltage lead 310 through a connection lead 500 that overlaps with the eighth power via hole HV8. The first end of the device control circuit of the fourth device region A (2, 2) is connected to the second power voltage lead 350 through a connection lead 500 that overlaps with the tenth power via hole HV10.

Optionally, in an embodiment of the seventeenth array substrate, the tenth reference via hole HR10 may not overlap with any second metal wiring layer 104 and be filled with the insulating protection layer 105.

In the seventeenth array substrate, by adjusting the positions of the four first pad groups P10 in the second control region 2012, the four first pad groups P10 can be dispersedly arranged, avoiding two adjacent first pad groups P10 to be arranged next to each other. Thus, it is avoided that two adjacent first chips are arranged next to each other thereby causing a large shielding of light, further avoiding poor light spots (mura) caused by the shading of the first chips.

Illustratively again, the wiring substrate in an embodiment may be used to prepare an eighteenth array substrate having the second chip 020. The structure of the first control region 2011 of the eighteenth array substrate may be the same as that of any one of the second array substrate, the sixth array substrate, the tenth array substrate, and the fourteenth array substrate.

Figure 36:
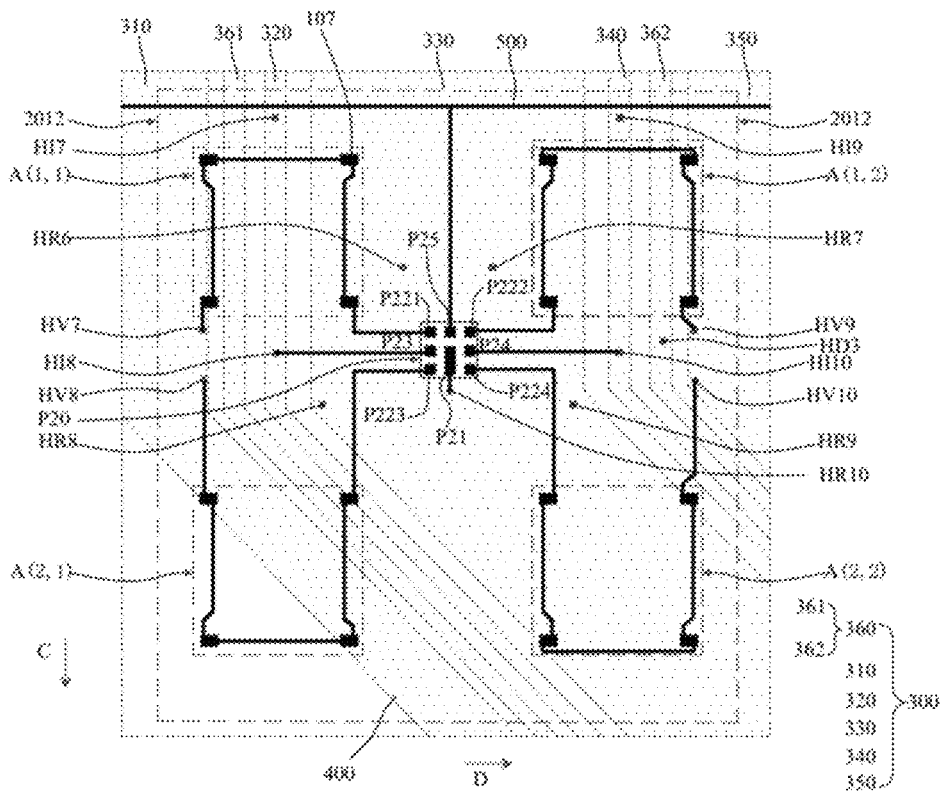
FIG. 36 is a schematic structure diagram of the eighteenth array substrate in a second control region according to an embodiment of the present disclosure, wherein, FIG. 36 only illustrates the drive leads, the relative position between at least part of the via holes provided on the insulating material layer, the connection leads (indicated by thick lines), the second pad group used to bind the second chip, and the functional devices in each device region.

Referring to FIG. 36, in the second control region 2012, the second metal wiring layer 104 of the eighteenth array substrate may include a second pad group P20. Optionally, the pattern of the second pad group P20 in the first control region 2011 and the second control region 2012 may be the same.

Referring to FIG. 36, in the second control region 2012 of the eighteenth array substrate, the second pad group P20 may be located between the four device regions A. In other words, in a second control region 2012, along the first direction C, the second pad group P20 is located between the first device region A (1, 1) and the third device region A (2, 1). In the second direction D, the second pad group P20 is located between the first device region A (1, 1) and the second device region A (1,2).

In the eighteenth array substrate, in the second control region 2012, the reference voltage sub-pad P21 of the second pad group P20 is connected to the reference voltage lead 330 through the connection lead 500 overlapping with at least one of the sixth reference via hole HR6, the seventh reference via hole HR7, and the tenth reference via hole HR10. One of the drive data sub-pad P24 and the chip power sub-pad P23 is connected to the first input lead 320 through a connection lead 500 overlapping with the eighth input via hole HI8. The other of the drive data sub-pad P24 and the chip power sub-pad P23 is connected to the second input lead 340 through a connection lead 500 overlapping with the tenth input via hole HI10. The four output sub-pads P12 are respectively connected to the second ends of the device control circuits of the four device regions A.

For example, in an embodiment of the eighteenth array substrate, in the second control region 2012, the reference voltage sub-pad P21 of the second pad group P20 is located at a side along the first direction C of the address sub-pad P25 of the second pad group P20, so as to ensure that the connection lead 500 connected to the reference voltage sub-pad P21 of the second pad group P20 can extend to overlap with the tenth reference via hole HR10, and the connection lead 500 is completely overlapped with the reference voltage lead 330. In this way, when the connection lead 500 and the reference voltage lead 330 are short-circuited, defects can be avoided on the eighteenth array substrate.

In the second control region 2012, the chip power sub-pad P23 and the first input lead 320 are connected by a connection lead 500 overlapping with the eighth input via hole HI8. The drive data sub-pad P24 and the second input lead 340 are connected through a connection lead 500 overlapping with the tenth input via hole HI10. The address sub-pad P25 and the address lead 360 are connected through a connection lead 500 overlapping with the address via hole. The first output sub-pad P221 may be connected to the second end of the device control circuit of the first device region A(1,1) through the connection lead 500. The second output sub-pad P222 may be connected to the second end of the device control circuit of the second device region A(1,2) through the connection lead 500. The third output sub-pad P223 can be connected to the second end of the device control circuit of the third device region A(2,1) through the connection lead 500. The fourth output sub-pad P224 may be connected to the second end of the device control circuit of the fourth device region A (2, 2) through the connection lead 500. The first end of the device control circuit of the first device region A (1, 1) is connected to the first power voltage lead 310 through the connection lead 500 overlapping with the seventh power via hole HV7. The first end of the device control circuit of the second device region A (1,2) is connected to the second power voltage lead 350 through the connection lead 500 overlapping with the ninth power via hole HV9. The first end of the device control circuit of the third device region A (2, 1) is connected to the first power voltage lead 310 by a connection lead 500 overlapping with the eighth power via hole HV8. The first end of the device control circuit in the fourth device region A (2, 2) is connected to the second power voltage lead 350 through a connection lead 500 that overlaps with the tenth power via hole HV10.

Optionally, in an embodiment of the eighteenth array substrate, the seventh input via hole HI7, the ninth input via hole HI9, the sixth reference via hole HR6, the seventh reference via hole HR7, the eighth reference via hole HR8, and the ninth reference via hole HR9 in the second control region 2012 may not overlap with any second metal wiring layer 104, and may be filled with the insulating protection layer 105.

Illustratively again, the wiring substrate in an embodiment may be used to prepare a nineteenth array substrate having the third chip 030. The structure of the first control region 2011 of the nineteenth array substrate may be the same as that of any one of the third array substrate, the seventh array substrate, the eleventh array substrate, and the fifteenth array substrate.

Figure 37:
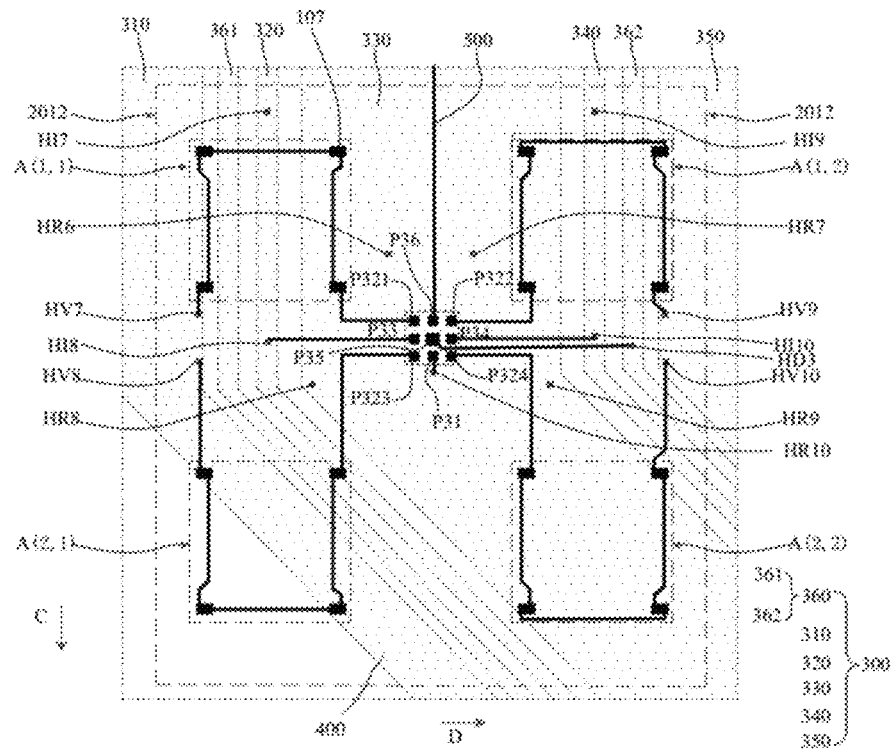
FIG. 37 is a schematic structure diagram of the nineteenth array substrate in a second control region according to an embodiment of the present disclosure, wherein, FIG. 37 only illustrates the drive leads, the relative position between at least part of the via holes provided on the insulating material layer, the connection leads (indicated by thick lines), the third pad group used to bind the third chip, and the functional devices in each device region.

Referring to FIG. 37, in the second control region 2012, the second metal wiring layer 104 of the nineteenth array substrate may include a third pad group P30. Optionally, the pattern of the third pad group P30 in the first control region 2011 and the second control region 2012 may be the same.

Referring to FIG. 37, in the second control region 2012 of the nineteenth array substrate, the third pad group P30 may be located between the four device regions A. In other words, in a second control region 2012, along the first direction C, the third pad group P30 is located between the first device region A (1, 1) and the third device region A (2, 1). In the second direction D, the third pad group P30 is located between the first device region A (1, 1) and the second device region A (1,2).

In the nineteenth array substrate, in the second control region 2012, the reference voltage sub-pad P31 of the third pad group P30 is connected to the reference voltage lead 330 through a connection lead 500 overlapping with at least one of the sixth reference via hole HR6, the seventh reference via hole HR7, and the tenth reference via hole HR10. One of the drive data sub-pad P34 and the chip power sub-pad P33 is connected to the first input lead 320 through a connection lead 500 overlapping with the eighth input via hole HI8. The other of the drive data sub-pad P34 and the chip power sub-pad P33 is connected to the second input lead 340 through a connection lead 500 overlapping with the tenth input via hole HI10. The four output sub-pads are respectively connected to the second ends of the device control circuits of the four device regions A. In a signal channel, the third pad groups P30 are sequentially cascaded. The strobe signal sub-pad P35 of the third pad group P30 at the first stage is connected to the address lead 360 through a connection lead 500 overlapping with the address via hole. The relay signal sub-pad P36 of the third pad group P30 at the (n−1)th stage is connected to the strobe signal sub-pad P35 of the third pad group P30 at the nth stage by the connection lead 500.

For example, in an embodiment of the nineteenth array substrate, referring to FIG. 37, in the second control region 2012, the reference voltage sub-pad P31 of the third pad group P30 is located at a side in the first direction C of the relay signal sub-pad P36 of the third pad group P30. In this way, the connection lead 500 connected to the reference voltage sub-pad P31 of the third pad group P30 can extend to overlap with the tenth reference via hole HR10, and the connection lead 500 is completely overlapped with the reference voltage lead 330. When the connection lead 500 and the reference voltage lead 330 are short-circuited, defects can be avoided on the nineteenth array substrate. In the second control region 2012, the chip power sub-pad P33 and the first input lead 320 are connected by a connection lead 500 overlapping with the eighth input via hole HI8. The drive data sub-pad P34 and the second input lead 340 are connected through the connection lead 500 overlapping with the tenth input via hole HI10. The first output sub-pad P321 can be connected to the second end of the device control circuit of the first device region A(1,1) through the connection lead 500. The second output sub-pad P222 can be connected to the second end of the device control circuit of the second device region A (1,2) through the connection lead 500. The third output sub-pad P223 can be connected to the third end of the device control circuit of the third device region A (2, 1) through the connection lead 500. The fourth output sub-pad P224 can be connected to the second end of the device control circuit of the fourth device region A (2, 2) through the connection lead 500. In the second control region 2012, the first end of the device control circuit of the first device region A (1, 1) is connected to the first power voltage lead 310 through a connection lead 500 that overlaps with the seventh power via hole HV7. The first end of the device control circuit of the second device region A (1,2) and the second power voltage lead 350 are connected through the connection lead 500 overlapping with the ninth power via hole HV9. The first end of the device control circuit of the third device region A (2, 1) and the first power voltage lead 310 are connected through a connection lead 500 that overlaps with the eighth power via hole HV8. The first end of the device control circuit of the first device region A(1, 1) and the first power voltage lead 310 are connected through a connection lead 500 that overlaps with the tenth power via hole HV10.

Optionally, in an embodiment of the nineteenth array substrate, the seventh input via hole HI7, the ninth input via hole HI9, the sixth reference via hole HR6, the seventh reference via hole HR7, the eighth reference via hole HR8, and the ninth reference via hole HR9 in the second control region 2012 may not overlap with any second metal wiring layer 104, and may be filled with the insulating protection layer 105.

Illustratively again, the wiring substrate in an embodiment may be used to prepare a twentieth array substrate having the fourth chip 040. The structure of the first control region 2011 of the twentieth array substrate may be the same as that of any one of the fourth array substrate, the eighth array substrate, the twelfth array substrate, and the sixteenth array substrate.

In the second control region 2012, the second metal wiring layer 104 of the twentieth array substrate may include a fourth pad group P40, wherein the pattern of the fourth pad group P40 in the first control region 2011 and the second control region 2012 can be the same.

Figure 38:
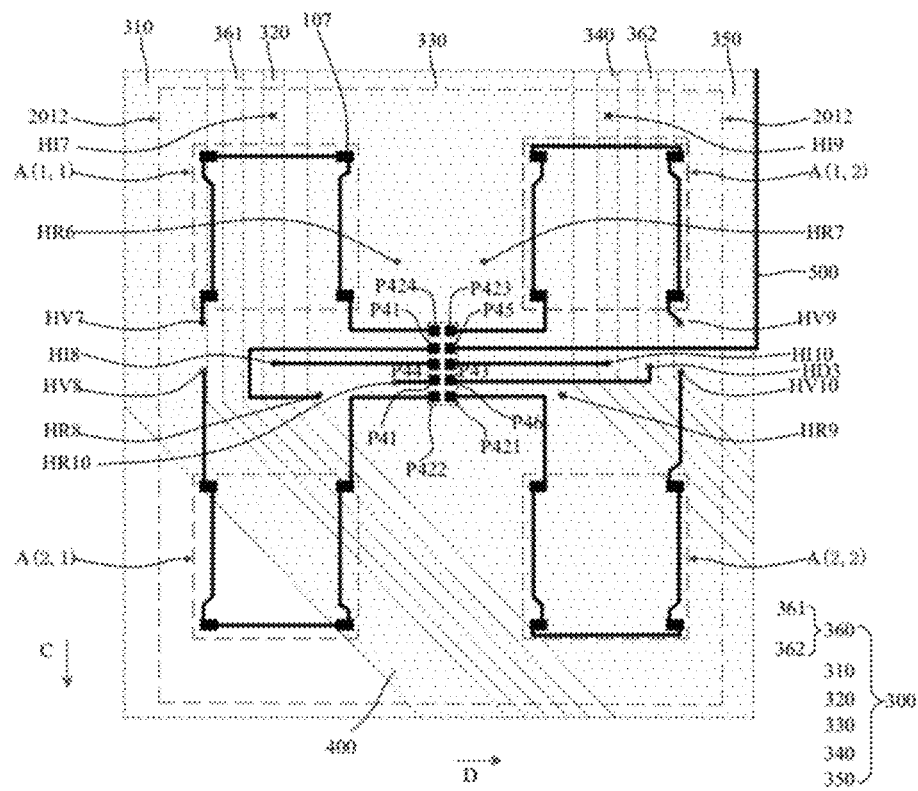
FIG. 38 is a schematic structure diagram of the twentieth array substrate in a second control region according to an embodiment of the present disclosure, wherein, FIG. 38 only illustrates the drive leads, the relative position between at least part of the via holes provided on the insulating material layer, the connection leads (indicated by thick lines), the fourth pad group used to bind the fourth chip, and the functional devices in each device region.

Referring to FIG. 38, in the second control region 2012 of the twentieth array substrate, the fourth pad group P40 may be located between the four device regions A. In other words, in a second control region 2012, in the first direction C, the fourth pad group P40 is located between the first device region A (1, 1) and the third device region A (2, 1), and in the second direction D, the fourth pad group P40 is located between the first device region A (1, 1) and the second device region A (1,2).

In the twentieth array substrate, in the second control region 2012, the fourth pad group P40 has two sub-pad columns, and each sub-pad column includes five sub-pads arranged along the first direction C. Along the second direction D, of the two sub-pad columns, the sub-pad column provided with the reference voltage sub-pad P41 may be located at the side close to the tenth reference via hole HR10. In this way, the connection lead 500 connected to one of the reference voltage sub-pads 41 can extend to overlap with the tenth reference via hole HR10. The connection lead 500 connected to the other of the reference voltage sub-pads 41 can extend to overlap with the eighth reference via hole HR8 or the ninth reference via hole HR9. In the second control region 2012, one of the drive data sub-pad P44 and the chip power sub-pad P43 of the fourth pad group P40 is connected to the first input lead 320 through the connection lead 500 overlapping with the eighth input via hole HI8. The other of the drive data sub-pad P44 and the chip power sub-pad P43 of the fourth pad group P40 is connected to the second input lead 340 through the connection lead 500 overlapping with the tenth input via hole HI10. The four output sub-pads are respectively connected to the second ends of the device control circuits of the four device regions A. In a signal channel, the fourth pad groups P40 are sequentially cascaded. The strobe signal sub-pad P45 of the fourth pad group P40 at the first stage is connected to the address lead 360 through the connection lead 500 overlapping with the address via hole. The relay signal sub-pad P46 of the fourth pad group P40 at the (n−1)th stage is connected to the strobe signal sub-pad P45 of the fourth pad group P40 at the nth stage by the connection lead 500.

For example, in an embodiment of the twentieth array substrate, referring to FIG. 38, in the second control region 2012, along the second direction D, the relay signal sub-pad P46 of the fourth pad group P40 is located at a side along the second direction D of the reference voltage sub-pad P41, and the reference voltage sub-pad P41 is located at a side along the second direction D of the tenth reference via hole HR10. The connection lead 500 connected to one of the reference voltage sub-pads P41 of the fourth pad group P40 extends to overlap with the tenth reference via hole HR10, and the connection lead 500 connected to the other of the reference voltage sub-pads P41 extends to overlap with the eighth reference via hole HR8. The drive data sub-pad P44 and the first input lead 320 are connected through the connection lead 500 overlapping with the eighth input via hole HI8. The chip power sub-pad P43 and the second input lead 340 are connected through the connection lead 500 overlapping with the tenth input via hole HI10. The first output sub-pad P421 may be connected to the second end of the device control circuit of the fourth device region A (2, 2) through the connection lead 500. The second output sub-pad P422 may be connected to the second end of the device control circuit of the third device region A(2,1) through the connection lead 500. The third output sub-pad P423 can be connected to the second end of the device control circuit of the second device region A(1,2) through the connection lead 500. The fourth output sub-pad P424 may be connected to the second end of the device control circuit of the first device region A (1, 1) through the connection lead 500. The first end of the device control circuit of the first device region A (1, 1) and the first power voltage lead 310 are connected through the connection lead 500 overlapping with the seventh power via hole HV7. The first end of the device control circuit of the third device region A(2,1) and the first power voltage lead 310 are connected through the connection lead 500 overlapping with the eighth power via hole HV8. The first end of the device control circuit of the second device region A(1,2) and the second power voltage lead 350 are connected through the connection lead 500 overlapping with the ninth power via hole HV9. The first end of the device control circuit in the fourth device region A (2, 2) is connected to the second power voltage lead 350 through a connection lead 500 that overlaps with the tenth power via hole HV10.

Optionally, in an embodiment of the twentieth array substrate, the seventh input via hole HI7, the ninth input via hole HI9, the sixth reference via hole HR6, the seventh reference via hole HR7 and the ninth reference via hole HR9 in the second control region 2012 may not overlap with any second metal wiring layer 104, and may be filled with the insulating protection layer 105.

In the wiring substrate provided by the present disclosure, at least one address lead 360 may be provided in one signal channel. The insulating material layer 103 may be provided with an address via hole exposing a partial region of the address lead 360. In this way, in the array substrate of the present disclosure, the second metal wiring layer 104 may be provided with a connection lead 500 that overlaps with the address via hole, and the connection lead 500 may be connected to the chip pad group corresponding to the microchip, so as to provide the required signal to the microchip.

Figure 40:
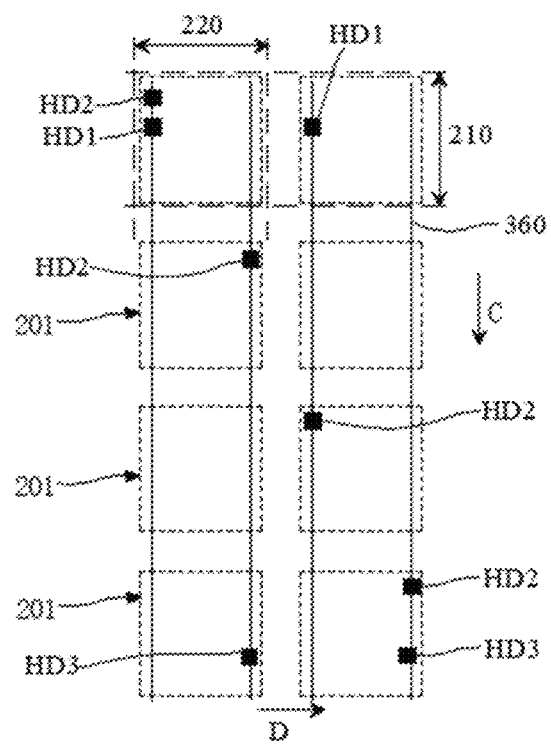
FIG. 40 is a schematic diagram of the relative position between address via holes and address leads in a wiring substrate according to an embodiment of the present disclosure.

Optionally, referring to FIG. 40, two address leads 360 may be provided in one control region column 220. Exemplarily, referring to FIGS. 10, 16, 22, 28, and 34, in a control region column 220, the address lead 360 includes a first address lead 361 and a second address lead 362, wherein the first address lead 361 is disposed between the first power voltage lead 310 and the first input lead 320, and the second address lead 361 is disposed between the second power voltage lead 350 and the second input lead 340.

Optionally, of the two address leads 360 in one control region column 220, one of the address leads 360 may extend to the end of the control region column 220 away from the binding region B, and the other of the address leads 360 may be only arranged in the control region 201 closest to the binding region B. Exemplarily, referring to FIG. 50, a first address lead 361 and a second address lead 362 are arranged in a control region column 220. The first address lead 361 may extend in a direction away from the binding region B, and overlap with each control region 201 in the control region column 220. The second address lead 362 only overlaps with the second control region 2012. That is, it may only be located in the control region 201 close to the binding region B.

Optionally, the number of address leads 360 provided on the wiring substrate is not less than the number of control region rows 210, and at least one address lead 360 is provided in one signal channel. The address via hole includes at least a first address via hole HD1 and a second address via hole HD2. In an embodiment of the present disclosure, the number of address leads 360 provided on the wiring substrate is equal to the number of control region rows 210.

Figure 41:
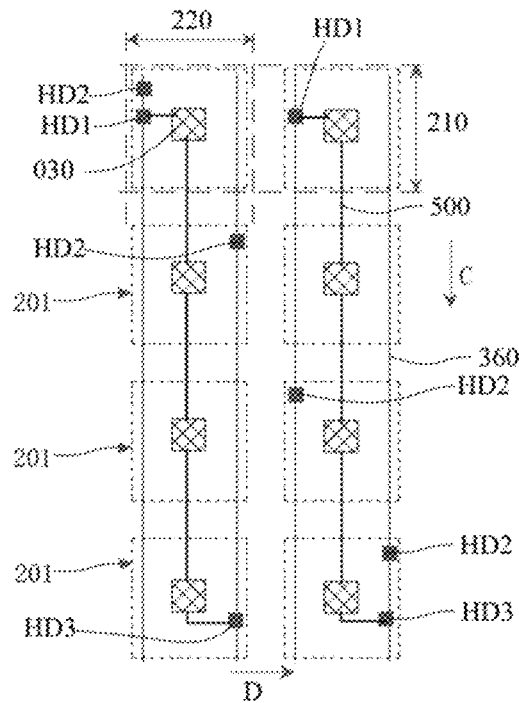
FIG. 41 is a schematic structural diagram of an array substrate according to an embodiment of the present disclosure, wherein a microchip and an address lead are electrically connected.

Referring to FIG. 40, the first address via hole HD1 can be disposed close to an end of the address lead 360, and at least one first address via hole HD1 is disposed in each signal channel. Referring to FIG. 41, when the microchip is the first chip 010, the third chip 030 or the fourth chip 040, the microchip and the address lead 360 can be connected through the connection lead 500 overlapping with the first address via hole HD1, and then controlled by the strobe signal loaded on the address lead 360. Further, in a signal channel, the first address via hole HD1 for connecting the first stage of microchip and the address lead 360 may be located in the same control region 201 as the first stage of microchip.

Optionally, referring to FIG. 40, in an embodiment of the wiring substrate and the array substrate of the present disclosure, each first address via hole HD1 may be linearly arranged along the second direction D.

Optionally, in an embodiment of the wiring substrate and the array substrate of the present disclosure, the first address via hole HD1 may be located at an end of the wiring substrate away from the binding region B. Of course, in another embodiment of the wiring substrate and the array substrate of the present disclosure, the first address via hole HD1 may be located at an end of the wiring substrate close to the binding region B.

Optionally, in an embodiment of the wiring substrate and the array substrate of the present disclosure, referring to FIG. 41, only one first address via hole HD1 may be provided in one signal channel.

Figure 43:
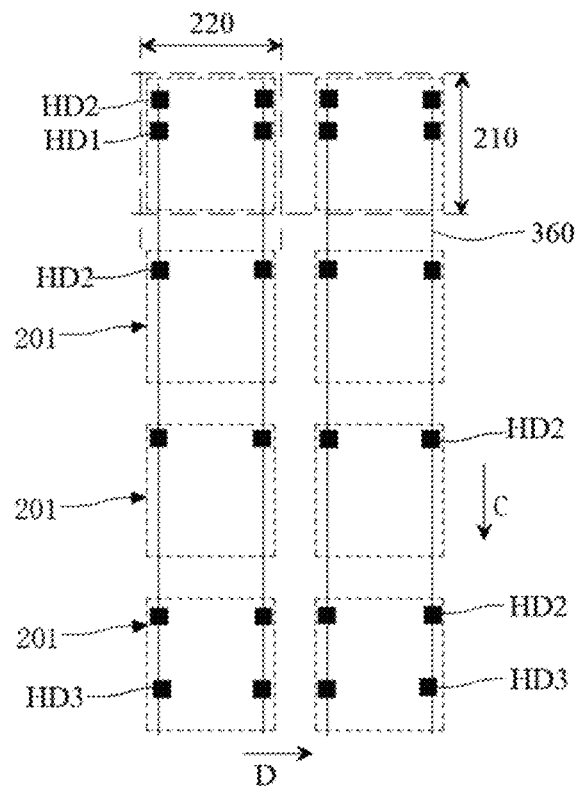
FIG. 43 is a schematic diagram of the relative position between address via holes and address leads in a wiring substrate according to an embodiment of the present disclosure.
Figure 44:
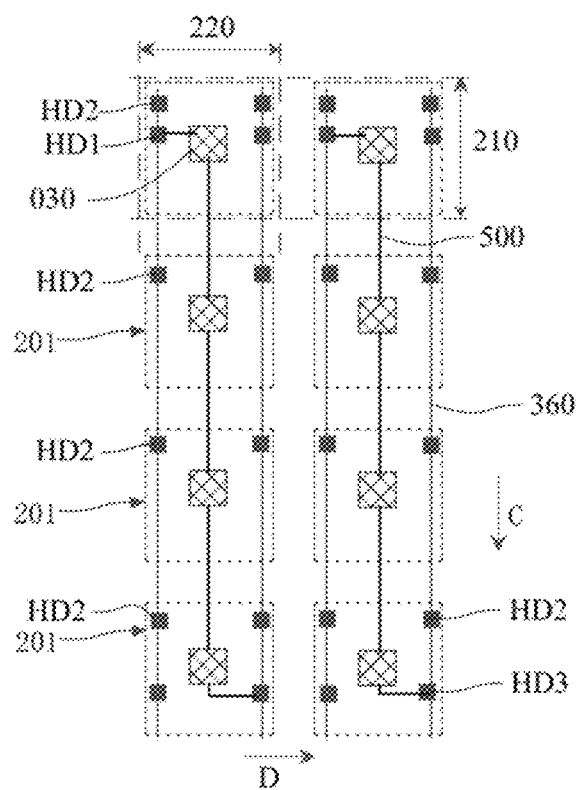
FIG. 44 is a schematic structure diagram of an array substrate according to an embodiment of the present disclosure, wherein a microchip is electrically connected to an address lead.

Optionally, in another embodiment of the wiring substrate and the array substrate of the present disclosure, referring to FIG. 43, the first address via holes HD1 are arranged in a one-to-one correspondence with the address leads 360, wherein each of the first address via holes HD1 may expose a partial region of the corresponding address lead 360. Referring to FIG. 44, the number of first address via holes HD1 can exceed the required number. When setting the second metal wiring layer 104, one of the first address via holes HD1 can be selected in each signal channel as the first address via hole HD1 corresponding to this signal channel, wherein the corresponding first address via hole HD1 is used to electrically connect the address lead 360 to the cascaded first stage of microchip, and the remaining first address via holes HD1 can be filled with the insulating protection layer 105. In this way, the array substrate can more flexibly select the first address via hole HD1 that overlaps with the connection lead 500 according to the wiring requirements of the second metal wiring layer 104, and make other first address via holes HD1 not overlapped with any connection lead 500 and filled by the insulating protection layer 105.

Optionally, referring to FIG. 40, at least one second address via hole HD2 is provided in each control region row 210, and one second address via hole HD2 can be selected from the control region row 210 as the second address via hole HD2 corresponding to the control region row 210. In the wiring substrate of the present disclosure, the second address via hole HD2 corresponding to each control region row 210 respectively exposes a different address lead 360. In other words, each control region row 210 is provided with the second address via hole HD2 corresponding to the control region row 210, wherein the second address via hole HD2 corresponding to each control region row 210 respectively expose a partial region of a different address lead. It can be understood that, in some embodiments, part of the first address via hole HD1 may be multiplexed as the second address via hole HD2.

Figure 42:
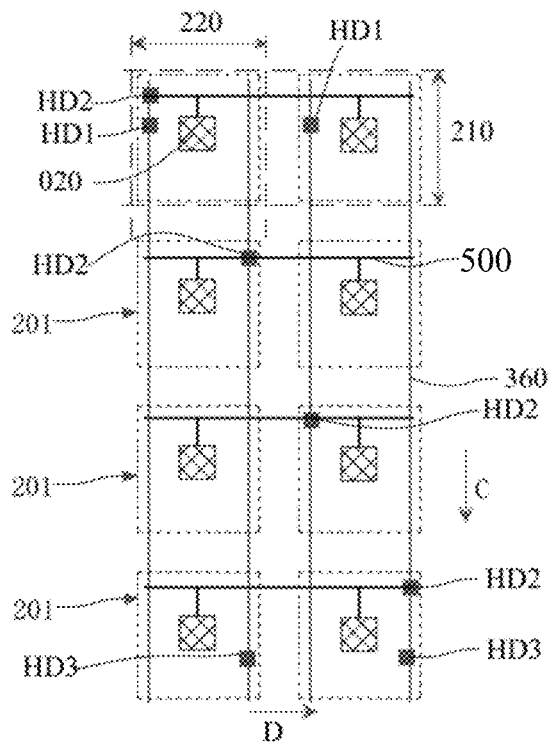
FIG. 42 is a schematic structure diagram of an array substrate according to an embodiment of the present disclosure, wherein a microchip and an address lead are electrically connected.

In the array substrate of the present disclosure, when the microchip is the second chip or other microchips that need to be scanned row by row, referring to FIG. 42, the second metal wiring layer 104 may be provided with a plurality of connection leads 500 each corresponding to a respective control region row 210 and acting as a scan lead. The scan lead overlaps with each control region 201 of the corresponding control region row 210, and overlaps with the second address via hole HD2 corresponding to the control region row 210. Each address sub-pad P25 in the control region row 210 can be connected to the scan lead through the connection lead 500. In this way, the address lead 360 connected to the scan lead can be used to load a strobe signal to the scan lead, thereby enabling each second chip 020 in the control region row 210 to be strobed.

In some embodiments, the scan lead may extend along the second direction D, and the two ends thereof may be respectively located in the two control regions 201 at the two ends of the control region row 210, and the scan lead may pass through other control regions 201 in the control region row 210.

Referring to FIG. 42, in some embodiments, the scan lead may extend straight along the second direction D and overlap with one of the second address via holes HD2. In another embodiment of the present disclosure, the scan lead may include an extension section and a connection section, wherein the extension section may extend along the second direction D without overlapping with any second address via hole HD2; and the connection section is connected to the extension section while overlapping with one of the second address vias holes HD2.

In some embodiments, referring to FIG. 40, the number of second address via holes HD2 on the wiring substrate is the same as the number of control region rows 210, and different address leads 360 are respectively exposed, wherein, each of the second address via holes HD2 is arranged in a one-to-one correspondence with each control region row 210, and each of the second address via holes HD2 is located in the corresponding control region row 210. In this way, the number of the second address via holes HD2 is small, which can reduce the possible impact of the second address via holes HD2 on the address leads 360.

Figure 45:
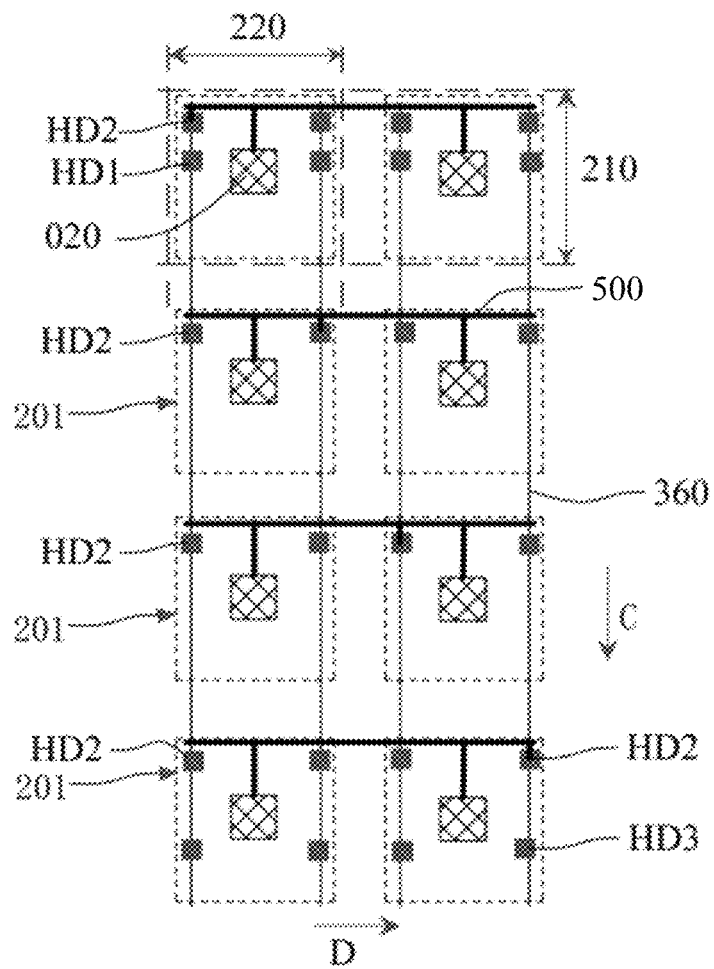
FIG. 45 is a schematic structural diagram of an array substrate according to an embodiment of the present disclosure, wherein a microchip and an address lead are electrically connected.

In other embodiments, referring to FIG. 43, in the array substrate and the wiring substrate of the present disclosure, in each control region row 210, the number of the second address via holes HD2 is the same as the number of the address leads 360 and corresponds to each other in a one-to-one correspondence. Each of the second address via holes HD2 exposes the corresponding address lead 360. In other words, in the overlapping range between each address lead 360 and the control region row 210, at least one second address via hole HD2 is provided. Thus, referring to FIG. 45, in the array substrate of the present disclosure, one second address via hole HD2 can be selected in a control region row 210 as the second address via hole HD2 corresponding to the control region row 210. The second address via hole HD2 corresponding to the control region row 210 overlaps with the connection lead 500, so as to drive each microchip in the control region row 210. In this way, the wiring flexibility of the array substrate can be increased, and the design, preparation, and debugging of the wiring substrate and the array substrate can be facilitated.

Optionally, the address via hole may also include a third address via hole HD3. Referring to FIGS. 40 and 43, the third address via hole HD3 can be arranged close to an end of the address lead 360. Along the first direction C, the first address via hole HD1 and the third address via hole HD3 can be respectively distributed at two ends of the wiring board of the present disclosure. In one signal channel, at least one third address via hole HD3 can be provided, and the number of address leads is at least two. At least one first address via hole HD1 and at least one third address via hole HD3 respectively expose different address leads. When the microchip of the array substrate is the first chip 010, the output pin 012 of the first chip 010 of the last stage and the address lead 360 can be connected through the connection lead 500 overlapping with the third address via hole HD3, thereby making the cascaded first chip 010 forms a loop. When the microchip of the array substrate is the third chip 030 or the fourth chip 040, the output pin of the third chip 030 or the fourth chip 040 of the last stage and the address lead 360 are connected through the connection leads 500 overlapping with the third address via hole HD3, so that the cascaded third chip 030 or fourth chip 040 forms a loop. It can be understood that the first address via hole HD1 and the third address via hole HD3 are two relative concepts defined according to the connection relationship between the microchip and the address lead 360 in the array substrate. One address via hole may be the first address via hole HD1 in an array substrate, but in another array substrate, it may be the third address via hole HD3. It can be also understood that, in some embodiments, at least part of the third address via hole HD3 can be multiplexed as the second address via hole HD2.

In some embodiments, referring to FIG. 40, in the array substrate and the wiring substrate of the present disclosure, on one address lead 360, the first address via hole HD1 and the third address via hole HD3 are not provided at the same time. Exemplarily, two address leads can be arranged in one control region column, and one first address via hole HD1 and one third address via hole HD3 can be arranged. The first address via hole HD1 exposes one of the address leads, and the third address via hole HD3 exposes the other address lead. In another embodiment of the present disclosure, referring to FIG. 43, in the array substrate and wiring substrate of the present disclosure, on each address lead 360, the first address via hole HD1 and the third address via hole HD3 can be provided at the same time. In other words, both ends of each address lead 360 are respectively exposed by the first address via hole HD1 and the third address via hole HD3. In each signal channel of the array substrate, for a plurality of microchips that are sequentially cascaded, the first stage of microchip and the last stage of microchip are respectively connected to different address leads 360. In this way, the wiring flexibility of the array substrate can be improved.

Optionally, in the array substrate of the present disclosure, part of the address via hole may be overlapped with the connection leads 500, so that the address leads 360 can load signals to the microchip through the connection lead 500 overlapped with the address via hole. The remaining address via holes may not be overlapped with any second metal wiring layer 104, and may be filled with the insulating protection layer 105.

Figure 46:
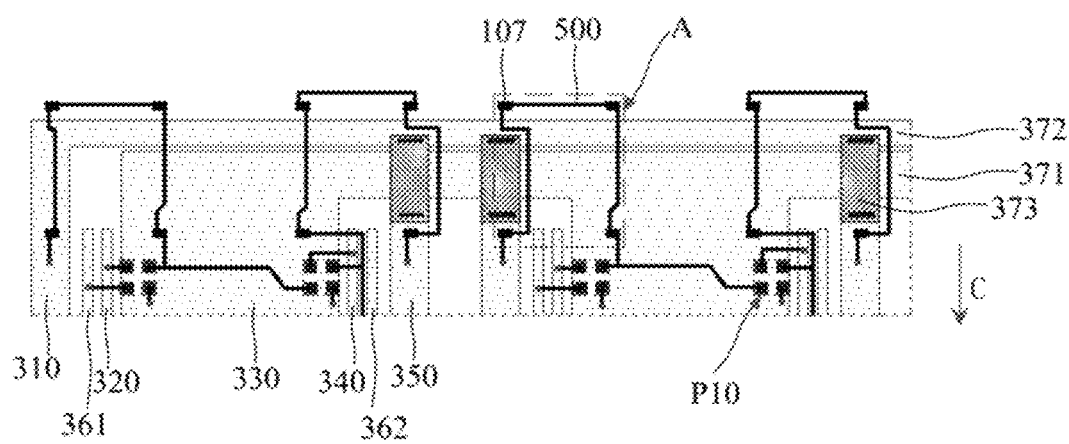
FIG. 46 is a schematic diagram of a partial structure of an array substrate at an end away from the binding region according to an embodiment of the present disclosure.

Optionally, referring to FIG. 46, in the wiring substrate of the present disclosure, the first metal wiring layer 102 may also have a first voltage distribution line 371 extending along the second direction D, and each drive lead 300 may be located at the side along the first direction C of the first voltage distribution line. 371. One of the power voltage lead and the reference voltage lead 330 may extend along the opposite direction of the first direction C, so as to be connected to the first voltage distribution line 371. In other words, the first power voltage lead and the second power voltage lead may extend along the opposite direction of the first direction, so as to be connected to the first voltage distribution line. Alternatively, the reference voltage lead may extend along the opposite direction of the first direction, so as to be connected to the first voltage distribution. This allows each power voltage lead or each reference voltage lead 330 to be electrically connected to each other, thereby improving the anti-signal disturbance capability and the voltage stability of the array substrate used for the wiring substrate.

Further, in the wiring substrate of the present disclosure, referring to FIG. 46, the first metal wiring layer 102 may also have a second voltage distribution line 372 extending along the second direction D. The first voltage distribution line 371 may be located between the second voltage distribution line 372 and each drive lead 300. One of the power voltage lead and the reference voltage lead 330 may extend along the opposite direction of the first direction C, so as to be connected to the first voltage distribution line 371. The other drive lead 300 extends at most partially along the opposite direction of the first direction C, so as to be connected to the second voltage distribution line 372, and the drive lead 300 is not connected to the first voltage distribution line. In an array substrate based on a wiring substrate, the second metal wiring layer 104 may be provided with a bridging lead 373, which crosses the first voltage distribution line 371, and connects the second voltage distribution line 372 with the other drive lead 300 as mentioned above through a via hole.

Exemplarily, referring to FIG. 46, in an embodiment of the present disclosure, in the first metal wiring layer 102, each reference voltage lead 330 may extend along the opposite direction of the first direction C, so as to be connected to the first voltage distribution line 371. In the first metal wiring layer 102, the first voltage distribution line 371 is located between the second voltage distribution line 372 and at least part of the power voltage lead, so that at least part of the power voltage lead and the second voltage distribution line 372 are not electrically connected through the second voltage distribution line 372. In an array substrate based on the above array substrate, referring to FIG. 46, the second metal wiring layer 104 may be provided with a plurality of bridging leads 373, and the respective power voltages that are disconnected from the second voltage distribution line 372 on the first metal wiring layer 104 are disposed in one-to-one correspondence with each bridging lead 373. The bridging lead 373 crosses the first voltage distribution line 371, and has one end connected to the second voltage distribution line 372 through a via hole, and the other end connected to a corresponding power voltage lead through a via hole. In this way, in the array substrate, the power voltage leads are electrically connected to each other, which can realize mutual shunting between different power voltage leads, improve the anti-overload capability of the power voltage leads, and improve the anti-disturbance performance and the pressure stability performance of the array substrate. The reference voltage leads 330 are electrically connected to each other, which can improve the anti-signal disturbance capability of the array substrate and improve the voltage stability on the reference voltage leads 330.

Further, referring to FIG. 46, in the wiring substrate, along the second direction D, the first voltage distribution line 371 may be located between the two power voltage leads on two sides of the wiring substrate. In this way, in the first metal wiring layer 102, the power voltage leads on the two sides can extend along the opposite direction of the first direction C, so as to be connected to the second voltage distribution line 372.

Illustratively, in another embodiment of the present disclosure, in the first metal wiring layer 102, each power voltage lead may extend along the opposite direction of the first direction C, so as to be connected to the first voltage distribution line 371. In the first metal wiring layer 102, the first voltage distribution line 371 is located between the second voltage distribution line 372 and the reference voltage lead 330, so that the reference voltage lead 330 and the second voltage distribution line 372 are not electrically connected through the first metal wiring layer 102. In an array substrate based on the above array substrate, the second metal wiring layer 104 may be provided with bridging leads 373 arranged in a one-to-one correspondence with each reference voltage lead 330. The bridging lead 373 crosses the first voltage distribution line 371, and has one end connected to the second voltage distribution line 372 through a via hole, and the other end connected to the corresponding reference voltage lead 330 through a via hole. In this way, in the array substrate, the power voltage leads are electrically connected to each other, which can realize mutual shunting between different power voltage leads, improve the anti-overload capability of the power voltage leads, and improve the anti-disturbance performance and the pressure stability performance of the array substrate. The reference voltage leads 330 are electrically connected to each other, which can improve the anti-signal disturbance capability of the array substrate and improve the voltage stability on the reference voltage leads 330.

Optionally, in the array substrate of the present disclosure, referring to FIG. 46, the bridging lead 373 may partially overlap with the device region A. At this time, the direction of the connection lead 500 in the device control circuit can be adjusted so that the connection lead 500 keeps clear of the bridging lead 373. In this way, the relative positions of the functional devices 107 in the device region A are the same in different device regions A, which can ensure that the functional devices 107 are evenly distributed on the array substrate.

Optionally, referring to FIG. 47, the array substrate further includes a plurality of conductive connection parts 374, and the first power voltage lead 310 and the second power voltage lead 350 adjacent to each other are connected by a plurality of conductive connection parts 374. In this way, two adjacent power voltage leads are connected by a plurality of conductive connection parts 374 to form a grid, which can not only make the signal shunt between the two power voltage leads sufficiently and effectively, but also avoid two adjacent power voltage leads to be completely merged into one power voltage lead, thereby resulting in an excessively large proportion of the metal region of the first metal wiring layer 102.

It can be understood that in some other embodiments, two adjacent power voltage leads can also be completely merged into one power voltage lead, so as to reduce the impedance of the power voltage lead and improve the anti-overload performance thereof. Further, by adjusting the spacing between different drive leads 300, hollowing out part of the drive leads 300, etc., the proportion of the metal region of the metal wiring layer can be adjusted to meet the manufacturing process requirements of the array substrate.

In an embodiment of the present disclosure, the conductive connection part 374 may be located on the first metal wiring layer 102, and the conductive connection part 374 is located between two adjacent power voltage leads and connected to the two power voltage leads, so that the adjacent two power voltage leads and the conductive connection part 374 between them form a grid shape.

Of course, in other embodiments of the array substrate of the present disclosure, part or all of the conductive connection parts 374 may also be located on the second metal wiring layer 104. For example, the conductive connection part 374 is located on the second metal wiring layer 104, and the conductive connection part 374 is connected to two adjacent power voltage leads through via holes. As another example, the conductive connection part 374 may include a first part and a second part. The first part is located on the first metal wiring layer 102 and is connected to one of the power voltage leads, and the second part is located on the second metal wiring layer 104 and is connected to the first part and the other supply voltage lead through a via hole.

Embodiments of the present disclosure also provide a light emitting module, which includes any of the array substrates described in the above-mentioned array substrate embodiments. The light emitting module can be a light emitting module of a computer monitor, a light emitting module of a mobile phone screen, a light emitting module of a TV, or a light emitting module of other liquid crystal displays. It can be a direct type of light emitting module of a transmissive liquid crystal display. It can also be a direct type of light emitting module of a reflective liquid crystal display. Since the light emitting module has any one of the array substrates described in the above-mentioned array substrate embodiment, it has the same beneficial effects, which will not be repeated in the present disclosure.

Those skilled in the art will easily think of other embodiments of the present disclosure after considering the specification and practicing the invention disclosed herein. The present application is intended to cover any variations, uses, or adaptive changes of the present disclosure. These variations, uses, or adaptive changes follow the general principle of the present disclosure and include common knowledge or conventional technical means in the technical field that are not disclosed in the present disclosure. The description and the embodiments are only regarded as exemplary, and the true scope and spirit of the present disclosure are indicated by the appended claims.

What is claimed is:

1. A wiring substrate, comprising a plurality of control regions distributed in an array, wherein the plurality of control regions are arranged into a plurality of control region rows and a plurality of control region columns; each of the control region columns comprises at least two of the control regions arranged along a first direction; each of the control region rows comprises at least two of the control regions arranged along a second direction; and the second direction is parallel to a plane where the wiring substrate is located and intersects with the first direction;

each of the control regions comprises four device regions distributed in an array; the device regions are configured to set up functional devices that are electrically connected to each other; and the four device regions in each of the control regions are respectively a first device region, a second device region, a third device region, and a fourth device region; wherein the first device region is the device region located in the first row along the first direction and in the first column along the second direction in the control region, the second device region is the device region located in the first row along the first direction and in the second column along the second direction in the control region, the third device region is the device region located in the second row along the first direction and in the first column along the second direction in the control region, and the fourth device region is the device region located in the second row along the first direction and in the second column along the second direction in the control region;

the wiring substrate comprises a base substrate, a first metal wiring layer, and an insulating material layer that are stacked in sequence, wherein the first metal wiring layer is provided with drive leads extending along the first direction; in each of the control region columns, the drive leads comprise at least a first power voltage lead, a first input lead, a reference voltage lead, a second input lead, and a second power voltage lead that are sequentially arranged along the second direction; the wiring substrate further comprises at least one signal channel extending along the first direction, each of the signal channels comprising at least one of the control region columns; and in each of the signal channels, the drive leads further comprise at least one address lead;

the control regions comprise first control regions, wherein in one of the first control regions, the insulating material layer is provided with a first, second, third, fourth, fifth and sixth power via hole, a first, second, third and fourth input via hole, and a first and second reference via hole;

the first, second and third power via holes are arranged in sequence along the first direction and respectively expose a partial region of the first power voltage lead; the first power via hole is located at a side of the first device region away from the third device region or located between the first device region and the third device region; the second power via hole is located between the first device region and the third device region; and the third power via hole is located at a side of the third device region away from the first device region;

the fourth, fifth and sixth power via holes are arranged in sequence along the first direction and respectively expose a partial region of the second power voltage lead; the fourth power via hole is located at a side of the second device region away from the fourth device region or located between the second device region and the fourth device region; the fifth power via hole is located between the second device region and the fourth device region; and the sixth power via hole is located at a side of the fourth device region away from the second device region;

the first input via hole and the second input via hole respectively expose a partial region of the first input lead; the first input via hole is located between an edge of the first device region away from the third device region and an edge of the third device region close to the first device region; and the second input via hole is located at a side of the third device region away from the first device region;

the third input via hole and the fourth input via hole respectively expose a partial region of the second input lead; the third input via hole is located between an edge of the second device region away from the fourth device region and an edge of the fourth device region close to the second device region; and the fourth input via hole is located at a side of the fourth device region away from the second device region;

the first reference via hole and the second reference via hole respectively expose a partial region of the reference voltage lead; and along the first direction, the first reference via hole is located between the first device region and the third device region, and the second reference via hole is located at a side of the third device region away from the first device region; and in each of the signal channels, the insulating material layer is further provided with at least one address via hole that exposes a partial region of the at least one address lead.

2. The wiring substrate according to claim 1, wherein in one of the control region columns, the first power via hole and the fourth power via hole are axially symmetrical with each other, the second power via hole and the fifth power via hole are axially symmetrical with each other, and the third power via hole and the sixth power via hole are axially symmetrical with each other.

3. The wiring substrate according to claim 1, wherein in one of the control region columns, the first input via hole and the third input via hole are axially symmetric with each other, and the second input via hole and the fourth input via hole are axially symmetric with each other.

4. The wiring substrate according to claim 1, wherein in one of the first control regions, along the first direction, the first power via hole and the fourth power via hole are located between the first device region and the first reference via hole; the second power via hole and the fifth power via hole are located between the third device region and the first reference via hole;

and the third power via hole and the sixth power via hole are located between the third device region and the second reference via hole.

5. The wiring substrate according to claim 1, wherein in one of the first control regions, the insulating material layer is further provided with a third reference via hole and a fourth reference via hole exposing a partial region of the reference voltage lead; the third reference via hole and the first reference via hole are axially symmetric with each other; and the fourth reference via hole and the second reference via hole are axially symmetric with each other.

6. The wiring substrate according to claim 5, wherein in one of the first control regions, along the second direction, the third reference via hole and the fourth reference via hole are located at a side of the first reference via hole and the second reference via hole away from the first power voltage lead; in one of the first control regions, the first power via hole, the first input via hole, the first reference via hole, the fourth power via hole, the third input via hole, and the third reference via hole constitute a first group of via holes; and one of the second power via hole and the third power via hole, the second input via hole, the second reference via hole, one of the fifth power via hole and the sixth power via hole, the fourth input via hole, and the fourth reference via hole constitute a second group of via holes; and a relative position between via holes in the first group of via holes is the same as a relative position between via holes in the second group of via holes.

7. The wiring substrate according to claim 1, wherein in one of the first control regions, the insulating material layer is further provided with another reference via hole that exposes a partial region of the reference voltage lead and is located between the four device regions.

8. The wiring substrate according to claim 1, wherein in one of the first control regions, the insulating material layer is further provided with a fifth input via hole exposing a partial region of the first input lead; along the first direction, the fifth input via hole is located between the first reference via hole and the third device region; the insulating material layer is also provided with a sixth input via hole that exposes a partial region of the second input lead; and the sixth input via hole and the fifth input via hole are symmetric about a symmetry axis extending along the first direction.

9. The wiring substrate according to claim 1, wherein
the control regions further comprise a second control region; and in each of the control region columns, the second control region is located at a side along the first direction of the first control region;
in one of the second control regions, the insulating material layer is provided with a seventh, eighth, ninth and tenth power via hole, a seventh, eighth, ninth and tenth input via hole, and a sixth, seventh, eighth, ninth and tenth reference via hole;
the seventh power via hole and the eighth power via hole respectively expose at least a partial region of the first power voltage lead; the ninth power via hole and the tenth power via hole respectively expose at least a partial region of the second power voltage lead; the eighth power via hole is located at a side along the first direction of the seventh power via hole and between the first device region and the third device region; and the tenth power via hole is located at a side along the first direction of the ninth power via hole and between the second device region and the fourth device region;
the seventh input via hole and the eighth input via hole respectively expose a partial region of the first input lead; the seventh input via hole is located at a side of the first device region away from the third device region; the eighth input via hole is located between the first device region and the third device region; the ninth input via hole and the tenth input via hole respectively expose a partial region of the second input lead; the ninth input via hole is located at a side of the second device region away from the fourth device region; the tenth input via hole is located between the second device region and the fourth device region;
the sixth, seventh, eighth, ninth and tenth reference via hole respectively expose a partial region of the reference voltage lead, wherein the sixth reference via hole and the seventh reference via hole are arranged along the second direction and located between the first device region and the third device region; the eighth reference via hole is located between the first device region and
the third device region; the ninth reference via hole is located between the second device region and the fourth device region; and the tenth reference via hole is located between the four device regions of the second control region.

10. The wiring substrate according to claim 9, wherein the wiring substrate includes a fan-out region, and the first metal wiring layer is provided with fan-out leads each connected to a respective one of the drive leads in the fan-out region, wherein the drive lead is connected to a respective one of the fan-out leads in the second control region.

11. The wiring substrate according to claim 1, wherein the number of the address leads is not less than the number of the control region rows; and the address via holes comprises first address via holes and second address via holes; the first address via holes are arranged close to an end of the address lead, and at least one of the first address via holes is arranged in each of the signal channels; and the second address via hole corresponding to the control region row is provided in each of the control region rows, and the second address via hole corresponding to each of the control region rows respectively expose a different partial region of the address lead.

12. The wiring substrate according to claim 11, wherein the address via holes further comprise third address via holes; along the first direction, the first address via holes and the third address via holes are respectively distributed at two ends of the wiring substrate; and in one of the signal channels, the number of the address leads is at least two, the number of the third address via holes is at least one, and at least one of the first address via holes and at least one of the third address via holes respectively expose a different one of the address leads.

13. The wiring substrate according to claim 11, wherein the number of the second address via holes is the same as the number of the control region rows, and each of the second address via holes is arranged corresponding to a respective one of the control region rows; each of the second address via holes respectively exposes a different one of the address leads; and each of the second address via holes is located in a respective one of the control region rows.

14. The wiring substrate according to claim 11, wherein in each of the control region rows, the number of the second address via holes is the same as the number of the address leads, and each of the second address via holes is arranged corresponding to a respective one of the address leads, each of the second address via holes exposing a respective one of the address leads.

15. The wiring substrate according to claim 1, wherein the first metal wiring layer further comprises a first voltage distribution line extending along the second direction, and each of the drive leads is located at a side along the first direction of the first voltage distribution line; and the first power voltage lead and the second power voltage lead extend along a direction opposite to the first direction to be connected with the first voltage distribution line, or the reference voltage lead extends in a direction opposite to the first direction to be connected with the first voltage distribution line.

16. The wiring substrate according to claim 15, wherein the first metal wiring layer further comprises a second voltage distribution line extending along the second direction, wherein the first voltage distribution line is located between the second voltage distribution line and each of the drive leads.

17. An array substrate, comprising a wiring substrate, the wiring substrate comprising a plurality of control regions distributed in an array, wherein
the plurality of control regions are arranged into a plurality of control region rows and a plurality of control region columns; each of the control region columns comprises at least two of the control regions arranged along a first direction; each of the control region rows comprises at least two of the control regions arranged along a second direction; and the second direction is parallel to a plane where the wiring substrate is located and intersects with the first direction;
each of the control regions comprises four device regions distributed in an array; the device regions are configured to set up functional devices that are electrically connected to each other; and the four device regions in each of the control regions are respectively a first device region, a second device region, a third device region, and a fourth device region; wherein the first device region is the device region located in the first row along the first direction and in the first column along the second direction in the control region, the second device region is the device region located in the first row along the first direction and in the second column along the second direction in the control region, the third device region is the device region located in the second row along the first direction and in the first column along the second direction in the control region, and the fourth device region is the device region located in the second row along the first direction and in the second column along the second direction in the control region;

the wiring substrate comprises a base substrate, a first metal wiring layer, and an insulating material layer that are stacked in sequence, wherein the first metal wiring layer is provided with drive leads extending along the first direction; in each of the control region columns, the drive leads comprise at least a first power voltage lead, a first input lead, a reference voltage lead, a second input lead, and a second power voltage lead that are sequentially arranged along the second direction; the wiring substrate further comprises at least one signal channel extending along the first direction, each of the signal channels comprising at least one of the control region columns; and in each of the signal channels, the drive leads further comprise at least one address lead;

the control regions comprise first control regions, wherein in one of the first control regions, the insulating material layer is provided with a first, second, third, fourth, fifth and sixth power via hole, a first, second, third and fourth input via hole, and a first and second reference via hole;

the first, second and third power via holes are arranged in sequence along the first direction and respectively expose a partial region of the first power voltage lead; the first power via hole is located at a side of the first device region away from the third device region or located between the first device region and the third device region; the second power via hole is located between the first device region and the third device region; and the third power via hole is located at a side of the third device region away from the first device region;

the fourth, fifth and sixth power via holes are arranged in sequence along the first direction and respectively expose a partial region of the second power voltage lead; the fourth power via hole is located at a side of the second device region away from the fourth device region or located between the second device region and the fourth device region; the fifth power via hole is located between the second device region and the fourth device region; and the sixth power via hole is located at a side of the fourth device region away from the second device region;

the first input via hole and the second input via hole respectively expose a partial region of the first input lead; the first input via hole is located between an edge of the first device region away from the third device region and an edge of the third device region close to the first device region; and the second input via hole is located at a side of the third device region away from the first device region;

the third input via hole and the fourth input via hole respectively expose a partial region of the second input lead; the third input via hole is located between an edge of the second device region away from the fourth device region and an edge of the fourth device region close to the second device region; and the fourth input via hole is located at a side of the fourth device region away from the second device region;

the first reference via hole and the second reference via hole respectively expose a partial region of the reference voltage lead; and along the first direction, the first reference via hole is located between the first device region and the third device region, and the second reference via hole is located at a side of the third device region away from the first device region; and in each of the signal channels, the insulating material layer is further provided with at least one address via hole that exposes a partial region of the at least one address lead.

18. The array substrate according to claim 17, wherein the array substrate further comprises: a second metal wiring layer and an insulating protection layer which are sequentially laminated on a side of the insulating material layer of the wiring substrate away from the base substrate; and multiple functional devices and multiple microchips, wherein the second metal wiring layer comprises a plurality of connection leads, a plurality of device pad groups and a plurality of chip pad groups, wherein the functional devices are bound and connected to the device pad groups, the microchips are connected to the chip pad groups, the device pad groups and the chip pad groups are connected to the connection leads, and at least part of the connection leads is connected to the first metal wiring layer through at least part of the via holes provided on the insulating material layer.

19. The array substrate according to claim 18, wherein a device control circuit is provided in each of the device regions, and the device control circuit comprises one of the functional devices or a plurality of the functional devices electrically connected to one another; in the first control region, a connection between a first end of the device control circuit in the first device region and the first power voltage lead is made through the connection lead that overlaps with the first power via hole; a connection between a first end of the device control circuit in the third device region and the first power voltage lead is made through the connection lead that overlaps with the second power via hole or the third power via hole; a connection between a first end of the device control circuit in the second device region and the second power voltage lead is made through the connection lead that overlaps with the fourth power via hole; and a connection between a first end of the device control circuit in the fourth device region and the second power voltage lead is made through the connection lead that overlaps with the fifth power via hole or the sixth power via hole.

20. A light emitting module, comprising an array substrate,
the array substrate comprising a wiring substrate, and the wiring substrate comprising a plurality of control regions distributed in an array, wherein
the plurality of control regions are arranged into a plurality of control region rows and a plurality of control region columns; each of the control region columns comprises at least two of the control regions arranged along a first direction; each of the control region rows comprises at least two of the control regions arranged along a second direction; and the second direction is parallel to a plane where the wiring substrate is located and intersects with the first direction;
each of the control regions comprises four device regions distributed in an array; the device regions are configured to set up functional devices that are electrically connected to each other; and the four device regions in each of the control regions are respectively a first device region, a second device region, a third device region, and a fourth device region; wherein the first device region is the device region located in the first row along the first direction and in the first column along the second direction in the control region, the second device region is the device region located in the first row along the first direction and in the second column along the second direction in the control region, the third device region is the device region located in the second row along the first direction and in the first column along the second direction in the control region, and the fourth device region is the device region located in the second row along the first direction and in the second column along the second direction in the control region;

the wiring substrate comprises a base substrate, a first metal wiring layer, and an insulating material layer that are stacked in sequence, wherein the first metal wiring layer is provided with drive leads extending along the first direction; in each of the control region columns, the drive leads comprise at least a first power voltage lead, a first input lead, a reference voltage lead, a second input lead, and a second power voltage lead that are sequentially arranged along the second direction; the wiring substrate further comprises at least one signal channel extending along the first direction, each of the signal channels comprising at least one of the control region columns; and in each of the signal channels, the drive leads further comprise at least one address lead;

the control regions comprise first control regions, wherein in one of the first control regions, the insulating material layer is provided with a first, second, third, fourth, fifth and sixth power via hole, a first, second, third and fourth input via hole, and a first and second reference via hole;

the first, second and third power via holes are arranged in sequence along the first direction and respectively expose a partial region of the first power voltage lead; the first power via hole is located at a side of the first device region away from the third device region or located between the first device region and the third device region; the second power via hole is located between the first device region and the third device region; and the third power via hole is located at a side of the third device region away from the first device region;

the fourth, fifth and sixth power via holes are arranged in sequence along the first direction and respectively expose a partial region of the second power voltage lead; the fourth power via hole is located at a side of the second device region away from the fourth device region or located between the second device region and the fourth device region; the fifth power via hole is located between the second device region and the fourth device region; and the sixth power via hole is located at a side of the fourth device region away from the second device region;

the first input via hole and the second input via hole respectively expose a partial region of the first input lead; the first input via hole is located between an edge of the first device region away from the third device region and an edge of the third device region close to the first device region; and the second input via hole is located at a side of the third device region away from the first device region;

the third input via hole and the fourth input via hole respectively expose a partial region of the second input lead; the third input via hole is located between an edge of the second device region away from the fourth device region and an edge of the fourth device region close to the second device region; and the fourth input via hole is located at a side of the fourth device region away from the second device region;

the first reference via hole and the second reference via hole respectively expose a partial region of the reference voltage lead; and along the first direction, the first reference via hole is located between the first device region and the third device region, and the second reference via hole is located at a side of the third device region away from the first device region; and in each of the signal channels, the insulating material layer is further provided with at least one address via hole that exposes a partial region of the at least one address lead.

\* \* \* \* \*